(12) United States Patent
Yamazaki et al.

(10) Patent No.: US 12,125,919 B2
(45) Date of Patent: Oct. 22, 2024

(54) METAL OXIDE AND TRANSISTOR INCLUDING THE METAL OXIDE

(71) Applicant: SEMICONDUCTOR ENERGY LABORATORY CO., LTD., Atsugi (JP)

(72) Inventors: Shunpei Yamazaki, Tokyo (JP); Tomonori Nakayama, Kanagawa (JP); Masahiro Takahashi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 413 days.

(21) Appl. No.: 17/430,332

(22) PCT Filed: Feb. 11, 2020

(86) PCT No.: PCT/IB2020/051041
§ 371 (c)(1),
(2) Date: Aug. 12, 2021

(87) PCT Pub. No.: WO2020/170068
PCT Pub. Date: Aug. 27, 2020

(65) Prior Publication Data
US 2022/0131010 A1    Apr. 28, 2022

(30) Foreign Application Priority Data
Feb. 22, 2019 (JP) .................................. 2019-030883
May 16, 2019 (JP) .................................. 2019-093145

(51) Int. Cl.
*H01L 29/786* (2006.01)
*H01L 29/24* (2006.01)
*H10K 59/121* (2023.01)

(52) U.S. Cl.
CPC .......... *H01L 29/7869* (2013.01); *H01L 29/24* (2013.01); *H01L 29/78648* (2013.01); *H01L 29/78696* (2013.01); *H10K 59/1213* (2023.02)

(58) Field of Classification Search
None
See application file for complete search history.

(56) References Cited

U.S. PATENT DOCUMENTS 7,601,984 B2   10/2009   Sano et al.
8,309,961 B2   11/2012   Yamazaki et al.
(Continued)

FOREIGN PATENT DOCUMENTS

CN   101057339 A   10/2007
CN   102648524 A   8/2012
(Continued)

OTHER PUBLICATIONS

International Search Report (Application No. PCT/IB2020/051041) Dated Apr. 7, 2020.
Written Opinion (Application No. PCT/IB2020/051041) Dated Apr. 7, 2020.

*Primary Examiner* — Nduka E Ojeh
(74) *Attorney, Agent, or Firm* — NIXON PEABODY LLP; Jeffrey L. Costellia

(57) ABSTRACT

To provide a novel metal oxide. The metal oxide includes a first region and a second region. A third region is included between the first region and the second region. An interface of the first region is covered with the third region. The crystallinity of the third region is lower than the crystallinity of the first region. The crystallinity of the second region is lower than the crystallinity of the third region. The size of the first region measured from an image observed with a transmission electron microscope is greater than or equal to 1 nm and less than or equal to 3 nm.

21 Claims, 26 Drawing Sheets

(56) References Cited

U.S. PATENT DOCUMENTS

| | | |
|---|---|---|
| 9,130,049 B2 | 9/2015 | Sano et al. |
| 9,406,808 B2 | 8/2016 | Yamazaki et al. |
| 9,583,637 B2 | 2/2017 | Sano et al. |
| 10,115,831 B2 | 10/2018 | Yamazaki et al. |
| 10,615,287 B2 | 4/2020 | Sano et al. |
| 2006/0108636 A1* | 5/2006 | Sano .................. H01L 27/1225 257/E21.462 |
| 2008/0164581 A1* | 7/2008 | Cho ..................... H01L 29/518 257/632 |
| 2009/0179199 A1 | 7/2009 | Sano et al. |
| 2011/0084266 A1 | 4/2011 | Yamazaki et al. |
| 2014/0124776 A1* | 5/2014 | Takahashi ............... H01L 29/04 250/307 |

FOREIGN PATENT DOCUMENTS

| | | |
|---|---|---|
| EP | 1812969 A | 8/2007 |
| EP | 2453480 A | 5/2012 |
| EP | 2453481 A | 5/2012 |
| EP | 2455975 A | 5/2012 |
| JP | 2006-165529 A | 6/2006 |
| JP | 2011-100997 A | 5/2011 |
| KR | 2009-0089482 A | 8/2009 |
| KR | 2012-0091061 A | 8/2012 |
| TW | 201131780 | 9/2011 |
| WO | WO-2006/051993 | 5/2006 |
| WO | WO-2011/043203 | 4/2011 |

\* cited by examiner

◯ : In  ● : Ga  ● : Zn  · : O

◯ : In  ● : Ga  ● : Zn  · : O

◯ : In  ● : Ga  ● : Zn  · : O

◯ : In  ● : Ga  ● : Zn  · : O

◯ : In  ● : Ga  ● : Zn  · : O

◯ : In  ● : Ga  ● : Zn  · : O

◯ : In  ● : Ga  ● : Zn  · : O

◯ : In  ● : Ga  ● : Zn  · : O

◯ : In  ● : Ga  ● : Zn  · : O

◯ : In  ● : Ga  ● : Zn  · : O

FIG. 7A
| Amorphous | Crystalline | Crystal |
|---|---|---|
| completely amorphous | ·CAAC<br>·nc<br>·CAC | ·single crystal<br>·poly crystal |
FIG. 7B
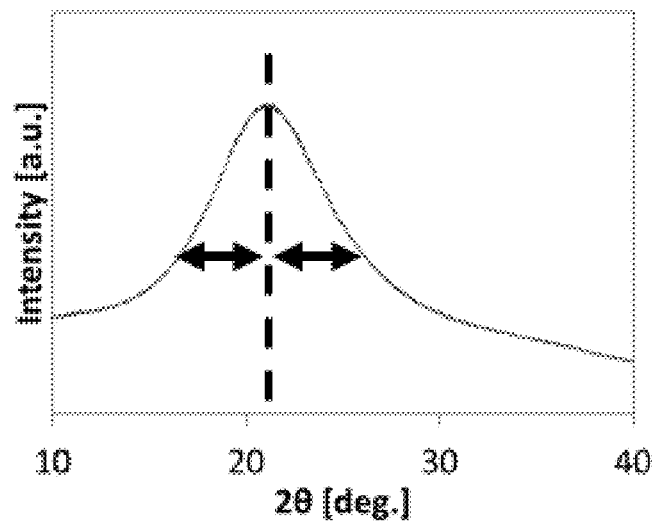
FIG. 7C
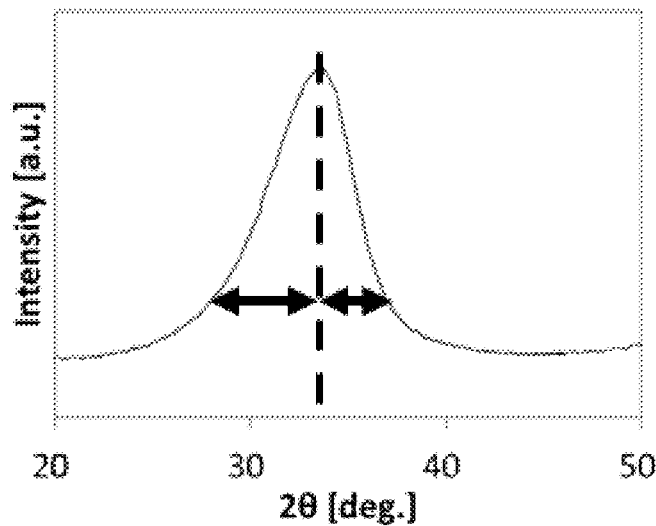

METAL OXIDE AND TRANSISTOR INCLUDING THE METAL OXIDE

TECHNICAL FIELD

One embodiment of the present invention relates to a metal oxide. One embodiment of the present invention relates to a transistor including the metal oxide. One embodiment of the present invention relates to a semiconductor device, a semiconductor wafer, a module, and an electronic device.

Note that in this specification and the like, a semiconductor device refers to a device that can function by utilizing semiconductor characteristics in general. A semiconductor element such as a transistor, a semiconductor circuit, an arithmetic device, and a storage device are each one embodiment of a semiconductor device. In some cases, it can be said that a display device (e.g., a liquid crystal display device and a light-emitting display device), a projection device, a lighting device, an electro-optical device, a power storage device, a storage device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition (composition of matter).

BACKGROUND ART

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to a transistor; in addition, an oxide semiconductor has been attracting attention as another material.

As an oxide semiconductor, an amorphous oxide containing In, Ga, and Zn is disclosed (see Patent Document 1). In Patent Document 1, a technique by which a transistor is formed using the amorphous oxide is also disclosed.

REFERENCE

Patent Document

[Patent Document 1] Japanese Published Patent Application No. 2006-165529

SUMMARY OF THE INVENTION

Problems to be Solved by the Invention

Patent Document 1 discloses an amorphous oxide which contains microcrystal, In, Ga, and Zn and in which a microcrystal grain interface is covered with an amorphous structure. However, when the microcrystal and the amorphous structure are in contact with each other, atomic arrangement at an interface where the microcrystal and the amorphous structure are in contact with each other and in the vicinity thereof is disordered. This might result in formation of defect states at the interface and in the vicinity thereof, and the interface and the vicinity thereof might serve as a carrier trap or a carrier generation source. Therefore, a transistor using the amorphous oxide might have large variations in electrical characteristics and thus have low reliability.

An object of one embodiment of the present invention is to provide a novel metal oxide. An object of one embodiment of the present invention is to provide a transistor with high reliability. An object of one embodiment of the present invention is to provide a semiconductor device with high reliability. An object of one embodiment of the present invention is to provide a semiconductor device having favorable electrical characteristics. An object of one embodiment of the present invention is to provide a semiconductor device that can be miniaturized or highly integrated. An object of one embodiment of the present invention is to provide a semiconductor device with a high on-state current.

Note that the description of these objects does not disturb the existence of other objects. One embodiment of the present invention does not have to achieve all the objects. Objects other than these will be apparent from the description of the specification, the drawings, the claims, and the like, and objects other than these can be derived from the description of the specification, the drawings, the claims, and the like.

Means for Solving the Problems

One embodiment of the present invention is a metal oxide including microcrystal and amorphia, in which a less ordered region is included between the microcrystal and the amorphia, and an interface of the microcrystal is covered with the less ordered region.

In the above metal oxide, the crystallinity of the less ordered region is preferably lower than the crystallinity of the microcrystal and higher than the crystallinity of the amorphia. Alternatively, energy of the less ordered region is preferably higher than energy of the microcrystal and lower than energy of the amorphia.

Another embodiment of the present invention is a metal oxide including a first region and a second region, in which a third region is included between the first region and the second region, an interface of the first region is covered with the third region, the crystallinity of the third region is lower than the crystallinity of the first region, and the crystallinity of the second region is lower than the crystallinity of the third region.

Another embodiment of the present invention is a metal oxide including a first region and a second region, in which a third region is included between the first region and the second region, an interface of the first region is covered with the third region, the third region is energetically more unstable than the first region, and the second region is energetically more unstable than the third region.

In the metal oxide, the size of the first region is preferably greater than or equal to 1 nm and less than or equal to 3 nm. In addition, the size of the first region is preferably measured from an image observed with a transmission electron microscope.

In the metal oxide, by nanobeam electron diffraction, a plurality of spots are preferably observed in a region with a distance from a direct spot in a radius vector direction ranging from 2.9 $nm^{-1}$ to 4.2 $nm^{-1}$. In addition, as the nanobeam electron diffraction, electron diffraction is preferably performed with a probe diameter of greater than or equal to 1 nm and less than or equal to 30 nm.

In the metal oxide, it is preferable that by nanobeam electron diffraction, a plurality of spots be observed in a fourth region, one or more spots be observed in a fifth region, and the proportion of a distance from the direct spot to the fifth region to a distance from the direct spot to the fourth region be greater than or equal to 1.5 and less than or equal to 1.8. In addition, as the nanobeam electron diffraction, electron diffraction is preferably performed with a probe diameter of greater than or equal to 1 nm and less than or equal to 30 nm.

The metal oxide preferably includes indium, an element M (M is any one or more of gallium, aluminum, yttrium, and tin), and zinc.

Another embodiment of the present invention is a transistor including the above-described metal oxide in a channel formation region.

Effect of the Invention

One embodiment of the present invention can provide a novel metal oxide. One embodiment of the present invention can provide a transistor with high reliability. One embodiment of the present invention can provide a semiconductor device with high reliability. One embodiment of the present invention can provide a semiconductor device having favorable electrical characteristics. One embodiment of the present invention can provide a semiconductor device that can be miniaturized or highly integrated. One embodiment of the present invention can provide a semiconductor device with a high on-state current.

Note that the description of the effects does not disturb the existence of other effects. Note that one embodiment of the present invention does not necessarily have all of these effects. Effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 7A is a diagram illustrating classification of IGZO crystal structures. FIG. 7B is a graph illustrating an XRD spectrum of quartz glass. FIG. 7C is a graph illustrating an XRD spectrum of crystalline IGZO.

MODE FOR CARRYING OUT THE INVENTION

Figure 1A:
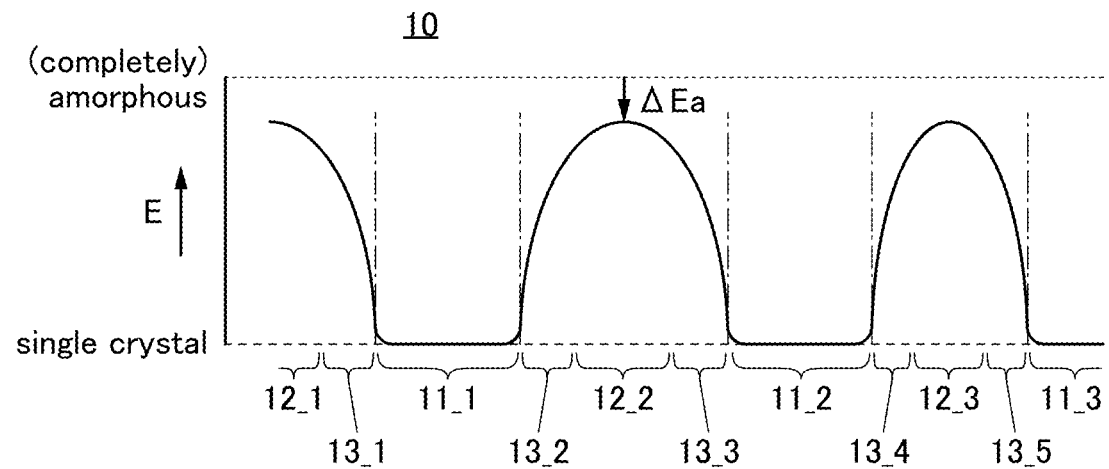
FIG. 1A is a schematic view showing energy transition in a metal oxide of one embodiment of the present invention.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

In a top view (also referred to as a plan view), a perspective view, or the like, particularly, some components might not be illustrated for easy understanding of the invention. Furthermore, some hidden lines and the like might be omitted.

In addition, in this specification and the like, ordinal numbers such as "first" and "second" are used for convenience and do not denote the order of steps or the stacking order of layers. Therefore, for example, description can be made by replacing "first" with "second," "third," or the like as appropriate. In addition, the ordinal numbers in this specification and the like do not correspond to the ordinal numbers which are used to specify one embodiment of the present invention in some cases.

In addition, in this specification and the like, terms for describing arrangement, such as "over" and "below," are used for convenience to describe the positional relationship between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text.

Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel region refers to a region through which current mainly flows.

Furthermore, functions of a source and a drain might be switched when a transistor of opposite polarity is employed or a direction of current flow is changed in circuit operation, for example. Therefore, the terms source and drain can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is different from a channel width shown in a top view of a transistor (hereinafter also referred to as an "apparent channel width") in some cases. For example, when a gate electrode covers a side surface of a semiconductor, effective channel width is greater than apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, effective channel width is greater than apparent channel width.

In such a case, effective channel width is sometimes difficult to estimate by actual measurement. For example, estimation of effective channel width from a design value requires assumption that the shape of a semiconductor is known. Accordingly, in the case where the shape of a semiconductor is not known accurately, it is difficult to measure effective channel width accurately.

Furthermore, in this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration of lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. In addition, in the case of an oxide semiconductor, oxygen vacancies are formed by entry of impurities, for example. Furthermore, in the case where the semiconductor is silicon, examples of the impurity that changes characteristics of the semiconductor include oxygen, Group 1 elements except for hydrogen, Group 2 elements, Group 13 elements, and Group 15 elements.

Note that in this specification and the like, a silicon oxynitride is a material that contains more oxygen than nitrogen in its composition. Moreover, a silicon nitride oxide is a material that contains more nitrogen than oxygen in its composition.

In addition, in this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In addition, in this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle of greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

Note that in this specification, a barrier film means a film having a function of inhibiting transmission of oxygen and impurities such as water and hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, when OS transistor is mentioned, the OS transistor can also be called a transistor including an oxide or an oxide semiconductor.

Note that in this specification and the like, a metal oxide containing nitrogen is also collectively referred to as a metal oxide in some cases. A metal oxide containing nitrogen may be referred to as a metal oxynitride.

In addition, in this specification and the like, "normally off" means that current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

In this embodiment, a metal oxide of one embodiment of the present invention is described. Note that the metal oxide of one embodiment of the present invention functions as a semiconductor in some cases. Therefore, the metal oxide of one embodiment of the present invention is referred to as an oxide semiconductor in some cases.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, or tin. Other elements that can be used as the element M are boron, silicon, titanium, iron, nickel, germanium, zirconium, molybdenum, lanthanum, cerium, neodymium, hafnium, tantalum, tungsten, magnesium, and the like. Note that a plurality of the above elements may be used in combination as the element M in some cases.

A metal oxide 10 of one embodiment of the present invention includes a region 11 and a region 12, and includes a region 13 between the region 11 and the region 12. An interface of the region 11 is covered with the region 13. Alternatively, the metal oxide 10 of one embodiment of the present invention includes the region 11, the region 13 that exists to cover the region 11, and the region 12 that exists to cover the region 13.

The region 11, the region 12, and the region 13 included in the metal oxide 10 have different crystallinities. The crystallinities of the region 11, the region 12, and the region 13 are described with reference to FIG. 1B.

Figure 1B:
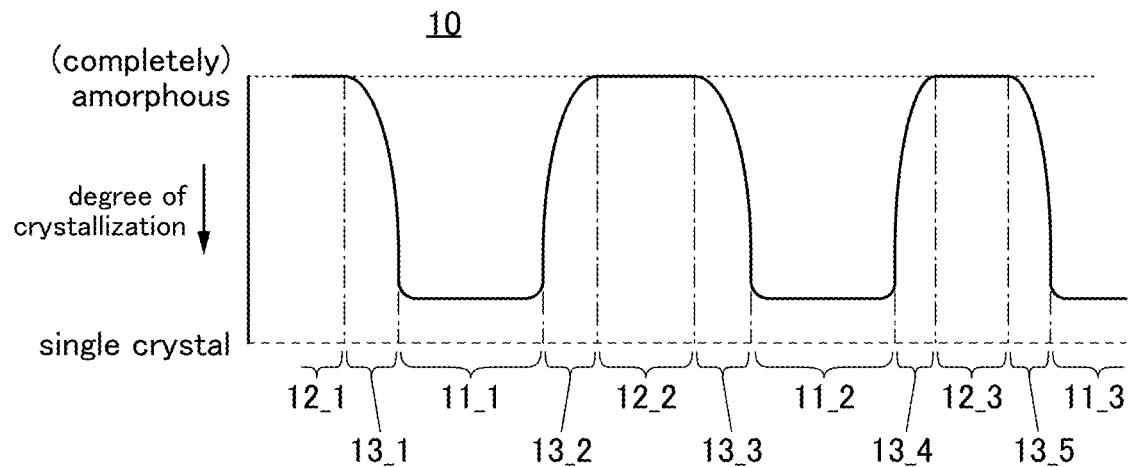
FIG. 1B is a schematic view showing transition of the degree of crystallization in the metal oxide of one embodiment of the present invention.

FIG. 1B is a schematic view illustrating transition of the degree of crystallization in the metal oxide 10. The vertical axis of FIG. 1B represents the degree of crystallization in a certain region. Here, the degree of crystallization in a certain region refers to the proportion of a region having a crystal structure in the region. In other words, a region with a high degree of crystallization is a region having high crystallinity and a periodic atomic arrangement. In addition, a region with a low degree of crystallization is a region having low crystallinity.

In FIG. 1B, a structure with the highest degree of crystallization is single crystal. In addition, a structure with the lowest degree of crystallization is amorphous or completely amorphous. Note that the degree of crystallization is higher on the lower side of the vertical axis in FIGS. 1B and is lower on the upper side thereof.

For example, the region 11 (one or more of a region 11_1 to a region 11_$n$ ($n$ is an integer greater than or equal to 2)) has a periodic atomic arrangement in a region greater than or equal to 1 nm and less than or equal to 10 nm, particularly, a region greater than or equal to 1 nm and less than or equal to 3 nm. The region 11 includes single crystal or crystal close to the single crystal. That is, the region 11 has a high degree of crystallization. Note that the size of the region 11 is, for example, greater than or equal to 1 nm and less than or equal to 10 nm, particularly, greater than or equal to 1 nm and less than or equal to 3 nm, and thus the region 11 is called microcrystal (nc: nanocrystal) or a microcrystalline region in some cases.

Note that when the plurality of regions 11 are connected to each other, the size of the region having a periodic atomic arrangement is greater than or equal to 10 nm in some cases. At this time, a boundary between the regions 11 cannot be clearly determined in some cases. As a result, the region 11 with a size of greater than or equal to 10 nm is observed in some cases.

As shown in FIG. 1B, the degree of crystallization of the region 11 is sometimes lower than that of single crystal by being affected by the density, atomic arrangement, and the like of the region 11. The region 11 in the vicinity of the region 13 has a lower degree of crystallization than the center portion of the region 11, by being affected by the region 13. The distance between the regions 11 (e.g., the distance between the region 11_1 and the region 11_2 or the distance between the region 11_2 and the region 11_3) is not necessarily constant.

Note that a boundary between the region 11 and the region 13 and a boundary between the region 13 and the region 12 are clearly shown by dashed-dotted lines in FIG. 1B; however, the boundaries cannot be determined clearly in some cases because the degree of crystallization in the metal oxide 10 is continuously changed.

Note that the single crystal or the crystal close to the single crystal included in the region 11 is not limited to the single crystal or the crystal close to the single crystal formed with the composition of the metal oxide 10. The single crystal or the crystal close to the single crystal can be the single crystal or the crystal close to the single crystal formed with one or more of elements of the metal oxide 10. For example, in the case where the metal oxide 10 is an In-M-Zn oxide, the single crystal or the crystal close to the single crystal is a single crystal formed with an In-M-Zn oxide or a crystal close to the single crystal, a single crystal formed with an In—Zn oxide or a crystal close to the single crystal, a single crystal of an indium oxide or a crystal close to the single crystal, a single crystal of a zinc oxide or a crystal close to the single crystal, or the like. The single crystal or the crystal close to the single crystal may be different among the region 11_1 to the region 11_n.

An example of the single crystal formed with an In-M-Zn oxide or the crystal close to the single crystal is a single crystal whose composition formula is represented by $In_{(1+\alpha)}M_{(1-\alpha)}O_3(ZnO)_m$ ($\alpha$ is a real number greater than or equal to 0 and less than or equal to 1 and m is a real number greater than or equal to 0) or a crystal close to the single crystal. Examples of the single crystal of an In—Zn oxide or the crystal close to the single crystal include a single crystal whose composition formula is represented by $In_2O_3(ZnO)_m$ (m is a real number greater than or equal to 0) or a crystal close to the single crystal, a single crystal in which indium exists at a metal site of a zinc oxide having a wurtzite crystal structure or a crystal close to the single crystal, and a single crystal in which zinc exists at a metal site of an indium oxide having a bixbyite structure or a crystal close to the single crystal.

The region 11_1 to the region 11_n may have different compositions. The composition of elements for forming the region 11 is not necessarily the same as the composition in the metal oxide 10 as long as the composition obtained by combining the region 11, the region 12, and the region 13 is the same as the composition in the metal oxide 10.

Furthermore, the regularity in crystal orientation is not necessarily observed between the different regions 11 (e.g., the region 11_1 and the region 11_2). At this time, the orientation is not observed in the whole film of the metal oxide 10. Note that the regularity in crystal orientation may be observed in part or the whole of the region 11.

The region 12 (one or more of a region 12_1 to a region 12_p (p is an integer greater than or equal to 1)) is an amorphous region or a completely amorphous region. That is, the region 12 is a region having a low degree of crystallization.

The region 12 exists to cover the region 11 and the region 13. Accordingly, for example, the region 12_1 and the region 12_2 which exist to cover a region 13_1, the region 11_1, and a region 13_2 have a continuous region in some cases. Alternatively, the region 12_1 and the region 12_2 can be regarded as one region in some cases. The same applies to the regions 12 other than the region 12_1 and the region 12_2 (e.g., a region 12_3 in FIG. 1B).

Note that the widths (spread) of the regions 12 are not necessarily the same. The widths (spread) of the regions 12 depend on conditions for depositing a metal oxide film to be the metal oxide 10 by a sputtering method, steps after the deposition of the metal oxide film, or the like.

The region 13 (one or more of the region 13_1 to a region 13_q (q is an integer greater than or equal to 2)) has a lower degree of crystallization than the region 11 and a higher degree of crystallization than the region 12. Note that the region 13 in this specification is called a less ordered region in some cases because the region 13 has a lower degree of crystallization than the region 11. In addition, the region 13 in this specification is called a transition region or an intermediate region in some cases because the region 13 exists between the region 11 and the region 12.

The region 13 exists to cover at least part of the region 11. Accordingly, for example, the region 13_1 and the region 13_2 which exist to cover the region 11_1 have a continuous region in some cases. Alternatively, the region 13_1 and the region 13_2 can be regarded as one region in some cases. The same applies to the regions 13 other than the region 13_1 and the region 13_2 (e.g., a region 13_3 to a region 13_5 in FIG. 1B).

Note that the widths (spread) of the regions 13 are not necessarily the same. The widths (spread) of the regions 13 depend on conditions for depositing a metal oxide film to be the metal oxide 10 by a sputtering method, steps after the deposition of the metal oxide film, or the like.

The existence of the region 13 reduces the disorder of atomic arrangement generated between the region 11 and the region 12 and the discontinuity in the degree of crystallization between the region 11 and the region 12 is relieved. Thus, defect states can be prevented from being formed at the interface of the region 11 and in the region 12 on the region 11 side, so that carrier traps and carrier generation sources can be reduced. Accordingly, with the use of the metal oxide 10 for a transistor, a highly reliable transistor with stable electrical characteristics in which changes in electrical characteristics are suppressed can be provided.

When the discontinuity in the degree of crystallization between the region 11 and the region 12 is relieved, a crystal grain boundary is difficult to observe clearly in the metal oxide 10. Thus, a reduction in electron mobility due to the crystal grain boundary is less likely to occur. This means that the electron mobility of the metal oxide 10 is maintained, so that the on-state current of the transistor using the metal oxide 10 is high and electrical characteristics of the transistor can be improved.

Note that in the above-described example, the region 11 is a region including the single crystal or the crystal close to the single crystal and the region 12 is an amorphous region or a completely amorphous region, but one embodiment of the present invention is not limited thereto. For example, the region 11 may be a region that has short-range order and long-range order; the region 12 may be a region that has short-range order and does not have long-range order; and the region 13 may be a region that has short-range order and whose long-range order is lower than that of the region 11 and higher than that of the region 12. For example, the region 11 may be a region that has order in the nearest neighbor (first neighbor) atomic distance and the second neighbor atomic distance and has long-range order; the region 12 may be a region that has order in the nearest neighbor atomic distance but does not have order in the second neighbor atomic distance and does not have long-range order; and the region 13 may be a region that has order in the nearest neighbor atomic distance and the second neighbor atomic distance but does not have long-range order. Note that the long-range order refers to order in a range greater than or equal to the third neighbor atomic distance and less than or equal to 1.0 nm or in a range greater than or equal to the third neighbor atomic distance and less than or equal to 0.5 nm in some cases.

FIG. 1A shows energy transition in the metal oxide 10. The vertical axis in FIG. 1A represents energy (E) in a certain region. The energy in this embodiment is, for example, the negation of cohesive energy (cohesive energy multiplied by −1). Note that cohesive energy has a value obtained by subtracting energy in a cohesion state from energy of an isolated atom, and has a positive value.

According to the above, the lower the energy in a certain region is, the higher the cohesive energy is; accordingly, the region is in a more stable state. This can be rephrased as "the region is energetically stable". Note that an energetically stable region is a region where a change in atomic arrangement or the like is small even when, for example, heat, light, or the like is applied to the region. In contrast, the higher the energy in a certain region is, the lower the cohesive energy is; accordingly, the region is in a more unstable state. This is also described that the region is energetically unstable.

In FIG. 1A, a structure with the lowest energy (the most energetically-stable structure) is single crystal. In addition, a structure with the highest energy (the most energetically-unstable structure) is amorphous or completely amorphous. Note that in the vertical axis in FIG. 1A, energy becomes lower in the lower side (energetically more stable), and energy becomes higher in the upper side (energetically more unstable).

The region 11 that has a periodic atomic arrangement as shown in FIG. 1A is an energetically stable region (a low energy region). The region 12 that has a disordered atomic arrangement is an energetically unstable region (a high energy region). The region 13 has lower crystallinity than the region 11 and higher crystallinity than the region 12; accordingly, the region 13 is energetically more unstable than the region 11 and energetically more stable than the region 12.

Note that the above energy may be regarded as partial energy. In this specification, partial energy is energy required for one atom to contribute to a cohesion state. For example, the partial energy is obtained by subtracting energy in a cohesion state from which one atom is eliminated, from energy in a cohesion state. At this time, the region 11 has a small value (a large negative value) of the partial energy. The region 12 has a large value (a small negative value) of the partial energy. The value of partial energy of the region 13 is larger than that of the region 11 and smaller than that of the region 12. That is, the value of partial energy of the region 13 is between the values of the region 11 and the region 12.

In a normal situation, the region 12 is energetically extremely unstable, and a metal oxide that has only the region 12 cannot exist. However, since the region 11 exists in the vicinity of the region 12, the region 12 is influenced by the energetically stable region 11 and becomes energetically stable by ΔEa. Thus, owing to the region 11 included in the metal oxide 10, the region 12 can exist in the metal oxide 10. For this reason, the metal oxide 10 including the region 11, the region 12, and the region 13 has high physical stability. Since the region 12 becomes energetically more stable than the completely amorphous region by ΔEa as shown in FIG. 1A, the region 12 can be rephrased as an amorphous-like (a-like) region. Note that the region 11 and the region 13 are energetically more stable than the region 12. Therefore, the proportion of the region 11 and the region 13 in the metal oxide 10 is preferably higher than that of the region 12.

As described above, the region 11 makes the region 12 energetically stable by ΔEa. That is, the region 11 functions as a stabilizer for energetically stabilizing the region 12. In other words, if the regions 11 are not dispersed to some degree in the metal oxide 10, the region 12 probably cannot exist at room temperature (R.T.) in principle. Alternatively, a metal oxide consisting only of the region 12 probably cannot be formed.

Note that the widths (spread) of the regions 12 are not necessarily the same, and the widths (spread) of the regions 13 are not necessarily the same; therefore, the values of ΔEa of the region 12_1 to the region 12_p may be different.

Although FIG. 1A and FIG. 1B show the structure in which the metal oxide 10 includes the region 13_2, the region 12_2, and the region 13_3 between the region 11_1 and the region 11_2 as an example, one embodiment of the present invention is not limited to this; for example, a structure in which the region 13_2 or the region 13_3 is included between the region 11_1 and the region 11_2 may be employed.

[Stability of nc Film]

In this section, the stability of a metal oxide film including a microscopic crystal region (hereinafter also referred to as nc film) is described with results of first-principles calculation.

Note that to describe the stability of an nc film, two calculation models (Calculation Model 1A and Calculation Model 2A) are prepared. Calculation Model 1A is a calculation model including a crystal region and simulating an nc film. Calculation Model 2A is a calculation model including no crystal region and simulating an amorphous film. Note that the crystal region will be described later.

[Creating Method of Calculation Model 1A]

A creating method of Calculation Model 1A is described below.

First, a hexagonal-prism-shaped region (referred to as crystal region) is cut from a crystal structure of an In—Ga—Zn oxide of In:Ga:Zn:O=1:1:1:4 [atomic ratio], and the crystal region is placed at the center of the calculation model. Note that the number of atoms contained in the crystal region is 87. Hereinafter, the atoms positioned in the crystal region mean the 87 atoms placed in the crystal region. Any one or more of the atoms positioned in the crystal region move to a peripheral portion of the crystal region in some cases as a result of calculation performed later.

Next, a plurality of In atoms, a plurality of Ga atoms, a plurality of Zn atoms, and a plurality of O atoms are randomly placed in the peripheral portion of the above crystal region. Note that the numbers of the In atoms, the Ga atoms, the Zn atoms, and the O atoms which are placed in the peripheral portion and the size of the peripheral portion are adjusted such that the atomic ratio of the atoms placed in the above crystal region and the peripheral portion becomes In:Ga:Zn:O=1:1:1:4 and the calculation model has a density of 6.1 g/cm$^3$. Note that the number of atoms placed in the peripheral portion is 291. Accordingly, the number of atoms included in the calculation model is 378. Any one or more of the atoms placed in the peripheral portion move to the crystal region in some cases as a result of calculation performed later.

Then, the coordinates of the atoms positioned in the above crystal region are fixed and calculation for melting the above peripheral portion is performed. Specifically, the temperature is set to 3500 K; the time step, 1 fs; and the number of steps, 6000. The calculation which is performed with the temperature, the time step, and the number of steps set is hereinafter referred to as first-principles molecular dynamics calculation or quantum molecular dynamics calculation in some cases.

For the calculation, the first-principles calculation software VASP (The Vienna Ab initio simulation package) is used. Calculation conditions other than the conditions set as described above are shown in Table 1. In the calculation for melting the above peripheral portion, the calculation conditions are set to Conditions 1 shown in Table 1.

TABLE 1

|  | Conditions 1 | Conditions 2 | Conditions 3 |
|---|---|---|---|
| Software |  | VASP |  |
| Basis function |  | Plane wave |  |
| Functional |  | GGA/PBE |  |
| Pseudopotential |  | PAW |  |
| The number of electrons |  | Neutral |  |
| Pseudopotential of oxygen | O_s | O | O |
| Cut-off energy | 280 eV | 400 eV | 400 eV |
| k-point grid | Γ-point only | Γ-point only | 2 × 2 × 2 |

As a pseudopotential of electronic states, a potential generated by a Projector Augmented Wave (PAW) method is used, and as a functional, GGA/PBE (Generalized-Gradient-Approximation/Perdew-Burke-Emzerhof) is used.

Note that in the first-principles molecular dynamics calculation and later-described calculation for optimizing the structure of the calculation model (also referred to as optimization calculation), which are performed in this embodiment, the 3d state or the 4d state is not considered as a valence band for the potentials of In, Ga, and Zn. The lattice vector (the length of an axis and the angle between axes) of the calculation model is fixed. In other words, the first-principles molecular dynamics calculation is performed under conditions where the number of particles (N), volume (V), and temperature (T) are constant (NVT ensemble). In addition, in the first-principles molecular dynamics calculation, a Nose-Hoover thermostat is used as a method for controlling the temperature.

Next, calculation for cooling the melted peripheral portion to a temperature of 500 K is performed. Note that the cooling rate is 500 K/ps. Specifically, first, the coordinates of the atoms positioned in the crystal region are fixed, and the time step is set to 1 fs, the number of steps is set to 1000, and other calculation conditions are set to Conditions 1 shown in Table 1. Then, first-principles molecular dynamics calculation is performed, with the temperature set to 3500 K, on the calculation model obtained by the above calculation for melting the peripheral portion. Next, on the calculation model obtained following the calculation, first-principles molecular dynamics calculation is performed with the temperature set to 3000 K. Subsequently, on the calculation model obtained following the calculation, first-principles molecular dynamics calculation is performed with the temperature set to 2500 K. Then, on the calculation model obtained following the calculation, first-principles molecular dynamics calculation is performed with the temperature set to 2000 K. Next, on the calculation model obtained following the calculation, first-principles molecular dynamics calculation is performed with the temperature set to 1500 K. Subsequently, on the calculation model obtained following the calculation, first-principles molecular dynamics calculation is performed with the temperature set to 1000 K. Then, on the calculation model obtained following the calculation, first-principles molecular dynamics calculation is performed with the temperature set to 500 K. Through the above steps, the calculation for cooling the peripheral portion is completed.

Next, calculation for relaxation of the structure of the cooled peripheral portion is performed. Specifically, on the calculation model obtained by the calculation for cooling the peripheral portion, first-principles molecular dynamics calculation is performed with the coordinates of the atoms positioned in the crystal region fixed, the temperature set to 300 K, the time step set to 1 fs, the number of steps set to 5000, and other calculation conditions set to Conditions 1 shown in Table 1.

Then, the calculation conditions are set to Conditions 2 shown in Table 1, and on the calculation model obtained by the calculation for relaxation of the structure of the peripheral portion, calculation for optimizing the structure of the peripheral portion is performed with the coordinates of the atoms positioned in the crystal region fixed. Subsequently, on the calculation model obtained following the calculation, calculation for optimizing the structure of the crystal region is performed with the coordinates of the atoms positioned in the peripheral portion and the coordinates of one In atom at the center of the crystal region fixed. Then, on the calculation model obtained following the calculation, calculation for optimizing the structure of the entire calculation model (the crystal region and peripheral portion) is performed with the coordinates of only the In atom fixed. After that, the calculation conditions are set to Conditions 3 shown in Table 1, and on the calculation model obtained following the calculation, calculation for optimizing the structure of the entire calculation model is performed with the coordinates of only the In atom fixed.

Figure 2A:
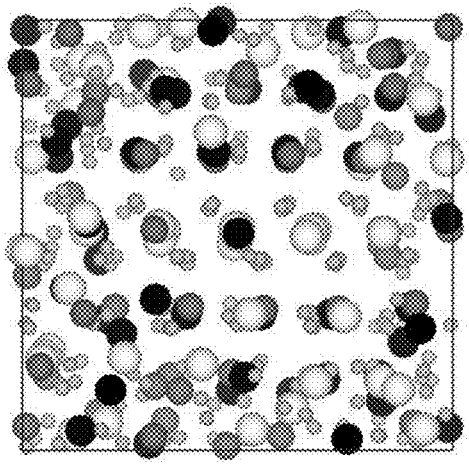
FIG. 2A to FIG. 2E are diagrams showing calculation models.
Figure 2B:
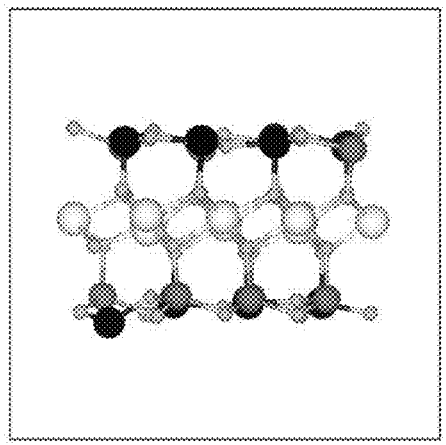
Figure 2C:
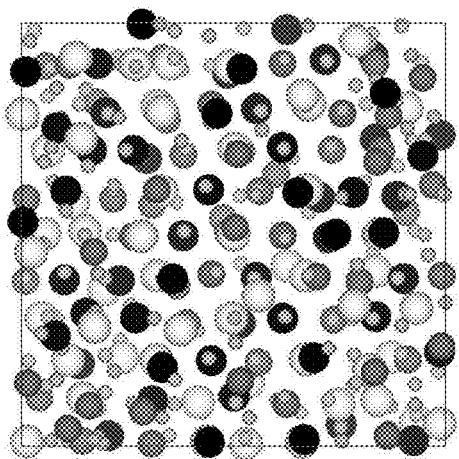
Figure 2D:
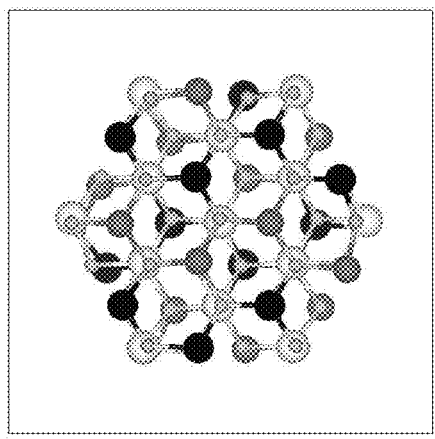

By the above method, Calculation Model 1A is created. The created Calculation Model 1A is shown in FIG. 2A to FIG. 2D. FIG. 2A and FIG. 2C show overall views of Calculation Model 1A. FIG. 2B and FIG. 2D show the crystal region of Calculation Model 1A. FIG. 2A and FIG. 2B are diagrams when a whole image of Calculation Model 1A and a crystal region of Calculation Model 1A are seen from a side surface of the hexagonal-prism-shaped region. FIG. 2C and FIG. 2D are diagrams when the whole image of Calculation Model 1A and the crystal region of Calculation Model 1A are seen from a top surface of the hexagonal-prism-shaped region.

[Creating Method of Calculation Model 2A]

A creating method of Calculation Model 2A is described below. Note that calculation for creating Calculation Model 2A adopts the calculation conditions shown in Table 1.

First, calculation for melting the crystal region and the peripheral portion of Calculation Model 1A is performed. Specifically, Calculation Model 1A is prepared, and first-principles molecular dynamics calculation is performed with the coordinates of all the atoms not fixed, the temperature set to 3500 K, the time step set to 1 fs, the number of steps set to 6000, and other calculation conditions set to Conditions 1 shown in Table 1.

Next, calculation for cooling the entire melted calculation model to a temperature of 500 K is performed. Note that the cooling rate is 500 K/ps. Specifically, first, the time step is set to 1 fs, the number of steps is set to 1000, and other calculation conditions are set to Conditions 1 shown in Table 1 while the coordinates of all the atoms are not fixed. Then, first-principles molecular dynamics calculation is performed, with the temperature set to 3500 K, on the calculation model obtained by the calculation for melting the crystal region and the peripheral portion. Next, on the calculation model obtained following the calculation, first-principles molecular dynamics calculation is performed with the temperature set to 3000 K. Subsequently, on the calculation model obtained following the calculation, first-principles molecular dynamics calculation is performed with the temperature set to 2500 K. Then, on the calculation model obtained following the calculation, first-principles molecular dynamics calculation is performed with the temperature set to 2000 K. Next, on the calculation model obtained following the calculation, first-principles molecular dynamics calculation is performed with the temperature set to 1500 K. Subsequently, on the calculation model obtained following the calculation, first-principles molecular dynamics calculation is performed with the temperature set to 1000 K. Then, on the calculation model obtained following the calculation, first-principles molecular dynamics calculation is performed with the temperature set to 500 K. Through the above steps, the calculation for cooling the entire calculation model is completed.

Next, calculation for relaxation of the structure of the entire cooled calculation model is performed. Specifically, on the calculation model obtained by the calculation for cooling the entire calculation model, first-principles molecular dynamics calculation is performed with the coordinates of all the atoms not fixed, the temperature set to 300 K, the time step set to 1 fs, the number of steps set to 5000, and other calculation conditions set to Conditions 1 shown in Table 1.

Then, the calculation conditions are set to Conditions 2 shown in Table 1, and on the calculation model obtained by the calculation for relaxation of the entire calculation model, calculation for optimizing the structure of the entire calculation model is performed with the coordinates of all the atoms not fixed. After that, the calculation conditions are set to Conditions 3 shown in Table 1, and on the calculation model obtained following the calculation, calculation for optimizing the structure of the entire calculation model is performed with the coordinates of all the atoms not fixed.

Figure 2E:
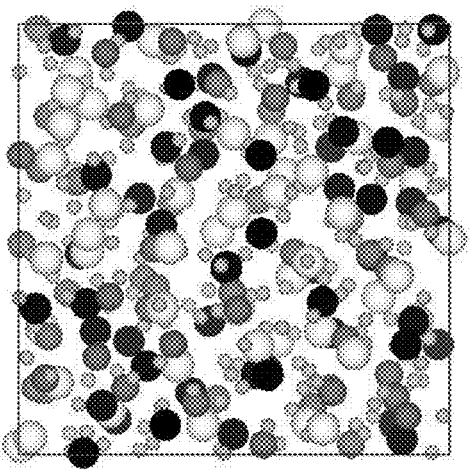

By the above method, Calculation Model 2A is created. FIG. 2E shows an overall view of Calculation Model 2A.

The total energies of Calculation Model 1A and Calculation Model 2A are calculated and compared. Specifically, the calculation conditions are set to Conditions 3 shown in Table 1, and single point calculation is performed on Calculation Model 1A with the coordinates of only one In atom at the center of the crystal region fixed, whereas single point calculation is performed on Calculation Model 2A with the coordinates of all the atoms not fixed. The total energies calculated through the calculation are compared.

The results of the above calculation showed that the total energy value of Calculation Model 1A is smaller than the total energy value of Calculation Model 2A by, specifically, 6.83 eV. It is thus found that Calculation Model 1A including the crystal region is more stable than Calculation Model 2A including no crystal region. That is, it is suggested that the nc film is stabilized by including the crystal region.

Then, Calculation Model 3A for comparison with Calculation Model 1A is prepared. Note that the structure of Calculation Model 3A is a single crystal structure.

First, a calculation model is prepared which has an InGaZnO$_4$ single crystal structure (space group: R-3m), an atomic ratio In:Ga:Zn:O=1:1:1:4, and a density of 6.36 g/cm$^3$ and includes 112 atoms. Then, the k-point grid is set to 2×2×3, other calculation conditions are set to Conditions 3 shown in Table 1, and calculation for optimizing the coordinates of the atoms of the calculation model is performed. Through the above steps, Calculation Model 3A is created.

The total energy of Calculation Model 3A created by the above method is calculated. Specifically, the k-point grid is set to 2×2×3, other calculation conditions are set to Conditions 3 shown in Table 1, and single point calculation is performed. The value which is obtained by multiplying the total energy calculated by the calculation by 3.375 (=378/112) is the total energy value of the calculation model of the single crystal structure.

The results of the above calculation showed that the total energy value of the calculation model of the single crystal structure is smaller than the total energy value of Calculation Model 1A by, specifically, 54.88 eV. That is, it is found that improvement of the crystallinity in the film makes the film energetically stable.

As described above, Calculation Model 1A is more stable than Calculation Model 2A although having higher energy than Calculation Model 3A. This suggests that the existence of the crystal region contributes to stabilization of the nc film.

The above is the description of the stability of the nc film.

[Thermal Stability of Nc Film]

In this section, thermal stability of an nc film is described with results of first-principles calculation. Note that thermal stability of an nc film is evaluated using internal energy.

Here, internal energy is described. In this specification, internal energy U is calculated using the following formula.

$$U = \sum_I \frac{1}{2} M_I v_I^2 + \sum_I \sum_{J>I} \frac{Z_I Z_J}{r_{IJ}} + \qquad \text{[Formula 1]}$$
$$\langle \Psi | \sum_i \left( -\frac{\hbar^2}{2m} \nabla_i^2 \right) + \sum_i \sum_{j>i} \frac{e^2}{r_{ij}} | \Psi \rangle + \langle \Psi | \sum_i \sum_I \frac{e Z_I}{r_{iI}} | \Psi \rangle$$

Here, $M_I$ is the mass of the I-th (I is a natural number) atomic nucleus and m is the mass of an electron. Furthermore, $v_I$ is the speed of the I-th atomic nucleus. In other words, the first term of the right side of the above formula denotes the kinetic energy of the atomic nucleus, and the third term of the right side of the above formula denotes the kinetic energy of an electron.

Furthermore, $Z_I$ is an electric charge of the I-th atomic nucleus, and e is an electric charge of an electron. In addition, $r_{IJ}$ is the distance between the I-th atomic nucleus and the J-th (J is an integer larger than I) atomic nucleus, and $r_{ij}$ is the distance between the i-th (i is a natural number) electron and the j-th (j is an integer larger than i) electron. In other words, the second term of the right side of the above formula is potential energy involved in interaction between the atomic nuclei; the fourth term of the right side of the above formula is potential energy involved in interaction between the electrons; and the fifth term of the right side of the above formula is potential energy involved in interaction between the atomic nucleus and the electron.

From the above, the internal energy U is calculated as the sum of kinetic energies and potential energies.

Note that the stability of a phase in an equilibrium state or the like is described with Hermholtz free energy F. Here, the Hermholtz free energy F is a value obtained by subtracting a product of a temperature T and an entropy S from the internal energy U (F=U−TS). However, since it is difficult to evaluate the entropy S, the internal energy U is used to study thermodynamic phase stability in this specification.

The above is the description of the internal energy. Next, a specific method for evaluating the thermal stability of an nc film is described.

On each of Calculation Model 1A and Calculation Model 2A described above, first-principles molecular dynamics calculation is performed with the temperature set to 300 K, 673 K, 1000 K, 1500 K, or 2000 K. Note that in the case of using Calculation Model 1A, the first-principles molecular dynamics calculation is performed with the coordinates of one In atom at the center of the crystal region fixed. In the case of using Calculation Model 2A, the first-principles molecular dynamics calculation is performed with the coordinates of all the atoms not fixed. In the first-principles molecular dynamics calculation, the time step is set to 1 fs, the number of steps is set to 10000, and other calculation conditions are set to Conditions 2 shown in Table 1.

Here, the calculation models 1A subjected to the first-principles molecular dynamics calculation at temperatures of 300 K, 673 K, 1000 K, 1500 K, and 2000 K are called a calculation model 1B, a calculation model 1C, a calculation model 1D, a calculation model 1E, and a calculation model 1F, respectively. The calculation models 2A subjected to the first-principles molecular dynamics calculation at temperatures of 300 K, 673 K, 1000 K, 1500 K, and 2000 K are called a calculation model 2B, a calculation model 2C, a calculation model 2D, a calculation model 2E, and a calculation model 2F, respectively.

Next, the internal energies of the calculation model 1B to the calculation model 1F and the calculation model 2B to the calculation model 2F are calculated. Specifically, the average value of internal energy from the 9001st step to 10000th step is calculated on each calculation model. Note that the average value of internal energy when the average value of internal energy of Calculation Model 1B is the reference (0.0 eV) is referred to as average energy.

Figure 3A:
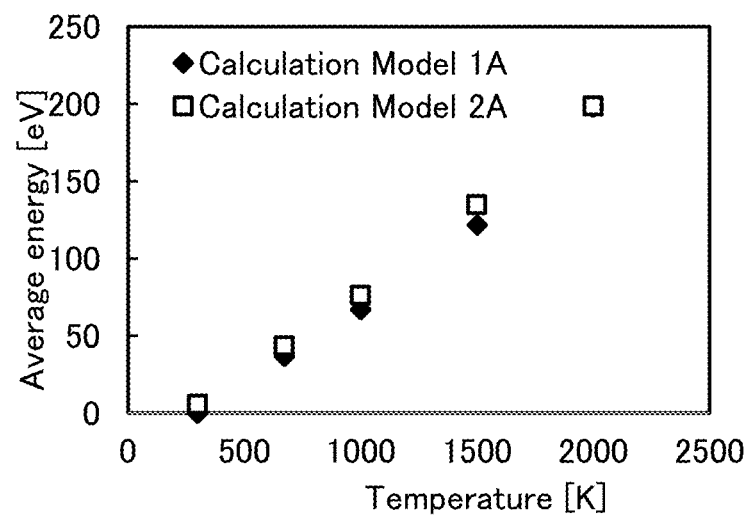
FIG. 3A is a graph showing a relationship between a temperature and average energy.

FIG. 3A shows the relationship between the temperature and the average energy calculated by the above-described method. In FIG. 3A, the horizontal axis represents the temperature [K] and the vertical axis represents the average energy [eV]. In FIG. 3A, spots of black rhombi are a plot of the average energy in the case of using Calculation Model 1A and plots of the average energy of Calculation Model 1B to Calculation Model 1F. Plots of white squares are a plot of the average energy in the case of using Calculation Model 2A and plots of the average energy of Calculation Model 2B to Calculation Model 2F.

Next, on each of Calculation Model 1B to Calculation Model 1F after being subjected to the first-principles molecular dynamics calculation, calculation for optimizing the structure of the calculation model is performed with the calculation conditions set to Conditions 2 shown in Table 1. Note that the optimization calculation is performed with the coordinates of one In atom at the center of the crystal region fixed. Then, on each of the calculation models (five kinds in total) obtained by the optimization calculation, calculation for optimizing the structure of the calculation model is performed with the calculation conditions set to Conditions 3 shown in Table 1. Then, on each of Calculation Model 1B to Calculation Model 1F after being subjected to the optimization calculation, calculation for optimizing the structure of the calculation model is performed with the calculation conditions set to Conditions 3 shown in Table 1.

Figure 4A:
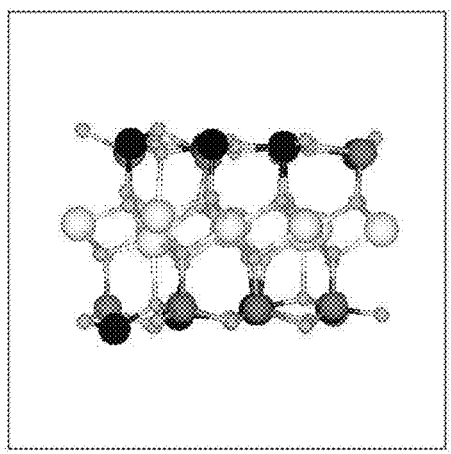
FIG. 4A to FIG. 4E are diagrams showing calculation models.
Figure 4B:
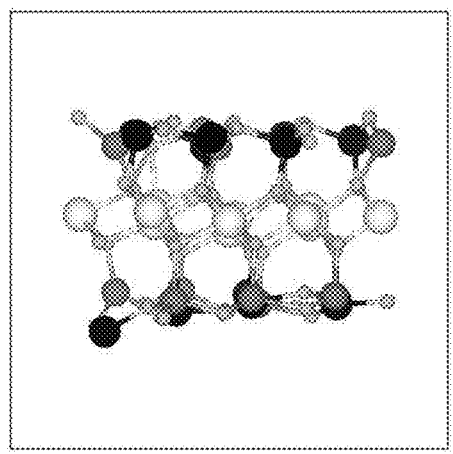
Figure 4C:
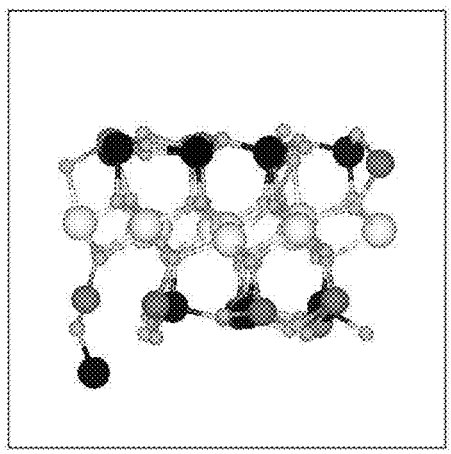
Figure 4D:
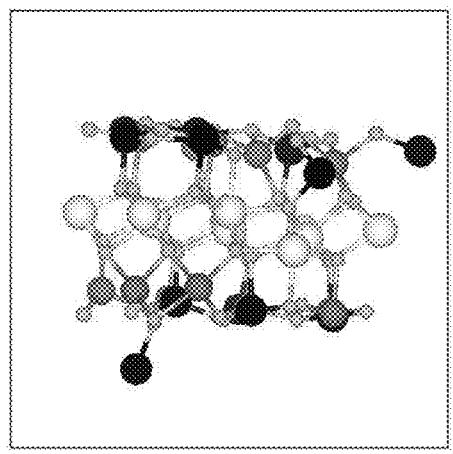
Figure 4E:
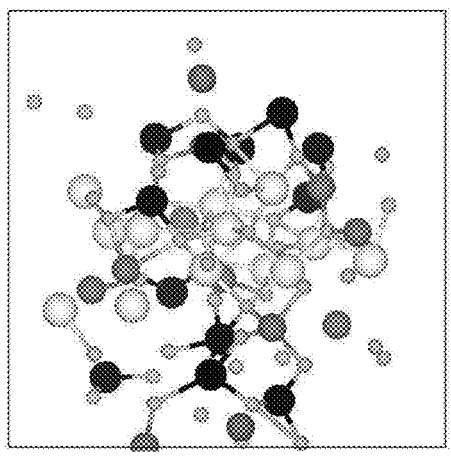

FIG. 4A to FIG. 4E show parts of Calculation Model 1B to Calculation Model 1F, respectively, after the optimization calculation is performed. Note that FIG. 4A to FIG. 4E show arrangement of 87 atoms of the calculation model which are placed in the crystal region before placement of atoms in the peripheral portion of the crystal region. FIG. 4A is a calculation model (Calculation Model 1B) obtained by performing the first-principles molecular dynamics calculation with the temperature set to 300 K and the optimization calculation; FIG. 4B, a calculation model (Calculation Model 1C) obtained by performing the first-principles molecular dynamics calculation with the temperature set to 673 K and the optimization calculation; FIG. 4C, a calculation model (Calculation Model 1D) obtained by performing the first-principles molecular dynamics calculation with the temperature set to 1000 K and the optimization calculation; FIG. 4D, a calculation model (Calculation Model 1E) obtained by performing the first-principles molecular dynamics calculation with the temperature set to 1500 K and the optimization calculation; and FIG. 4E, a calculation model (Calculation Model 1F) obtained by performing the first-principles molecular dynamics calculation with the temperature set to 2000 K and the optimization calculation.

As can be seen from FIG. 4A to FIG. 4E, in the calculation models (Calculation Model 1B to Calculation Model 1E) obtained by performing the first-principles molecular dynamics calculation with the temperature set to 1500 K or less and the optimization calculation, the lattice arrangement of the crystal region is maintained. In the calculation model (Calculation Model 1F) obtained by performing the first-principles molecular dynamics calculation with the temperature set to 2000 K and the optimization calculation, the crystal structure collapses. As can be seen from FIG. 4D, in the calculation model (Calculation Model 1E) obtained by performing the first-principles molecular dynamics calculation with the temperature set to 1500 K and the optimization calculation, the lattice arrangement of the crystal region is maintained but the atomic arrangement is more disordered than in the calculation model (Calculation Model 1D) obtained by performing the first-principles molecular dynamics calculation with the temperature set to 1000 K and the optimization calculation, showing signs that the crystal structure starts to collapse.

Here, the difference between the average energy of Calculation Model 1A and that of Calculation Model 2A at each temperature is calculated to compare the thermal stability of Calculation Model 1A and that of Calculation Model 2A. Specifically, a difference in average energy between the calculation model 1B and the calculation model 2B, a difference in average energy between the calculation model 1C and the calculation model 2C, a difference in average energy between the calculation model 1D and the calculation model 2D, a difference in average energy between the calculation model 1E and the calculation model 2E, and a difference in average energy between the calculation model 1F and the calculation model 2F are calculated. Note that the relationship between the temperature and the average energies of Calculation Model 1A and Calculation Model 2A is as shown in FIG. 3A.

Figure 3B:
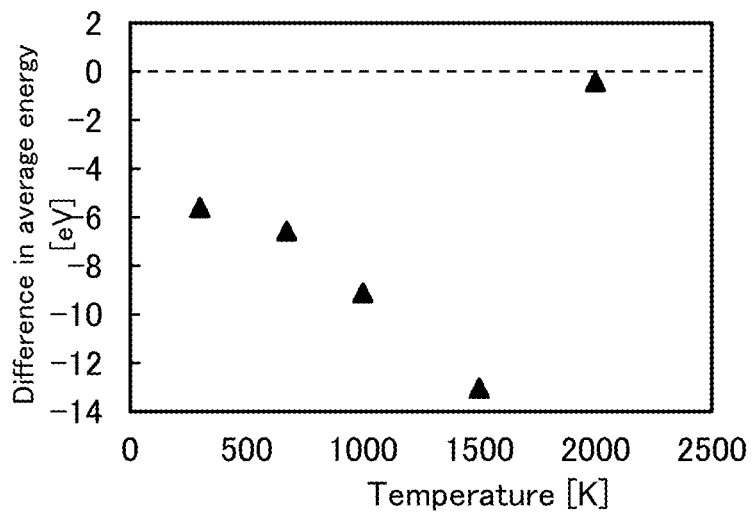
FIG. 3B is a graph showing a relationship between a temperature and a difference in average energy.

FIG. 3B shows the relationship between the temperature and the value (also referred to as the difference in average energy) obtained by subtracting the average energy of Calculation Model 2A from the average energy of Calculation Model 1A. In FIG. 3B, the horizontal axis represents the temperature [K] and the vertical axis represents the difference in average energy [eV].

FIG. 3B shows that in the case where the temperature is set to 2000 K, the difference in average energy is close to 0 and the average energy in the case of using Calculation Model 1A is substantially equal to that in the case of using Calculation Model 2A. In contrast, it is shown that in the case where the temperature is set to 1500 K or less, the difference in average energy has a negative value and the average energy in the case of using Calculation Model 1A is lower than the average energy in the case of using Calculation Model 2A at any of the temperatures. That is, it is presumed that at the temperature at which the lattice arrangement of the crystal region is maintained, the calculation model including the crystal region is more thermally stable than the calculation model including no crystal region. It is thus suggested that except in a high temperature range, the existence of the crystal region increases the thermal stability of the film.

The above is the description of the thermal stability of the nc film

[Ease of Formation of Defects in Nc Film]

In this section, ease of formation of defects in an nc film is described with results of first-principles calculation. Specifically, formation energy of an oxygen vacancy (hereinafter sometimes referred to as $V_O$) and a defect in which hydrogen enters an oxygen vacancy (hereinafter sometimes referred to as $V_OH$ or $H_O$) is calculated by first-principles calculation.

The electrical characteristics of a transistor using an oxide semiconductor are likely to change when oxygen vacancies exist in a channel formation region in the oxide semiconductor, which might affect the reliability. In addition, hydrogen in the vicinity of the oxygen vacancies forms $H_O$ in some cases. The $H_O$ generates an electron serving as a carrier in some cases. Therefore, when $H_O$ is generated in the channel formation region in the oxide semiconductor, the transistor tends to have normally-on characteristics (the channel exists even when no voltage is applied to the gate electrode, and current flows through the transistor). Therefore, hydrogen and oxygen vacancies are preferably reduced as much as possible in the channel formation region in the oxide semiconductor. In other words, in the channel formation region in the oxide semiconductor, the carrier concentration is preferably reduced and the channel formation region is preferably i-type (intrinsic) or substantially i-type.

Here, formation energy of a defect is described. In this specification, formation energy of a defect is calculated using the following formula. A defect whose formation energy is lower can be regarded as being formed more easily.

$$E_{form}(\text{defect}) = E(\text{defect}) - \left\{E(\text{no defect}) + \sum_X n_X \mu(X)\right\} \quad \text{[Formula 2]}$$

Here, $E_{form}(\text{defect})$ is the formation energy of a defect, $E(\text{defect})$ is the total energy of a calculation model including one defect, $E(\text{no defect})$ is the total energy of a calculation model with no defect, an atom X is an atom the number of which has increased or decreased owing to formation of a defect, $\mu(X)$ is the chemical potential of the atom X, and $n_X$ is the increment or decrement of the atom X. For example, in the case where the defect is $V_O$, X is an oxygen atom (O) and $n_O$ is $-1$. In the case where the defect is $H_O$, X is an oxygen atom (O) and a hydrogen atom (H), $n_O$ is $-1$, and $n_H$ is $+1$.

The chemical potential $\mu(O)$ of an oxygen atom and the chemical potential $\mu(H)$ of a hydrogen atom are calculated using the following formula.

$$\mu(O) = E(O_2)/2$$

$$\mu(H) = E(H_2O)/2 - E(O_2)/4 \quad \text{[Formula 3]}$$

Here, $E(O_2)$ is the total energy of an oxygen molecule ($O_2$) and $E(H_2O)$ is the total energy of a water molecule ($H_2O$).

Note that $E(O_2)$ is calculated in the following manner: on a calculation model in which one $O_2$ is placed in a 1-nm$^3$ lattice, calculation for optimizing the structure of the $O_2$ is performed with the calculation conditions set to Conditions 2 shown in Table 1, and then, on the calculation model obtained following the calculation, single point calculation is performed. Furthermore, $E(H_2O)$ is calculated in the following manner: on a calculation model in which one $H_2O$ is placed in a 1-nm$^3$ lattice, calculation for optimizing the structure of the $H_2O$ is performed with the calculation conditions set to Conditions 2 shown in Table 1, and then, on the calculation model obtained following the calculation, single point calculation is performed.

The above is the description of the formation energy of a defect.

To calculate the formation energy of a defect, Calculation Model 4A is prepared. A creating method of Calculation Model 4A is described below. Note that calculation for creating Calculation Model 4A adopts the calculation conditions shown in Table 1.

First, Calculation Model 1A is prepared and calculation for relaxation of the structure of the peripheral portion of Calculation Model 1A is performed. Specifically, first-principles molecular dynamics calculation is performed with the coordinates of the atoms positioned in the crystal region of Calculation Model 1A fixed, the temperature set to 1000 K, the time step set to 1 fs, the number of steps set to 10000, and other calculation conditions set to Conditions 2 shown in Table 1.

Then, while the calculation conditions set to Conditions 2 shown in Table 1 are maintained, on the calculation model obtained by the calculation for relaxation of the structure of the peripheral portion, calculation for optimizing the structure of the peripheral portion is performed with the coordinates of the atoms positioned in the crystal region fixed. Subsequently, on the calculation model obtained following the calculation, calculation for optimizing the structure of the crystal region is performed with the coordinates of the atoms positioned in the peripheral portion and the coordinates of one In atom at the center of the crystal region fixed. Then, on the calculation model obtained following the calculation, calculation for optimizing the structure of the entire calculation model is performed with the coordinates of the one In atom at the center of the crystal region fixed. After that, the calculation conditions are set to Conditions 3 shown in Table 1, and on the calculation model obtained following the calculation, calculation for optimizing the structure of the entire calculation model is performed with the coordinates of the one In atom at the center of the crystal region fixed.

By the above method, Calculation Model 4A is created.

With the use of Calculation Model 4A created by the above method, the formation energies of $V_O$ and $H_O$ are calculated. Specifically, a calculation model containing one $V_O$ is prepared by removing one oxygen atom from the calculation model 4A. One oxygen atom in Calculation Model 4A is replaced with one hydrogen atom, so that a calculation model including one $H_O$ is prepared. Note that the number of oxygen atoms in Calculation Model 4A is 216 and thus, 216 calculation models each including one $V_O$ and 216 calculation models each including one $H_O$ are prepared. Note that a calculation model including no defect is Calculation Model 4A itself.

On each of the calculation model containing one $V_O$, the calculation model including one $H_O$, and the calculation model including no $H_O$, calculation for optimizing the structure of the entire calculation model is performed with the calculation conditions set to Conditions 3 shown in Table 1. Each of the total energy of the calculation model including one $V_O$ and the total energy of the calculation model including one $H_O$, which are obtained following the calculation, is E(defect), whereas the total energy of the calculation model including no defect which is obtained following the calculation is E(no defect). Note that performing the calculation on the calculation model including one $H_O$ sometimes changes the $H_O$ into a different defect (e.g., an oxygen vacancy and hydrogen).

Note that here, part of a layer whose center is an In atom that exists in the center of the crystal region and which contains In and O and a region in the vicinity of the part are called a crystal core region or a crystal inner region in some cases for simple description. A region in the crystal region other than the crystal core region is called a crystal shell region or a crystal outer region in some cases. Note that the number of oxygen positioned in the crystal core region is 12, and the number of oxygen positioned in the crystal Shell region is 38.

Figure 5A:
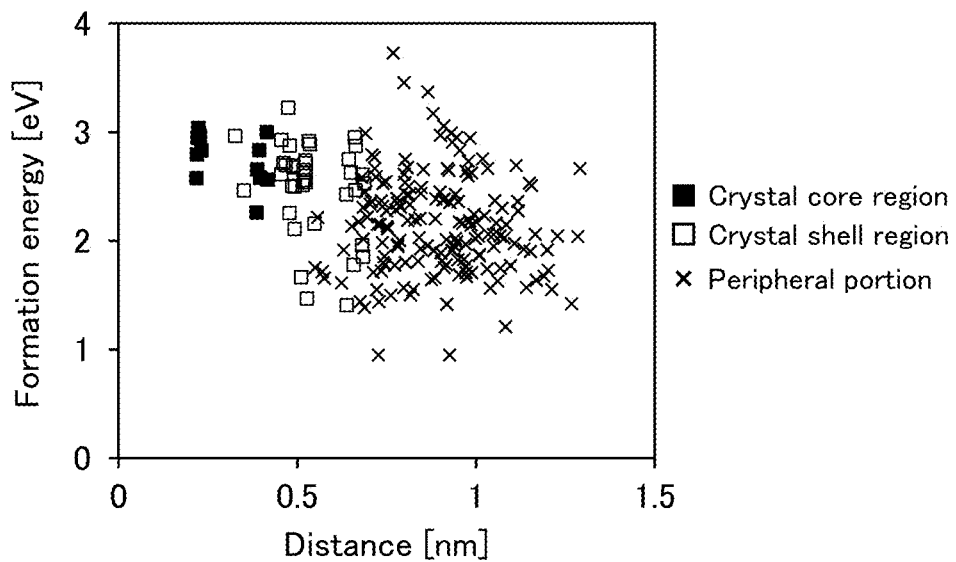
FIG. 5A and FIG. 5B are graphs illustrating formation energy of a defect.
Figure 5B:
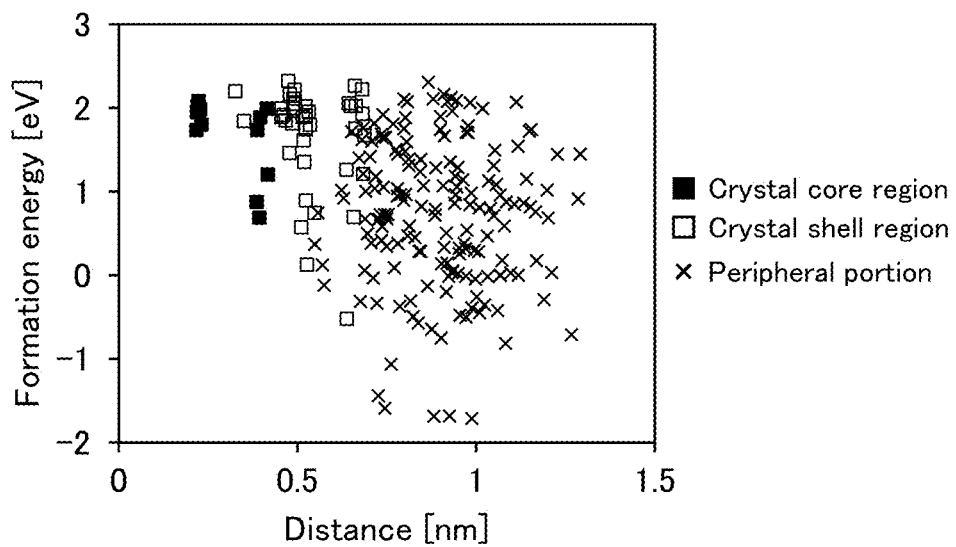

The formation energy of defects is calculated using E(defect) and E(no defect) calculated by the above method. FIG. 5A and FIG. 5B show the calculated formation energies of defects ($H_O$ and $V_O$). FIG. 5A shows formation energy for $H_O$ and FIG. 5B shows formation energy for $V_O$. In FIG. 5A and FIG. 5B, the vertical axis represents a distance [nm] from an In atom that exists at the center of the crystal region to a defect placed in the calculation model before calculation for optimizing the whole structure of the calculation model is performed, and the vertical axis represents formation energy [eV] of defects. Note that the plots of black squares in FIG. 5A and FIG. 5B show formation energy of a defect positioned in the crystal core region, the plots of white squares in FIG. 5A and FIG. 5B show formation energy of a defect positioned in the crystal shell region, the plots of cross marks in FIG. 5A and FIG. 5B show formation energy of a defect positioned in the peripheral portion.

As seen from FIG. 5A, the average value of formation energy of the $H_O$ positioned in the crystal core region, that of the $H_O$ positioned in the crystal shell region, and that of the $H_O$ positioned in the peripheral portion are 2.75 eV, 2.50 eV, and 2.15 eV, respectively. A variation in the formation energy of $H_O$ is larger and some $H_O$'s had smaller $H_O$ formation energy values in the crystal shell region than in the crystal core region. This is presumably because the structure is distorted in a region of the crystal region which is close to the interface between the crystal region and the peripheral portion.

It is also shown that the variation in the formation energy of $H_O$ is larger and more $H_O$'s have smaller $H_O$ formation energy values in the peripheral portion than in the crystal region (the crystal core region and the crystal shell region). This is presumably because fluctuation in bond length is greater and more oxygen atoms have weakened bonding strength with a metal atom in the peripheral portion having low crystallinity than in the crystal region.

According to FIG. 5A and FIG. 5B, the formation energy of a defect tends to decrease in the order of the crystal core region, the crystal shell region, and the peripheral portion.

According to FIG. 5B, in the peripheral portion, the farther from the crystal region $V_O$ is positioned, the lower the value of the formation energy for $V_O$ tends to be.

Accordingly, it is suggested that defect formation is inhibited even in a region with low crystallinity due to the existence of the crystal region. That is, intermediate regions where the structure is gradually changed are probably formed in the structure stabilization process.

The above suggests that defects ($V_O$ and $H_O$) are not easily formed in the crystal region and defects are easily formed in the region having low crystallinity (the above peripheral portion). Accordingly, the existence of the crystal region inhibits formation of defects. Therefore, the use of an nc film for a transistor can inhibit a variation in the electrical characteristics of the transistor.

The above is the description of ease of formation of defects in an nc film.

The size of the above-described region 11 in the case where the shape of the region 11 is a rectangle or a parallelogram is the length of a longer side of the rectangle or the parallelogram, for example. The size of the region 11 in the case where the shape of the region 11 is a polygon is the length of the longest diagonal line among diagonal lines of the polygon, for example. In the case where the metal oxide 10 is an In-M-Zn oxide, the region 11 tends to have a layered crystal structure. In that case, the size of the region 11 is, for example, the width (length) of the layer. Note that the size of the region 11 can be measured from, for example, an image observed with a transmission electron microscope (TEM).

For example, in a TEM image of the metal oxide 10, a boundary between the regions 11, i.e., a crystal grain boundary (grain boundary), cannot be clearly observed in some cases.

When the metal oxide 10 is subjected to structural analysis by an out-of-plane method with an XRD apparatus using an X-ray having a diameter larger than the size of the region 11, a peak that shows a crystal plane is not detected in some cases.

When the metal oxide 10 is subjected to electron diffraction (also referred to as selected-area electron diffraction) using an electron beam with a probe diameter (e.g., 50 nm or larger) that is larger than the size of the region 11, a diffraction pattern like a halo pattern is observed. In contrast, when the metal oxide 10 is subjected to electron diffraction (also referred to as nanobeam electron diffraction) using an electron beam with a probe diameter (e.g., greater than or equal to 1 nm and less than or equal to 30 nm) that is close to or smaller than the size of the region 11, a plurality of spots are observed in an annular region.

Figure 6:
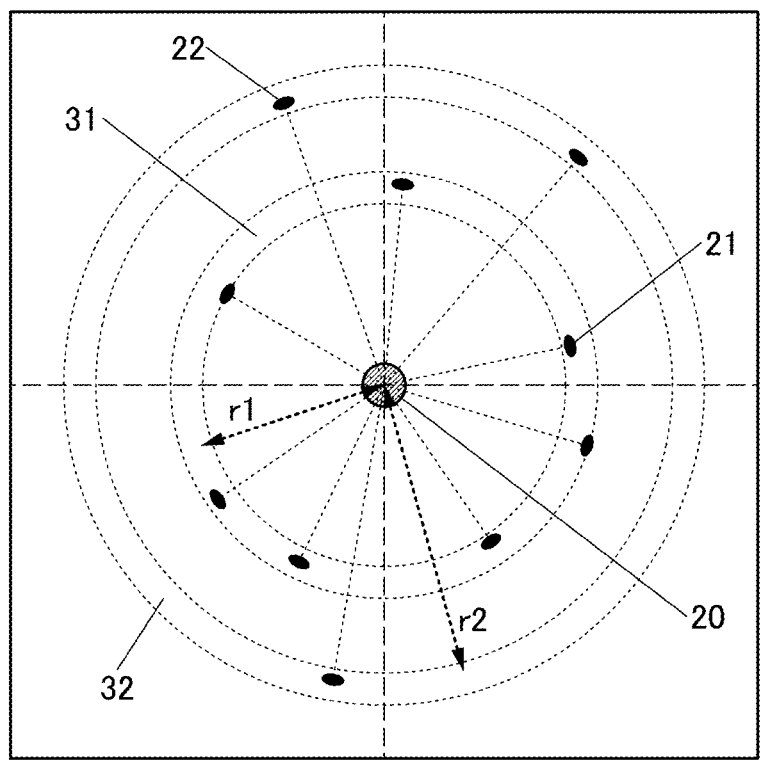
FIG. 6 is a schematic view of an electron diffraction pattern.

FIG. 6 is a schematic view of a diffraction pattern (also referred to as an electron diffraction pattern) of the metal oxide 10 observed by nanobeam electron diffraction. As seen from FIG. 6, a spot (a direct spot 20) of an incident electron beam passing through a sample, a spot 21, which is near the direct spot 20, and a spot 22, which is farther from the direct spot 20 than the spot 21, are observed in the electron diffraction pattern of the metal oxide 10.

The spot 21 is observed in an annular region 31 that is positioned at a distance r1, which is a distance r from the direct spot in the radius vector direction, and positioned in the vicinity thereof. The spot 22 is observed in a region 32 that is positioned at a distance r2, which is a distance r from the direct spot in the radius vector direction, and positioned in the vicinity thereof. The region 32 is positioned on the outer side of the region 31. That is, the distance r2 is larger than the distance r1.

In the electron diffraction pattern, the plurality of spots 21 are observed in the region 31. The positions of the spots 21 in the radius vector direction (specifically, the distances from the direct spot 20 to the spots 21) vary. Although not shown here, the detection intensities of the spots 21 also vary.

In the electron diffraction pattern, one or more of the spots 22 are observed in the region 32. Variations in the positions of the spots 22 in the radius vector direction are small as compared with the spots 21. Since being observed in a low crystallinity region, the number of spots 22 observed is smaller than the number of spots 21 observed in many cases. Furthermore, the detection intensity is also relatively small in some cases.

In the case where the metal oxide 10 is an In-M-Zn oxide, the region 31 corresponds to, for example, a region apart from the direct spot by a distance r in the radius vector direction ranging from 2.9 $nm^{-1}$ to 4.2 $nm^{-1}$ (an annular region positioned at a distance r1 of 3.4 $nm^{-1}$ and in the vicinity thereof). The region 32 corresponds to, for example, a region apart from the direct spot by a distance r in the radius vector direction ranging from 5.0 $nm^{-1}$ to 6.7 $nm^{-1}$ (an annular region positioned at a distance r2 of 6.0 $nm^{-1}$ and in the vicinity thereof).

In the case where the metal oxide 10 is an In-M-Zn oxide, the ratio of the distance r2 to the distance r1 is greater than or equal to 1.2 and less than or equal to 2.3, preferably greater than or equal to 1.5 and less than or equal to 1.8.

In the transistor, a metal oxide functioning as a semiconductor is preferably used for a semiconductor layer including a channel formation region. The metal oxide is preferable because a transistor including the metal oxide can have more favorable switching characteristics and extremely lower off-state current than a transistor including a semiconductor made of silicon or the like.

The metal oxide functioning as a semiconductor preferably has a band gap of 2 eV or more, further preferably 2.5 eV or more. With the use of a metal oxide having such a wide band gap, the off-state current of the transistor can be reduced.

The transistor using a metal oxide in its channel formation region has an extremely low leakage current (off-state current) in a non-conduction state; thus, a semiconductor device with low power consumption can be provided. The metal oxide can be deposited by a sputtering method or the like, and thus can be used for a transistor included in a highly integrated semiconductor device.

In the case where an oxide semiconductor is used for a channel formation region of a transistor, an i-type (intrinsic) or substantially i-type oxide semiconductor with a low carrier concentration is preferably used. When an oxide semiconductor with a low carrier concentration is used for a channel formation region of a transistor, the off-state current of the transistor can be kept low or the reliability of the transistor can be improved.

The metal oxide 10 can be used for a channel formation region of a transistor. With the use of the metal oxide 10 with highly stable physical properties for a channel formation region of a transistor, a transistor with high reliability can be provided.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like. Note that a crystal structure in which a clear grain boundary is observed is what is called polycrystal. It is highly probable that the grain boundary becomes a recombination center and traps carriers and thus decreases the on-state current and field-effect mobility of a transistor. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary more than an In oxide.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

As a non-single-crystal oxide semiconductor, a CAC (Cloud-Aligned Composite)-OS may be used. Note that the CAC-OS relates to the material composition.

[Structure of Metal Oxide]

A CAC-OS has a conducting function in part of the material and has an insulating function in another part of the material; as a whole, the CAC-OS has a function of a semiconductor. Note that in the case where the CAC-OS is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS. In the CAC-OS, separation of the functions can maximize both of the functions.

In addition, the CAC-OS includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Furthermore, in some cases, the conductive regions are observed to be coupled in a cloud-like manner with their boundaries blurred.

In the CAC-OS, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS is composed of components having different band gaps. For example, the CAC-OS is composed of a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS is used in a channel formation region of a transistor, the transistor in the on state can achieve high current driving capability, that is, high on-state current and high field-effect mobility.

In other words, the CAC-OS can also be referred to as a matrix composite or a metal matrix composite.

Oxide semiconductors might be classified in a manner different from the above-described one when classified in terms of the crystal structure. Here, the classification of the crystal structures of an oxide semiconductor is explained with FIG. 7A. FIG. 7A is a diagram showing the classification of crystal structures of an oxide semiconductor, typically IGZO (a metal oxide containing In, Ga, and Zn).

As shown in FIG. 7A, IGZO is roughly classified into "Amorphous", "Crystalline", and "Crystal". "Amorphous" includes "completely amorphous". "Crystalline" includes "CAAC", "nc", and "CAC". "Crystal" includes "single crystal" and "poly crystal".

Note that the structure within a thick frame in FIG. 7A is in a boundary region between "Amorphous" and "Crystal". In other words, Amorphous, which is energetically unstable, and Crystalline are completely different structures.

Note that a crystal structure of a film or a substrate can be evaluated with an X-ray diffraction (XRD) spectrum. Here, XRD spectra of quartz glass and IGZO, which has a crystal structure classified into "Crystalline" (also referred to as Crystalline IGZO), are shown in FIG. 7B and FIG. 7C. FIG. 7B shows an XRD spectrum of quartz glass and FIG. 7C shows an XRD spectrum of crystalline IGZO. Note that the composition of the crystalline IGZO shown in FIG. 7C is in the neighborhood of In:Ga:Zn=4:2:3 [atomic ratio]. Furthermore, the crystalline IGZO shown in FIG. 7C has a thickness of 500 nm.

As indicated by arrows in FIG. 7B, the XRD spectrum peak of the quartz glass is substantially bilaterally symmetrical. In contrast, as indicated by arrows in FIG. 7C, the XRD spectrum peak of the crystalline IGZO is bilaterally asymmetrical. The bilaterally asymmetry of the XRD spectrum peak clearly shows the existence of a crystal. In other words, the structure cannot be regarded as "Amorphous" unless the XRD spectrum peak is bilaterally symmetrical.

[Impurities]

Here, the influence of each impurity in the metal oxide will be described.

Entry of the impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Furthermore, when the channel formation region includes oxygen vacancies, the transistor tends to have normally-on characteristics (the channel exists even when no voltage is applied to the gate electrode and current flows through the transistor).

The electrical characteristics of the transistor using a metal oxide are likely to change to be normally-on characteristics due to impurities and oxygen vacancies in the metal oxide. In the case where the transistor is driven in a state where excess oxygen exceeding the proper amount is included in the metal oxide, the valence of the excess oxygen atoms is changed and the electrical characteristics of the transistor are changed, so that the reliability is decreased in some cases.

Thus, a metal oxide having a low carrier concentration is preferably used for the channel formation region of the transistor. In order to reduce the carrier concentration of the metal oxide, the concentration of impurities in the metal oxide is reduced so as to reduce the density of defect states. In this specification and the like, a state with a low impurity concentration and a low density of defect states is referred to as a highly purified intrinsic or substantially highly purified intrinsic state. Note that in this specification and the like, the case where the carrier concentration of the metal oxide in the channel formation region is lower than or equal to $1 \times 10^{16}$ cm$^{-3}$ is defined as a substantially highly purified intrinsic state.

The carrier concentration of the metal oxide in the channel formation region is preferably lower than or equal to $1\times10^{18}$ cm$^{-3}$, further preferably lower than or equal to $1\times10^{17}$ cm$^{-3}$, still further preferably lower than or equal to $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

As examples of the impurities in the metal oxide, hydrogen, nitrogen, alkali metal, alkaline earth metal, iron, nickel, silicon, and the like are given. In particular, hydrogen contained in the metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. Moreover, in the case where hydrogen enters an oxygen vacancy in the metal oxide, the oxygen vacancy and the hydrogen are bonded to each other to form $V_OH$ in some cases. In some cases, a defect in which hydrogen has entered an oxygen vacancy ($V_OH$) functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics. Moreover, hydrogen in a metal oxide is easily transferred by stress such as heat or an electric field; thus, a large amount of hydrogen in a metal oxide might reduce the reliability of the transistor.

In one embodiment of the present invention, $V_OH$ in the metal oxide is preferably reduced as much as possible so that the metal oxide becomes a highly purified intrinsic or substantially highly purified intrinsic metal oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen adding treatment) in order to obtain a metal oxide whose $V_OH$ is sufficiently reduced. When a metal oxide in which impurities such as $V_OH$ are sufficiently reduced is used for a channel formation region of a transistor, the transistor can have stable electrical characteristics.

A defect in which hydrogen has entered an oxygen vacancy ($V_OH$) can function as a donor of a metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases. In addition, "carrier concentration" in this specification and the like can be replaced with "carrier density".

Hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities such as hydrogen are sufficiently reduced is used for a channel formation region of a transistor, the transistor can have stable electrical characteristics.

The above defect states might include a trap state. Electric charges trapped by the trap states in the metal oxide take a long time to be released and may behave like fixed electric charges. Thus, a transistor whose channel formation region includes a metal oxide having a high density of trap states has unstable electrical characteristics in some cases.

If the impurities exist in the channel formation region of the oxide semiconductor, the crystallinity of the channel formation region might decrease, and the crystallinity of an oxide provided in contact with the channel formation region might decrease. Low crystallinity of the channel formation region tends to result in deterioration in stability or reliability of the transistor. Moreover, if the crystallinity of the oxide provided in contact with the channel formation region is low, an interface state might be formed and the stability or reliability of the transistor might deteriorate.

Therefore, the reduction in concentration of impurities in the channel formation region of the oxide semiconductor and the vicinity thereof is effective in improving the stability or reliability of the transistor. Examples of impurities include hydrogen, nitrogen, an alkali metal, an alkaline earth metal, iron, nickel, and silicon.

Specifically, the concentration of the above impurities obtained by SIMS is lower than or equal to $1\times10^{18}$ atoms/cm$^3$, preferably lower than or equal to $2\times10^{16}$ atoms/cm$^3$ in the channel formation region of the oxide semiconductor and the vicinity thereof. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the above impurities to the element M is lower than 0.10, preferably lower than 0.05 in the channel formation region of the oxide semiconductor and the vicinity thereof. Here, the concentration of the element M used in the calculation of the concentration ratio may be a concentration in a region that is the same as the region whose concertation of the impurities is calculated or may be a concentration in the oxide semiconductor.

A metal oxide with a low impurity concentration has a low density of defect states and thus has a low density of trap states in some cases.

In a transistor using an oxide semiconductor, when impurities and oxygen vacancies exist in a channel formation region in the oxide semiconductor, the resistance of the oxide semiconductor is sometimes reduced. In addition, the electrical characteristics are easily changed, which might decrease the reliability.

In a transistor in which an oxide semiconductor is used for a channel formation region, when a low-resistance region is formed in the channel formation region, leakage current (parasitic channel) between a source electrode and a drain electrode of the transistor is likely to be generated in the low-resistance region. Due to the parasitic channel, defects in transistor characteristics, such as normally-on of a transistor, an increase in leakage current, and a change (a shift) in threshold voltage caused by stress application, are likely to occur. Furthermore, when the processing accuracy of transistors is low, the parasitic channels vary between the transistors, so that variations in transistor characteristics occur.

Therefore, the impurities and oxygen vacancies are preferably reduced as much as possible in the channel formation region of the oxide semiconductor and in the vicinity thereof.

[Deposition Method of Metal Oxide Film]

A method of depositing a metal oxide film to be the metal oxide 10 is described below.

The metal oxide film to be the metal oxide 10 is preferably deposited by a sputtering method. The deposition by a sputtering method is suitable because the density of the metal oxide film can be increased.

The metal oxide film is preferably deposited at a temperature higher than or equal to room temperature and lower than 140° C. Note that room temperature includes not only the case where temperature control is not performed but also the case where temperature control is performed, e.g., the case where a substrate is cooled.

A simple rare gas (typically, argon), a simple oxygen gas, or a mixed gas of a rare gas and oxygen is used as a sputtering gas as appropriate. When such a mixed gas is used, the proportion of an oxygen gas in the whole mixed gas is higher than 0% and lower than or equal to 50%, preferably higher than or equal to 5% and lower than or equal to 30%, further preferably higher than or equal to 7% and lower than or equal to 20%. When oxygen is contained in the sputtering gas, oxygen vacancies in the metal oxide film are reduced and a film including a microcrystalline region can be formed. Furthermore, at the same time as the deposition of the metal oxide film, oxygen is added to a film under the metal oxide film, whereby an oxygen-excess region can be formed.

Moreover, increasing the purity of the sputtering gas is preferable. For example, as an oxygen gas or an argon gas used as the sputtering gas, a gas highly purified to have a dew point of −40° C. or lower, preferably −80° C. or lower, further preferably −100° C. or lower, still further preferably −120° C. or lower is used, whereby entry of moisture or the like into the metal oxide film can be prevented as much as possible.

A chamber of a sputtering apparatus is preferably evacuated to a high vacuum (to the degree of approximately $5\times10^{-7}$ Pa to $1\times10^{-4}$ Pa) with an adsorption vacuum pump such as a cryopump so that water and the like acting as impurities for the metal oxide film are removed as much as possible. Alternatively, a turbo molecular pump and a cold trap are preferably combined so as to prevent a backflow of a gas, especially a gas containing carbon or hydrogen from an exhaust system to the inside of the chamber.

As a power source of the sputtering apparatus, a DC power source, an AC power source, or an RF power source can be used.

In the sputtering apparatus, a target may be rotated or moved. For example, the magnet unit is oscillated vertically and/or horizontally during deposition of the metal oxide film, whereby the metal oxide of the present invention can be deposited. For example, the target may be rotated or oscillated with a beat (also referred to as rhythm, pulse, frequency, period, cycle, or the like) of greater than or equal to 0.1 Hz and less than or equal to 1 kHz. Alternatively, the magnet unit may be oscillated with a beat of greater than or equal to 0.1 Hz and less than or equal to 1 kHz.

As a sputtering target, an In-M-Zn metal oxide target (M is aluminum, gallium, yttrium, or tin) can be used. As the sputtering target, a target including a polycrystalline oxide containing a plurality of crystal grains are preferably used.

For example, the metal oxide film can be deposited in such a manner that a mixed gas of a rare gas and oxygen with the proportion of the oxygen gas of approximately 10% is used as the sputtering gas, the substrate temperature is 130° C., and an In—Ga—Zn metal oxide target is used.

Note that the metal oxide film can also be deposited by a pulsed laser deposition (PLD) method. In that case, the deposition can be performed using a metal oxide target as in the above-described method. As the metal oxide target, a material similar to the above-described material can be used.

The metal oxide film can also be formed by a liquid phase method using a liquid material. For example, the metal oxide can be formed in such a manner that a material is applied to the substrate by a spin coating method, a spray method, or the like, and then heat treatment is performed. The liquid phase method has a feature in that a crystal part having orientation is less likely to be formed in the film even when heat treatment is performed.

For example, in the case where an In-M-Zn metal oxide film is formed, a coating agent containing an indium oxide, an oxide of the element M, and a zinc oxide is applied to the substrate, and heat treatment is then performed at a temperature, for example, higher than or equal to 300° C., higher than or equal to 400° C., or higher than or equal to 450° C. and lower than or equal to the upper temperature limit of the substrate, whereby the In-M-Zn metal oxide film can be formed.

Here, as the coating agent, a material in which In, the element M, and Zn are mixed such that the content ratio of In is high can be used. The composition may be similar to that of the material that can be used as the above-mentioned metal oxide target.

Note that a method for forming the metal oxide film is not limited to the above. Any of the other film formation methods such as a plasma-enhanced chemical vapor deposition (PECVD) method, a thermal CVD (Chemical Vapor Deposition) method, an atomic layer deposition (ALD) method, and a vacuum evaporation method may be employed. As examples of a thermal CVD method, an MOCVD (Metal Organic Chemical Vapor Deposition) method and the like can be given.

In particular, in the case where a physical deposition method such as a sputtering method or a pulsed laser deposition method is used, elements which are contained in a film of a formation surface and which hinder crystallization of a metal oxide film might be diffused in the metal oxide film. As a result, a metal oxide film having crystallinity distribution in the film thickness direction is formed in some cases.

The above is the description of the method of depositing a metal oxide film to be the metal oxide 10.

In the above manner, a novel metal oxide can be provided. In addition, a transistor having high reliability can be provided. According to one embodiment of the present invention, a semiconductor device with low power consumption can be provided.

The structure, method, and the like described above in this embodiment can be used in an appropriate combination with structures, methods, and the like described in the other embodiments.

Embodiment 2

In this embodiment, a structure example of a semiconductor device using a metal oxide of one embodiment of the present invention will be described. A transistor will be described below as an example.

Structure Example 1

Structure Example 1-1

Figure 8A:
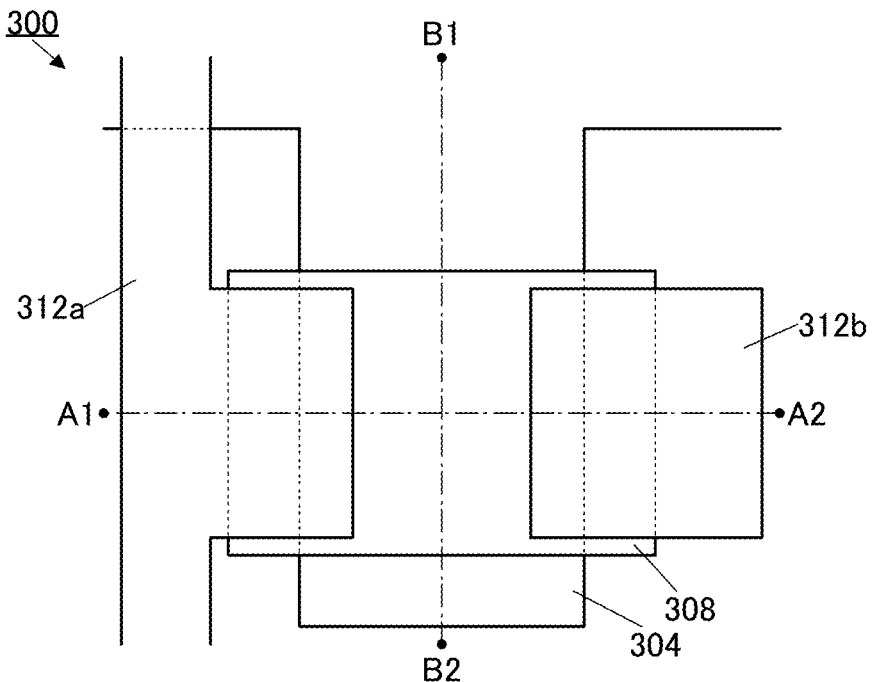
FIG. 8A is a top view of a semiconductor device.
Figure 8B:
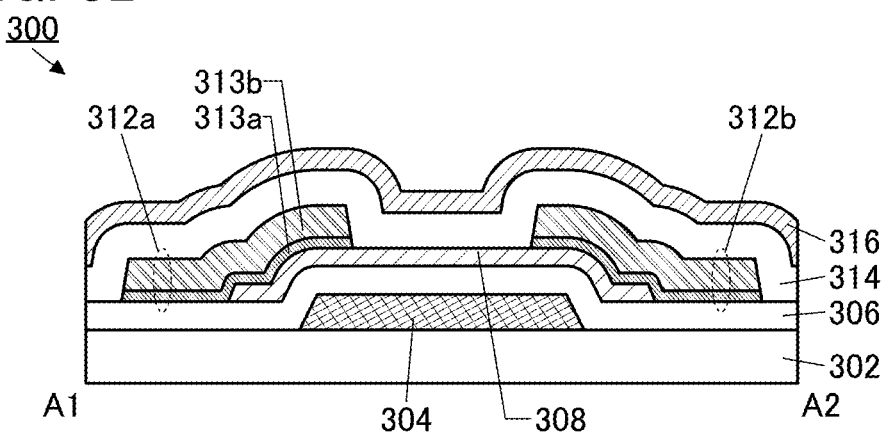
FIG. 8B and FIG. 8C are cross-sectional views of the semiconductor device.
Figure 8C:
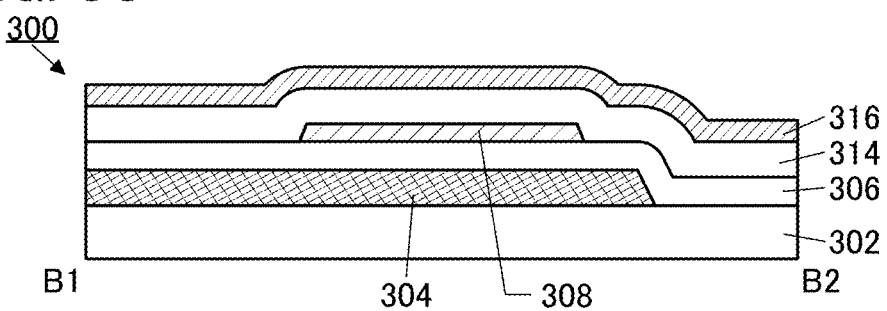

FIG. 8A is a top view of a transistor 300, FIG. 8B corresponds to a cross-sectional view of a cut plane taken along a dashed-dotted line A1-A2 in FIG. 8A, and FIG. 8C corresponds to a cross-sectional view of a cut plane taken along a dashed-dotted line B1-B2 in FIG. 8A. The direction of the dashed-dotted line A1-A2 corresponds to a channel length direction, and the direction of the dashed-dotted line B1-B2 corresponds to a channel width direction. Note that in FIG. 8A, some components of the transistor 300 (a gate insulating layer and the like) are not illustrated. Furthermore, some components are not illustrated in top views of transistors in the following drawings, as in FIG. 8A.

The transistor 300 is provided over a substrate 302 and includes a conductive layer 304, an insulating layer 306, a semiconductor layer 308, a conductive layer 312a, a conductive layer 312b, and the like. The insulating layer 306 is provided to cover the conductive layer 304. The semiconductor layer 308 has an island-like shape and is provided over the insulating layer 306. The conductive layer 312a and the conductive layer 312b are each in contact with a top surface of the semiconductor layer 308 and are apart from each other over the semiconductor layer 308. In addition, an insulating layer 314 is provided to cover the insulating layer 306, the conductive layer 312a, the conductive layer 312b, and the semiconductor layer 308, and an insulating layer 316 is provided over the insulating layer 314.

The metal oxide described in Embodiment 1 can be used for the semiconductor layer 308.

Although there is no particular limitation on a material and the like of the substrate 302, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 302. Alternatively, any of these substrates on which a semiconductor element is provided may be used as the substrate 302.

A flexible substrate may be used as the substrate 302 and the semiconductor device may be formed directly on the flexible substrate. A separation layer may be provided between the substrate 302 and the semiconductor device. The separation layer can be used when part or the whole of a semiconductor device completed thereover is separated from the substrate 302 and transferred onto another substrate. In that case, the semiconductor device can be transferred to even a substrate having low heat resistance or a flexible substrate.

The conductive layer 304 functions as a gate electrode. Part of the insulating layer 306 functions as a gate insulating layer. The conductive layer 312a functions as one of a source electrode and a drain electrode, and the conductive layer 312b functions as the other of the source electrode and the drain electrode. A region of the semiconductor layer 308 that overlaps with the conductive layer 304 functions as a channel formation region. The transistor 300 is what is called a bottom-gate transistor, in which the gate electrode is provided more on the formation surface side than the semiconductor layer 308. Here, a side of the semiconductor layer 308 opposite to the conductive layer 304 side is sometimes referred to as a back channel side. The transistor 300 has what is called a channel-etched structure in which no protection layer is provided between the back channel side of the semiconductor layer 308 and the source and drain electrodes.

The semiconductor layer 308 may have a stacked-layer structure of two or more layers. At this time, the semiconductor film included in the semiconductor layer 308 preferably contains a metal oxide. In the case where the semiconductor layer 308 has a two-layer structure, the semiconductor film positioned on the back channel side preferably has higher crystallinity than the semiconductor film positioned on the conductive layer 304 side. With this structure, the semiconductor layer 308 can be prevented from being partly etched and lost at the time of processing of the conductive layer 312a and the conductive layer 312b.

The semiconductor layer 308 preferably contains indium, M (M is one kind or a plurality of kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. It is particularly preferable that aluminum, gallium, yttrium, or tin may be used as the element M.

It is particularly preferable to use an oxide containing indium, gallium, and zinc for the semiconductor layer 308.

The conductive layer 312a and the conductive layer 312b each have a stacked-layer structure in which a conductive layer 313a and a conductive layer 313b are stacked in this order from the formation surface side.

The conductive layer 313b is preferably formed using a low-resistance conductive material containing copper, silver, gold, aluminum, or the like. It is particularly preferable that the conductive layer 313b contain copper or aluminum. In that case, the conductive layer 312a and the conductive layer 312b can have extremely low resistance.

For the conductive layer 313a, a conductive material different from that for the conductive layer 313b can be used. For example, for the conductive layer 313a, a conductive material containing titanium, tungsten, molybdenum, chromium, tantalum, zinc, indium, platinum, ruthenium, or the like is preferably used.

When the conductive layer 313a is provided between the conductive layer 313b containing copper, aluminum, or the like and the semiconductor layer 308 as described above, the metal element contained in the conductive layer 313b can be prevented from diffusing into the semiconductor layer 308; thus, the transistor 300 can have high reliability. The conductive layer 313a preferably functions as a barrier layer that prevents diffusion of oxygen in the semiconductor layer 308 to the conductive layer 313b.

Note that the structures of the conductive layer 312a and the conductive layer 312b are not limited to a two-layer structure and may be a three-layer structure or a four-layer structure including a conductive layer containing copper, silver, gold, or aluminum. For example, for the conductive layer 312a and the conductive layer 312b, a three-layer structure in which a conductive layer containing the same conductive material as the conductive layer 313a is stacked over the conductive layer 313b may be employed. Accordingly, oxidation of a top surface of the conductive layer 313b can be prevented and the metal element contained in the conductive layer 313b can be prevented from scattering into the surrounding, whereby a highly reliable transistor can be achieved.

For the conductive layer 304, any of the above conductive materials that can be used for the conductive layer 313a or the conductive layer 313b can be used as appropriate. The use of a conductive material containing copper is particularly preferable.

For the insulating layer 306 and the insulating layer 314 that are in contact with the semiconductor layer 308, an insulating material containing an oxide is preferably used. In the case where the insulating layer 306 or the insulating layer 314 has a stacked-layer structure, an insulating material containing an oxide is used for a layer in contact with the semiconductor layer 308.

For the insulating layer 306, a nitride insulating film of a silicon nitride, an aluminum nitride, or the like may be used. In the case where an insulating material containing no oxide is used, treatment of adding oxygen to an upper portion of the insulating layer 306 is preferably performed to form an oxygen-containing region. Examples of the treatment of adding oxygen include heat treatment or plasma treatment in an oxygen-containing atmosphere, and an ion doping treatment.

The insulating layer 316 functions as a protection layer protecting the transistor 300. For the insulating layer 316, an inorganic insulating material such as a silicon nitride, a silicon nitride oxide, a silicon oxide, a silicon oxynitride, an aluminum oxide, or an aluminum nitride can be used. It is particularly preferable that a material less likely to diffuse oxygen, such as a silicon nitride or an aluminum oxide, be used for the insulating layer 316, in which case release of oxygen from the semiconductor layer 308 or the insulating layer 314 to the outside through the insulating layer 316 due to heat applied during the fabrication process or the like can be prevented.

For the insulating layer 316, an organic insulating material functioning as a planarization film may be used. Alternatively, a stacked-layer film that includes a film containing an inorganic insulating material and a film containing an organic insulating material may be used as the insulating layer 316.

In the semiconductor layer 308, a pair of low-resistance regions, which are positioned in portions in contact with the conductive layer 312a and the conductive layer 312b and in the vicinity thereof and function as a source region and a drain region, may be formed. The regions are part of the semiconductor layer 308 and have lower resistance than the channel formation region. The low-resistance regions can also be referred to as regions with high carrier concentration, n-type regions, or the like. In the semiconductor layer 308, a region that is sandwiched between the pair of low-resistance regions and overlaps with the conductive layer 304 functions as a channel formation region.

Structure Example 1-2

A structure example of a transistor whose structure is partly different from that of Structure example 1-1 is described below. Note that description of the same portions as those in Structure example 1-1 is omitted below in some cases.

Figure 9A:
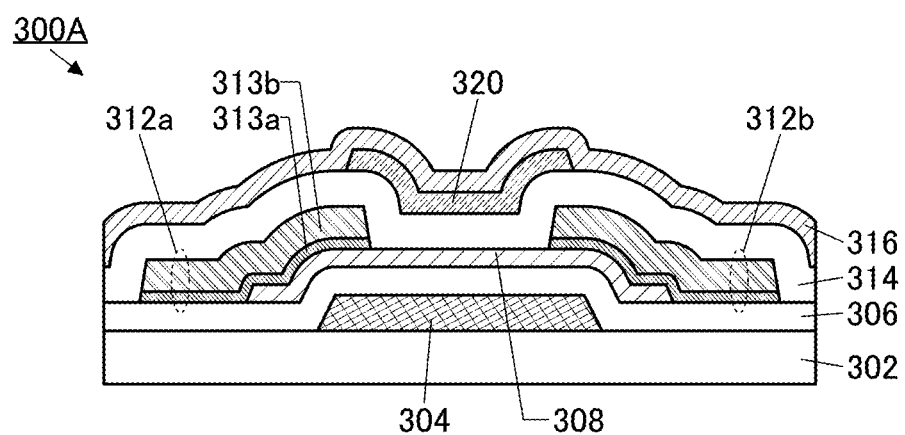
FIG. 9A and FIG. 9B are cross-sectional views of a semiconductor device.
Figure 9B:
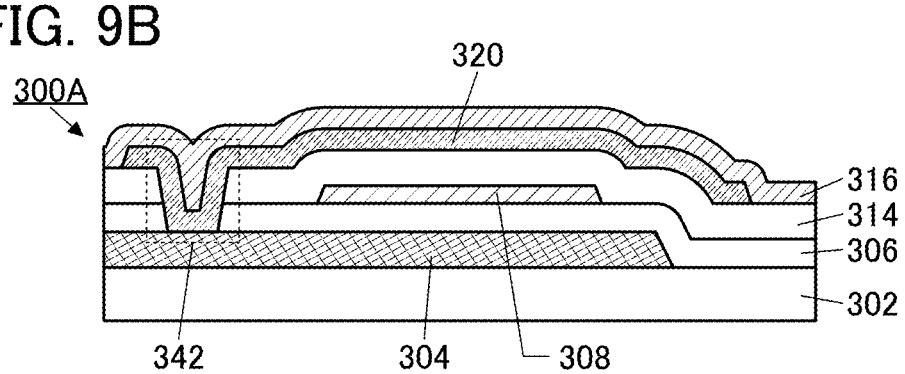

FIG. 9A is a cross-sectional view of a transistor 300A in the channel length direction and FIG. 9B is a cross-sectional view of the transistor in the channel width direction.

The transistor 300A is different from Structure example 1-1 mainly in that a conductive layer 320 is provided over the insulating layer 314.

The conductive layer 320 includes a region overlapping with the semiconductor layer 308 with the insulating layer 314 positioned therebetween.

In the transistor 300A, the conductive layer 304 has a function of a first gate electrode (also referred to as a bottom gate electrode), and the conductive layer 320 has a function of a second gate electrode (also referred to as a top gate electrode). Part of the insulating layer 314 functions as a second gate insulating layer.

As illustrated in FIG. 9B, the conductive layer 320 may be electrically connected to the conductive layer 304 through an opening 342 provided in the insulating layer 314 and the insulating layer 306. In this way, the same potential can be supplied to the conductive layer 320 and the conductive layer 304, which enables a transistor having high on-state current to be provided.

As illustrated in FIG. 9B, the conductive layer 304 and the conductive layer 320 preferably extend beyond the end portion of the semiconductor layer 308 in the channel width direction. In that case, as illustrated in FIG. 9B, the semiconductor layer 308 in the channel width direction is entirely surrounded by the conductive layer 304 and the conductive layer 320.

With such a structure, the semiconductor layer 308 can be electrically surrounded by electric fields generated by the pair of gate electrodes. In that case, it is particularly preferable that the same potential be supplied to the conductive layer 304 and the conductive layer 320. In that case, electric fields for inducing a channel can be effectively applied to the semiconductor layer 308, whereby the on-state current of the transistor 300A can be increased. Thus, the transistor 300A can also be miniaturized.

Note that a structure in which the conductive layer 304 and the conductive layer 320 are not connected to each other may be employed. In that case, a constant potential may be applied to one of the pair of gate electrodes, and a signal for driving the transistor 300A may be applied to the other. In this case, the potential applied to one of the electrodes can control the threshold voltage at the time of driving the transistor 300A with the other electrode.

Alternatively, the conductive layer 320 may be electrically connected to any one of the conductive layer 312a and the conductive layer 312b. In particular, it is preferable to electrically connect the conductive layer 320 to either the conductive layer 312a or the conductive layer 312b, whichever is a conductive layer (e.g., the source electrode) supplied with a constant potential.

The above is the description of Structure example 1.

Structure Example 2

A structure example of a transistor that is different from the above structure example 1 is described below.

Structure Example 2-1

Figure 10A:
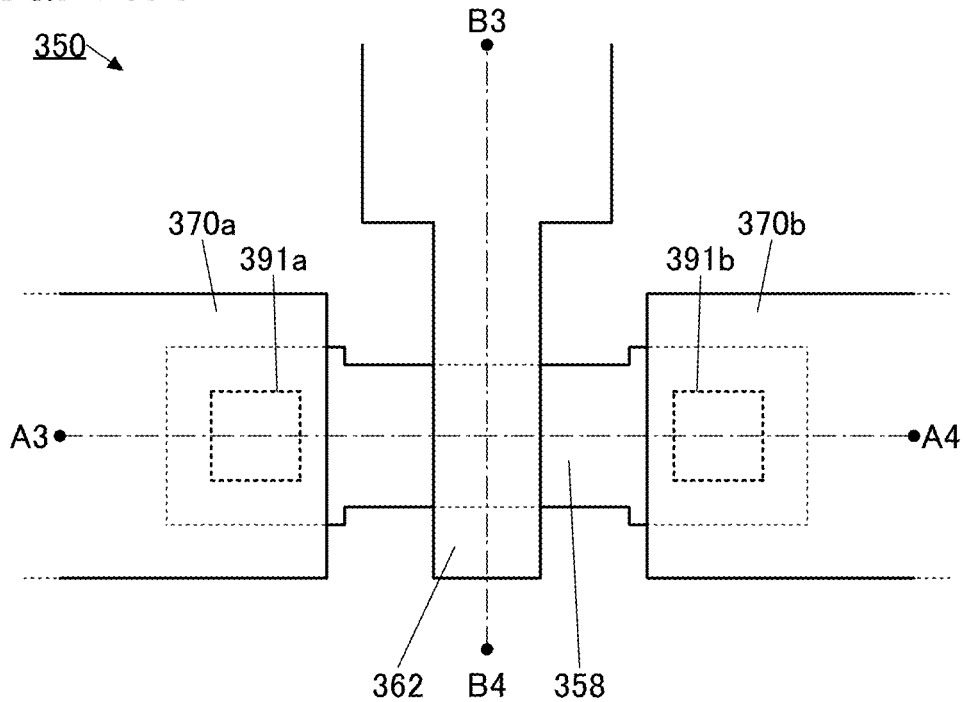
FIG. 10A is a top view of a semiconductor device.
Figure 10B:
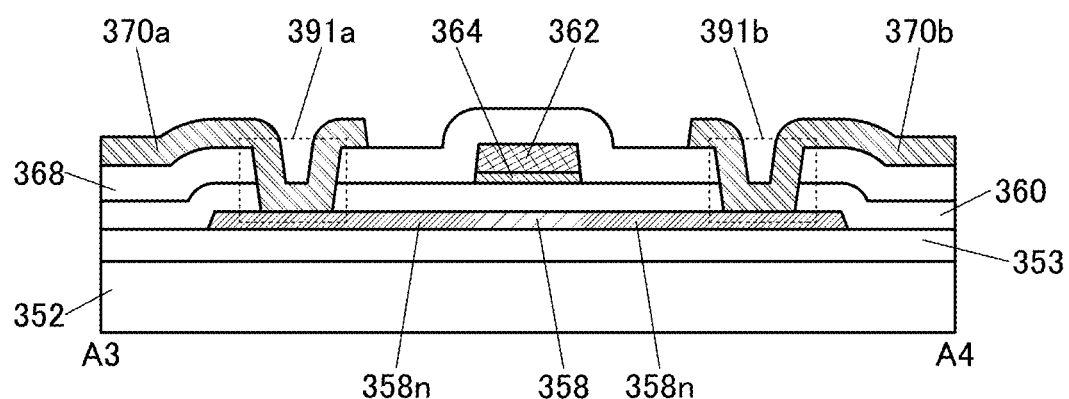
FIG. 10B and FIG. 10C are cross-sectional views of the semiconductor device.
Figure 10C:
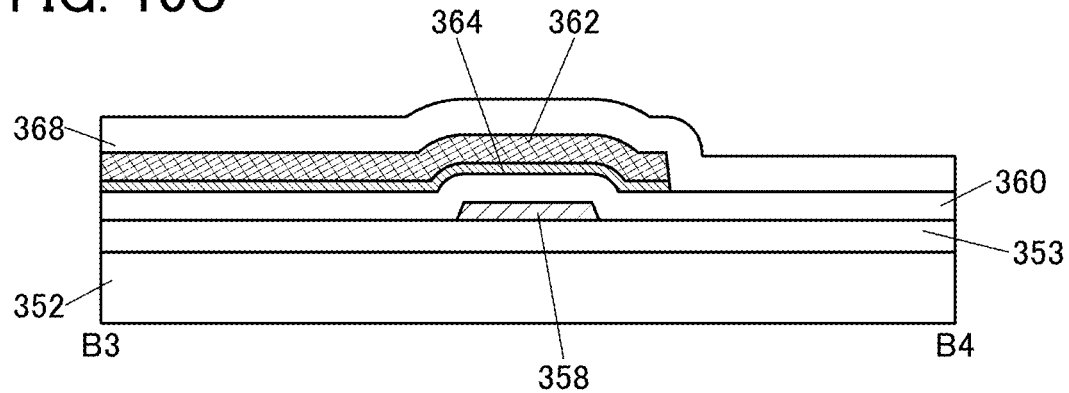

FIG. 10A is a top view of a transistor 350, FIG. 10B corresponds to a cross-sectional view of a cut plane along the dashed-dotted line A3-A4 shown in FIG. 10A, and FIG. 10C corresponds to a cross-sectional view of a cut plane along the dashed-dotted line B3-B4 shown in FIG. 10A. The direction of the dashed-dotted line A3-A4 corresponds to a channel length direction, and the direction of the dashed-dotted line B3-B4 corresponds to a channel width direction.

The transistor 350 is provided over a substrate 352 and includes an insulating layer 353, a semiconductor layer 358, an insulating layer 360, a metal oxide layer 364, a conductive layer 362, an insulating layer 368, and the like. The semiconductor layer 358 having an island shape is provided over the insulating layer 353. The insulating layer 360 is provided in contact with a top surface of the insulating layer 353 and a top surface and a side surface of the semiconductor layer 358. The metal oxide layer 364 and the conductive layer 362 are provided to be stacked in this order over the insulating layer 360 and each include a portion overlapping with the semiconductor layer 358. The insulating layer 368 is provided to cover a top surface of the insulating layer 360, a side surface of the metal oxide layer 364, and a top surface and a side surface of the conductive layer 362.

The metal oxide described in Embodiment 1 can be used for the semiconductor layer 358.

As illustrated in FIG. 10A and FIG. 10B, the transistor 350 may include a conductive layer 370a and a conductive layer 370b over the insulating layer 368. The conductive layer 370a and the conductive layer 370b function as a source electrode and a drain electrode. The conductive layer 370a and the conductive layer 370b are electrically connected to a low-resistance region 358n respectively through an opening 391a and an opening 391b formed in the insulating layer 368 and the insulating layer 360.

Part of the conductive layer 362 functions as a gate electrode. Part of the insulating layer 360 functions as a gate insulating layer. The transistor 350 is what is called a top-gate transistor, in which the gate electrode is provided over the semiconductor layer 358.

The conductive layer 362 and the metal oxide layer 364 are processed to have substantially the same top surface shapes.

Note that in this specification and the like, the expression "having substantially the same top surface shapes" means that at least outlines of stacked layers partly overlap with each other. For example, the case of processing an upper layer and a lower layer with the use of the same mask pattern or mask patterns that are partly the same is included. However, in some cases, the outlines do not exactly overlap with each other and the outline of the upper layer is located on an inner side of the outline of the lower layer or the outline of the upper layer is located on an outer side of the outline of the lower layer; such a case is also represented by the expression "having substantially the same top surface shapes."

The metal oxide layer 364 positioned between the insulating layer 360 and the conductive layer 362 functions as a barrier film that prevents diffusion of oxygen contained in the insulating layer 360 into a conductive layer 362 side. Furthermore, the metal oxide layer 364 also functions as a barrier film that prevents diffusion of hydrogen and water contained in the conductive layer 362 into an insulating layer 360 side. For the metal oxide layer 364, a material that is less likely to transmit oxygen and hydrogen than at least the insulating layer 360 can be used, for example.

Even in the case where a metal material that is likely to absorb oxygen, such as aluminum or copper, is used for the conductive layer 362, the metal oxide layer 364 can prevent diffusion of oxygen from the insulating layer 360 into the conductive layer 362. Furthermore, even in the case where the conductive layer 362 contains hydrogen, diffusion of hydrogen from the conductive layer 362 to the semiconductor layer 358 through the insulating layer 360 can be prevented. Consequently, carrier concentration of the semiconductor layer 358 in a channel formation region can be extremely low.

For the metal oxide layer 364, an insulating material or a conductive material can be used. When the metal oxide layer 364 has insulating properties, the metal oxide layer 364 functions as part of the gate insulating layer. By contrast, when the metal oxide layer 364 has conductivity, the metal oxide layer 364 functions as part of the gate electrode.

An insulating material having a higher permittivity than silicon oxide is preferably used for the metal oxide layer 364. It is particularly preferable to use an aluminum oxide film, a hafnium oxide film, a hafnium aluminate film, or the like because drive voltage can be reduced.

For the metal oxide layer 364, a conductive oxide such as indium oxide, indium tin oxide (ITO), or indium tin oxide containing silicon (ITSO) can also be used, for example. A conductive oxide containing indium is particularly preferable because of its high conductivity.

For the metal oxide layer 364, an oxide material containing one or more of the same elements as those of the semiconductor layer 358 is preferably used. It is particularly preferable to use an oxide semiconductor material that can be used for the semiconductor layer 358. Here, a metal oxide film formed using the same sputtering target as that for the semiconductor layer 358 is preferably applied to the metal oxide layer 364 because an apparatus can be shared.

In addition, the metal oxide layer 364 is preferably formed with a sputtering apparatus. For example, in the case where an oxide film is formed with a sputtering apparatus, forming the oxide film in an atmosphere containing an oxygen gas can suitably supply oxygen into the insulating layer 360 or the semiconductor layer 358.

The semiconductor layer 358 includes a region overlapping with the conductive layer 362 and a pair of low-resistance regions 358n between which the region is sandwiched. A region of the semiconductor layer 358 that overlaps with the conductive layer 362 functions as a channel formation region of the transistor 350. Meanwhile, the low-resistance region 358n functions as a source region or a drain region of the transistor 350.

The low-resistance region 358n can be regarded as a region having lower resistance than the channel formation region, a region having a higher carrier concentration than the channel formation region, a region having a higher oxygen defect density than the channel formation region, a region having a higher impurity concentration than the channel formation region, or an n-type region.

The low-resistance region 358n of the semiconductor layer 358 is a region containing an impurity element. Examples of the impurity element are hydrogen, boron, carbon, nitrogen, fluorine, phosphorus, sulfur, arsenic, aluminum, a rare gas, and the like. Note that typical examples of a rare gas include helium, neon, argon, krypton, xenon, and the like. In particular, boron or phosphorus is preferably contained. Furthermore, two or more of these elements may be contained.

Treatment of adding an impurity to the low-resistance region 358n can be performed through the insulating layer 360 with the use of the conductive layer 362 as a mask. As the treatment of adding an impurity to the low-resistance regions 358n, a plasma ion doping method or an ion implantation method can be suitably used.

The low-resistance region 358n preferably includes a region whose impurity concentration is higher than or equal to $1\times10^{19}$ atoms/cm$^3$ and lower than or equal to $1\times10^{23}$ atoms/cm$^3$, preferably higher than or equal to $5\times10^{19}$ atoms/cm$^3$ and lower than or equal to $5\times10^{22}$ atoms/cm$^3$, and further preferably higher than or equal to $1\times10^{20}$ atoms/cm$^3$ and lower than or equal to $1\times10^{22}$ atoms/cm$^3$.

The concentrations of the impurity contained in the low-resistance region 358n can be analyzed by an analysis method such as SIMS or X-ray photoelectron spectroscopy (XPS), for example. In the case of using XPS analysis, it is possible to find out concentration distribution in the depth direction by the combination of XPS analysis and ion sputtering from a front surface side or a rear surface side.

In addition, the impurity element preferably exists in an oxidized state in the low-resistance region 358n. For example, it is preferable to use an element that is easily oxidized, such as boron, phosphorus, magnesium, aluminum, or silicon, as the impurity element. Such an element that is easily oxidized can exist stably in a state of being bonded to oxygen in the semiconductor layer 358 to be oxidized and thus can be inhibited from being released even when a high temperature (e.g., higher than or equal to 400° C., higher than or equal to 600° C., or higher than or equal to 800° C.) is applied in a later step. Furthermore, when the impurity element takes oxygen in the semiconductor layer 358 away, many oxygen vacancies are generated in the low-resistance region 358n. The oxygen vacancies are bonded to hydrogen in the film to serve as carrier supply sources; thus, the low-resistance region 358n is in an extremely low-resistance state.

For example, in the case where boron is used as the impurity element, boron contained in the low-resistance region 358n can exist in a state of being bonded to oxygen. This can be confirmed when a spectrum peak attributed to a $B_2O_3$ bond is observed in XPS analysis. Furthermore, in XPS analysis, the intensity of a spectrum peak attributed to a state where a boron element exists alone is so low that the spectrum peak is not observed or is buried in background noise at the measurement lower limit.

The insulating layer 360 includes a region in contact with the channel formation region of the semiconductor layer 358, i.e., a region overlapping with the conductive layer 362. The insulating layer 360 includes a region that is in contact with the low-resistance region 358n of the semiconductor layer 358 and does not overlap with the conductive layer 362.

In some cases, a region of the insulating layer 360, which overlaps with the low-resistance region 358n, contains the above impurity element. In this case, as in the low-resistance region 358n, the impurity element in the insulating layer 360 also preferably exists in a state of being bonded to oxygen. Since such an element that is easily oxidized can exist stably in a state of being bonded to oxygen in the insulating layer 360 to be oxidized, the element can be inhibited from being released even when a high temperature is applied in a later step. Furthermore, particularly in the case where oxygen (also referred to as excess oxygen) that might be released by heating is included in the insulating layer 360, the excess oxygen and the impurity element are bonded to each other and stabilized, so that oxygen can be inhibited from being supplied from the insulating layer 360 to the low-resistance region 358n. Furthermore, since oxygen is less likely to be diffused in part of the insulating layer 360 containing the oxidized impurity element, it is possible to prevent an increase in the resistance of the low-resistance region 358n which might be caused by supply of oxygen to the low-resistance region 358n from components above the insulating layer 360 through the insulating layer 360.

The insulating layer 368 functions as a protection layer protecting the transistor 350. For example, an inorganic insulating material such as an oxide or a nitride can be used for the insulating layer 368. More specifically, for example, an inorganic insulating material such as a silicon oxide, a silicon oxynitride, a silicon nitride, a silicon nitride oxide, an aluminum oxide, an aluminum oxynitride, an aluminum nitride, a hafnium oxide, or a hafnium aluminate can be used.

Structure Example 2-2

Figure 11A:
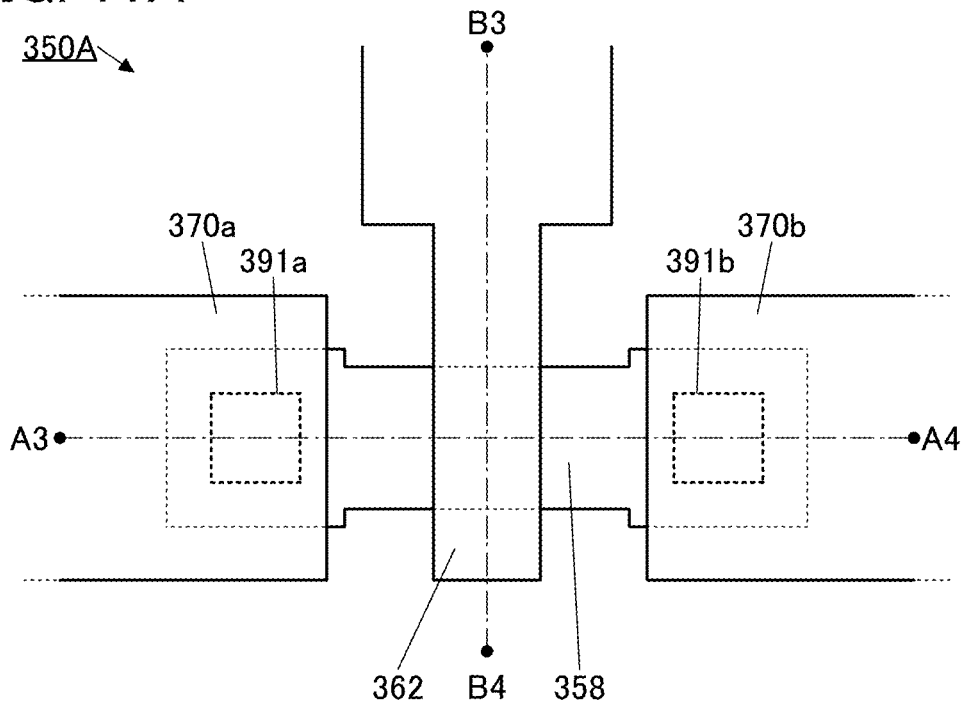
FIG. 11A is a top view of a semiconductor device.
Figure 11B:
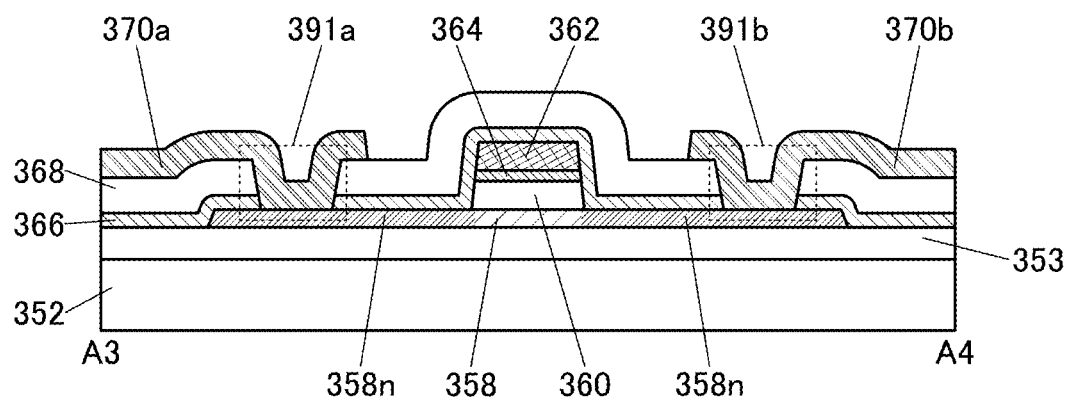
FIG. 11B and FIG. 11C are cross-sectional views of the semiconductor device.
Figure 11C:
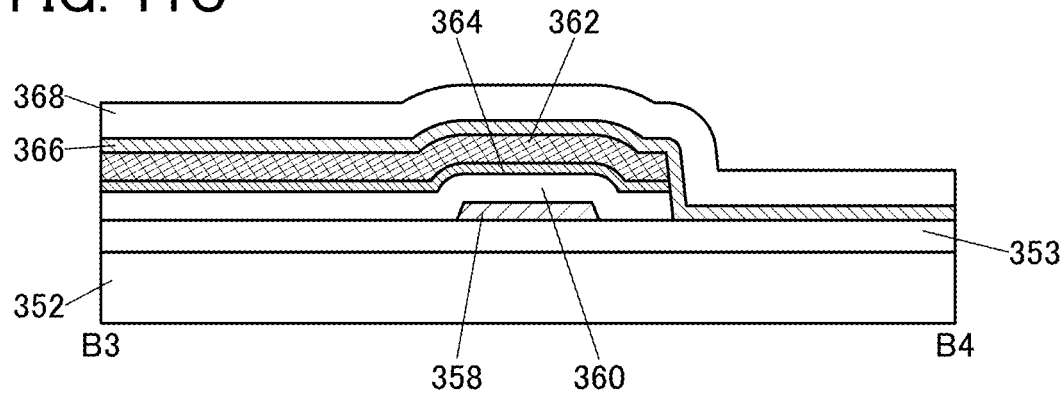

FIG. 11A is a top view of a transistor 350A, FIG. 11B is a cross-sectional view of the transistor 350A in the channel length direction, and FIG. 11C is a cross-sectional view of the transistor 350A in the channel width direction.

The transistor 350A is different from the transistor 350 described in Structure Example 2-1 mainly in the structure of the insulating layer 360 and the existence of an insulating layer 366.

The insulating layer 360 is processed so as to have a top surface shape substantially the same as the top surface shapes of the conductive layer 362 and the metal oxide layer 364. The insulating layer 360 can be formed with the use of a resist mask for processing the conductive layer 362 and the metal oxide layer 364, for example.

The insulating layer 366 is provided in contact with a top surface and a side surface of the semiconductor layer 358 which are not covered with the conductive layer 362, the metal oxide layer 364, and the insulating layer 360. The insulating layer 366 is provided to cover a top surface of the insulating layer 353, a side surface of the insulating layer 360, a side surface of the metal oxide layer 364, and a top surface and a side surface of the conductive layer 362.

The insulating layer 366 has a function of reducing the resistance of the low-resistance region 358n. As the insulating layer 366, an insulating film that can supply impurities to the low-resistance region 358n by being heated at the time of or after the deposition of the insulating layer 366 can be used. Alternatively, an insulating film that can generate oxygen vacancies in the low-resistance region 358n by being heated at the time of or after the deposition of the insulating layer 366 can be used.

For example, as the insulating layer 366, an insulating film functioning as a supply source that supplies impurities to the low-resistance region 358n can be used. In that case, the insulating layer 366 is preferably a film that release hydrogen by being heated. When such the insulating layer 366 is formed in contact with the semiconductor layer 358, impurities such as hydrogen can be supplied to the low-resistance region 358n, so that the resistance of the low-resistance region 358n can be reduced.

The insulating layer 366 is preferably a film deposited using a gas containing an impurity element such as a hydrogen element as a deposition gas used for the deposition. In addition, by increasing the deposition temperature of the insulating layer 366, a large number of impurities can be effectively supplied to the semiconductor layer 358. The deposition temperature of the insulating layer 366 is higher than or equal to 200° C. and lower than or equal to 500° C., preferably higher than or equal to 220° C. and lower than or equal to 450° C., further preferably higher than or equal to 250° C. and lower than or equal to 400° C., for example.

When the insulating layer 366 is deposited under a reduced pressure while heating is performed, release of oxygen from the region to be the low-resistance region 358n in the semiconductor layer 358 can be promoted. When an impurity such as hydrogen is supplied to the semiconductor layer 358 where many oxygen vacancies are formed, the carrier concentration of the low-resistance region 358n is increased, and the resistance of the low-resistance region 358n can be lowered more effectively.

For the insulating layer 366, for example, an insulating film containing a nitride, such as a silicon nitride, a silicon nitride oxide, a silicon oxynitride, an aluminum nitride, or an aluminum nitride oxide can be favorably used. In particular, because of having a blocking property against hydrogen and oxygen, a silicon nitride can prevent both diffusion of hydrogen from the outside into the semiconductor layer and release of oxygen from the semiconductor layer to the outside, and thus a highly reliable transistor can be achieved.

The insulating layer 366 may be an insulating film having a function of absorbing oxygen in the semiconductor layer 358 and generating oxygen vacancies. In particular, a metal nitride is preferably used for the insulating layer 366.

In the case of using a metal nitride, it is preferable to use a nitride of aluminum, titanium, tantalum, tungsten, chromium, or ruthenium. It is particularly preferable that aluminum or titanium be contained. For example, an aluminum nitride film formed by a reactive sputtering method using aluminum as a sputtering target and a nitrogen-containing gas as a deposition gas can be a film having both an extremely high insulating property and an extremely high blocking property against hydrogen and oxygen when the flow rate of a nitrogen gas with respect to the total flow rate of the deposition gas is appropriately controlled. Thus, when such an insulating film containing a metal nitride is provided in contact with the semiconductor layer, the resistance of the semiconductor layer can be reduced, and release of oxygen from the semiconductor layer and diffusion of hydrogen into the semiconductor layer can be favorably prevented.

In the case where an aluminum nitride is used as the metal nitride, the thickness of the insulating layer containing an aluminum nitride is preferably 5 nm or more. A film with such a small thickness can have both a high blocking property against hydrogen and oxygen and a function of reducing the resistance of the semiconductor layer. Note that there is no upper limit of the thickness of the insulating layer; however, the thickness is preferably less than or equal to 500 nm, further preferably less than or equal to 200 nm, and still further preferably less than or equal to 50 nm in consideration of productivity.

In the case of using an aluminum nitride film as the insulating layer 366, it is preferable to use a film that satisfies the composition formula $AlN_x$ (x is a real number greater than 0 and less than or equal to 2, and preferably, x is a real number greater than 0.5 and less than or equal to 1.5). In that case, a film having an excellent insulating property and high thermal conductivity can be obtained, and thus dissipation of heat generated in driving the transistor 350A can be increased.

Such the insulating layer 366 is provided in contact with the low-resistance region 358n, whereby the insulating layer 366 absorbs oxygen in the low-resistance region 358n and oxygen vacancies can be formed in the low-resistance region 358n. Furthermore, when heat treatment is performed after the insulating layer 366 is formed, a larger number of oxygen vacancies can be formed in the low-resistance region 358n, so that the reduction in resistance can be promoted. In the case where a film containing a metal oxide is used as the insulating layer 366, as the result of absorption of oxygen in the semiconductor layer 358 by the insulating layer 366, a layer containing an oxide of a metal element included in the insulating layer 366 (e.g., aluminum) may be formed between the insulating layer 366 and the low-resistance region 358n.

Here, in the case where a metal oxide containing indium is used as the semiconductor layer 358, a region where indium oxide is precipitated or a region having a high indium concentration is sometimes formed in the low-resistance region 358n in the vicinity of the interface with the insulating layer 366. Thus, the low resistance region 358n having extremely low resistance can be formed. Such a region can sometimes be observed by an analysis method such as XPS, for example.

Structure Example 2-3

Figure 12A:
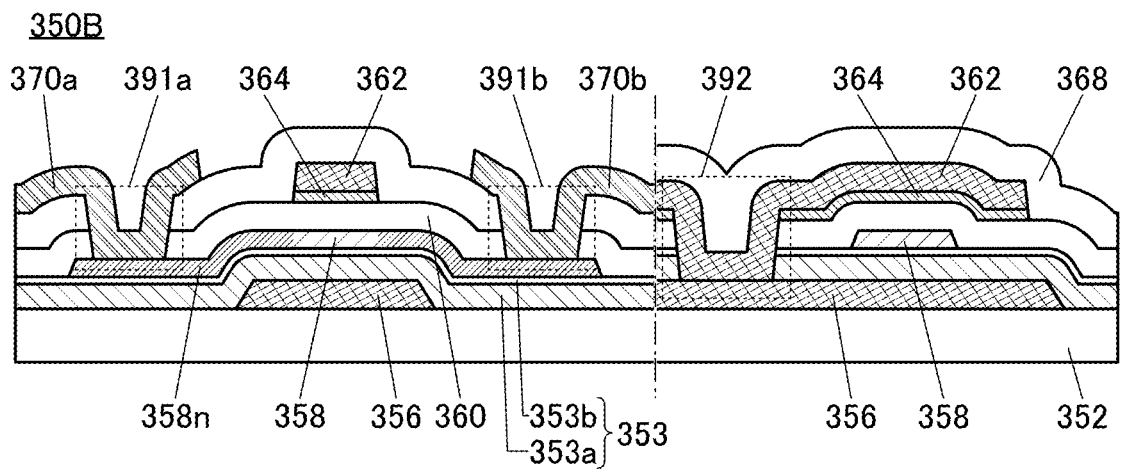
FIG. 12A and FIG. 12B are cross-sectional views of semiconductor devices.

FIG. 12A is a cross-sectional view of a transistor 350B. In FIG. 12A, a cross section in the channel length direction is shown on the left side of the dashed-dotted line, and a cross section in the channel width direction is shown on the right side.

The transistor 350B is different from Structure example 2-1 mainly in that a conductive layer 356 is included between the substrate 352 and the insulating layer 353. The conductive layer 356 includes a region overlapping with the semiconductor layer 358 and the conductive layer 362.

In the transistor 350B, the conductive layer 362 has a function of a second gate electrode (also referred to as a top gate electrode), and the conductive layer 356 has a function of a first gate electrode (also referred to as a bottom gate electrode). In addition, part of the insulating layer 360 functions as a second gate insulating layer, and part of the insulating layer 353 functions as a first gate insulating layer.

A portion of the semiconductor layer 358 which overlaps with at least one of the conductive layer 362 and the conductive layer 356 functions as a channel formation region. Note that for easy explanation, a portion of the semiconductor layer 358 that overlaps with the conductive layer 362 is hereinafter referred to as a channel formation region in some cases; however, a channel can also be actually formed in a portion not overlapping with the conductive layer 362 and overlapping with the conductive layer 356 (a portion including the low-resistance region 358n).

As illustrated in FIG. 12A, the conductive layer 356 may be electrically connected to the conductive layer 362 through an opening 392 provided in the metal oxide layer 364, the insulating layer 360, and the insulating layer 353. In that case, the same potential can be applied to the conductive layer 356 and the conductive layer 362.

The conductive layer 356 may be electrically connected to any one of the conductive layer 370a and the conductive layer 370b.

For the conductive layer 356, a material similar to that for the conductive layer 362, the conductive layer 370a, or the conductive layer 370b can be used. Specifically, a material containing copper is preferably used for the conductive layer 356, in which case wiring resistance can be reduced.

FIG. 12A illustrates the case where the insulating layer 353 has a stacked-layer structure in which an insulating layer 353a and an insulating layer 353b are stacked from the conductive layer 356 side. In that case, an insulating film that is less likely to diffuse a metal element included in the conductive layer 356 is preferably used as the insulating layer 353a positioned on the conductive layer 356 side. For example, an inorganic insulating film such as a silicon nitride film, a silicon nitride oxide film, an aluminum oxide film, or a hafnium oxide film is preferably used. Meanwhile, an insulating film containing oxygen is preferably used as the insulating layer 353b in contact with the semiconductor layer 358. For example, a silicon oxide film, a silicon oxynitride film, or the like is preferably used.

In addition, as illustrated in FIG. 12A, the conductive layer 362 and the conductive layer 356 preferably project outward from an end portion of the semiconductor layer 358 in the channel width direction. In that case, as illustrated in FIG. 12A, a structure is employed in which the semiconductor layer 358 in the channel width direction is entirely covered with the conductive layer 362 and the conductive layer 356 with the insulating layer 360 and the insulating layer 353 therebetween.

With such a structure, the semiconductor layer 358 can be electrically surrounded by electric fields generated by a pair of gate electrodes. At this time, it is particularly preferable that the same potential be applied to the conductive layer 356 and the conductive layer 362. In that case, electric fields for inducing a channel can be effectively applied to the semiconductor layer 358, so that the on-state current of the transistor 350B can be increased. Thus, the transistor 350B can also be miniaturized.

Note that a structure in which the conductive layer 362 and the conductive layer 356 are not connected to each other may be employed. In that case, a constant potential may be applied to one of the pair of gate electrodes, and a signal for driving the transistor 350B may be applied to the other. In this case, the potential applied to one of the electrodes can control the threshold voltage at the time of driving the transistor 350B with the other electrode.

Structure Example 2-4

Figure 12B:
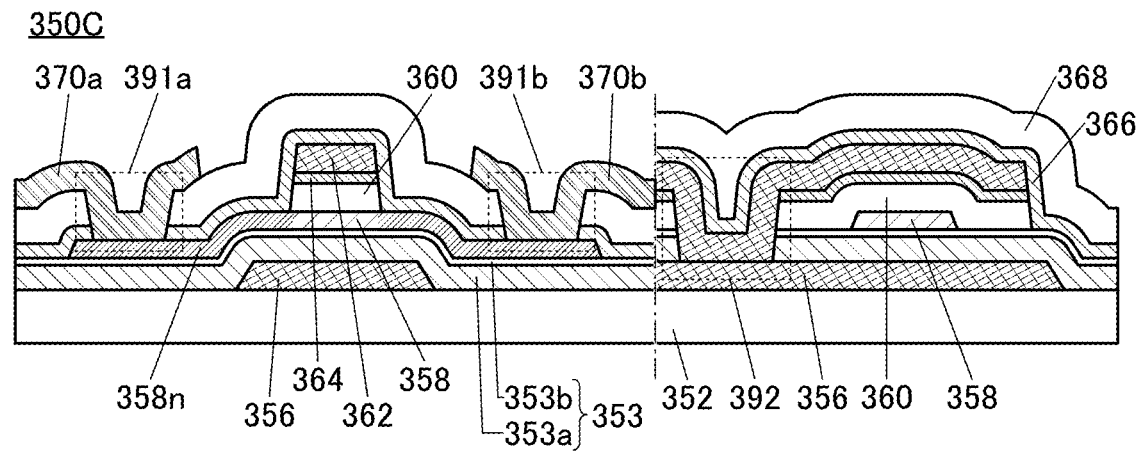

FIG. 12B is a cross-sectional view of a transistor 350C. In FIG. 12B, a cross section in the channel length direction is shown on the left side of the dashed-dotted line, and a cross section in the channel width direction is shown on the right side.

The transistor 350C is an example in which the transistor 350A described in Structure example 2-2 is provided with the conductive layer 356 described in Structure example 2-3 and functioning as the first gate electrode.

Such a structure enables a transistor to have high on-state current. Alternatively, a transistor whose threshold voltage is controllable can be provided.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, examples of a structure of a display device which can be manufactured using a semiconductor device including a metal oxide of one embodiment of the present invention will be described.

Figure 13A:
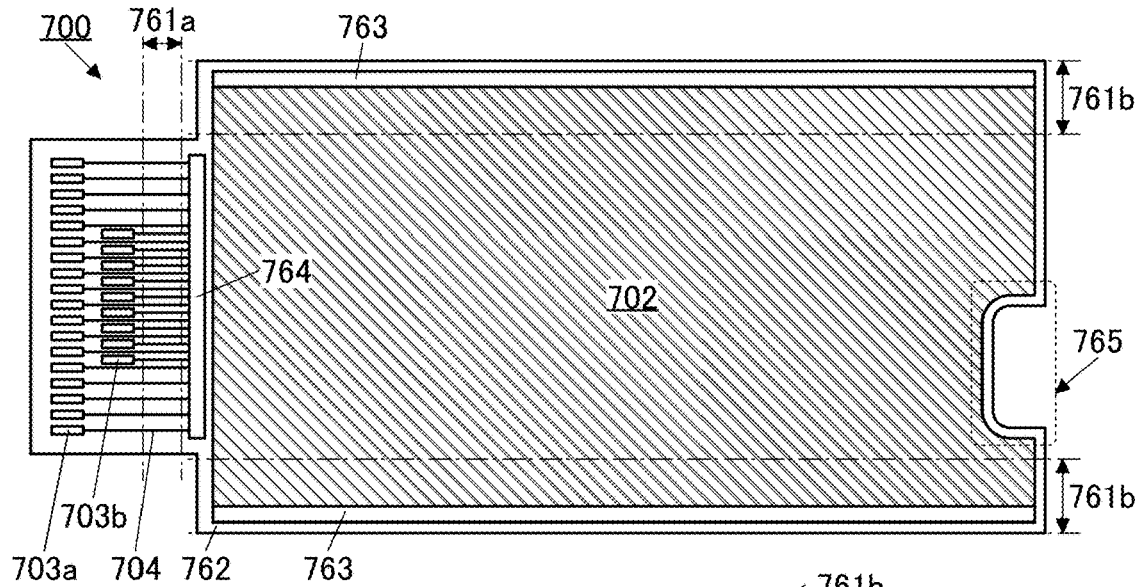
FIG. 13A to FIG. 13C show a structure example of a display device.

FIG. 13A is a schematic top view of a display device 700. The display device 700 includes a substrate 762 having flexibility. The substrate 762 is provided with a display portion 702, a pair of circuit portions 763, a circuit portion 764, wirings 704, connection terminals 703a, and connection terminals 703b.

The circuit portions 763 and the circuit portion 764 have a function of driving the display portion 702. Two circuit portions 763 are provided to sandwich the display portion 702. The circuit portion 764 is provided between the display portion 702 and the wiring 704. The circuit portions 763 have a function of a gate driver, for example, and the circuit portion 764 has a function of a source driver or part of the source driver, for example. For example, the circuit portion 764 may include a buffer circuit or a demultiplexer circuit.

As a display element provided in the display portion 702, the above-described variety of display elements such as a liquid crystal element and a light-emitting element can be used. In particular, an organic EL element is preferably used as the display element.

The substrate 762 has a top surface shape in which a portion where the wiring 704, the connection terminal 703a, and the connection terminal 703b are provided projects from the other portion. In other words, the width of the portion of the substrate 762 is smaller than the width of a portion of the substrate 762 over which the display portion 702 is provided.

Furthermore, the projecting portion of the substrate 762 includes a region that can be bent (a bent portion 761a) in a region overlapping with the wirings 704. Moreover, the substrate 762 includes a pair of regions that can be bent (bent portions 761b) in a region over which the display portion 702 is provided. As illustrated in FIG. 13A, owing to the projecting shape of the portion of the substrate 762, the bending direction of the bent portion 761a can intersect with the bending direction of the bent portions 761b.

The connection terminal 703a functions as a terminal to which an FPC (Flexible Printed Circuit) is connected, and the connection terminal 703b functions as a terminal to which an IC is connected.

Figure 13B:
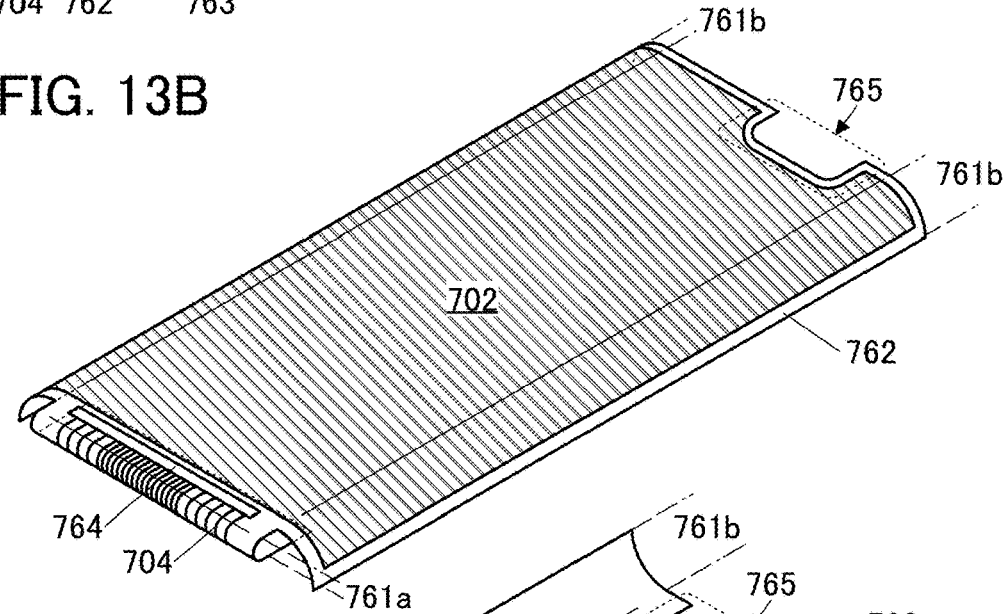
Figure 13C:
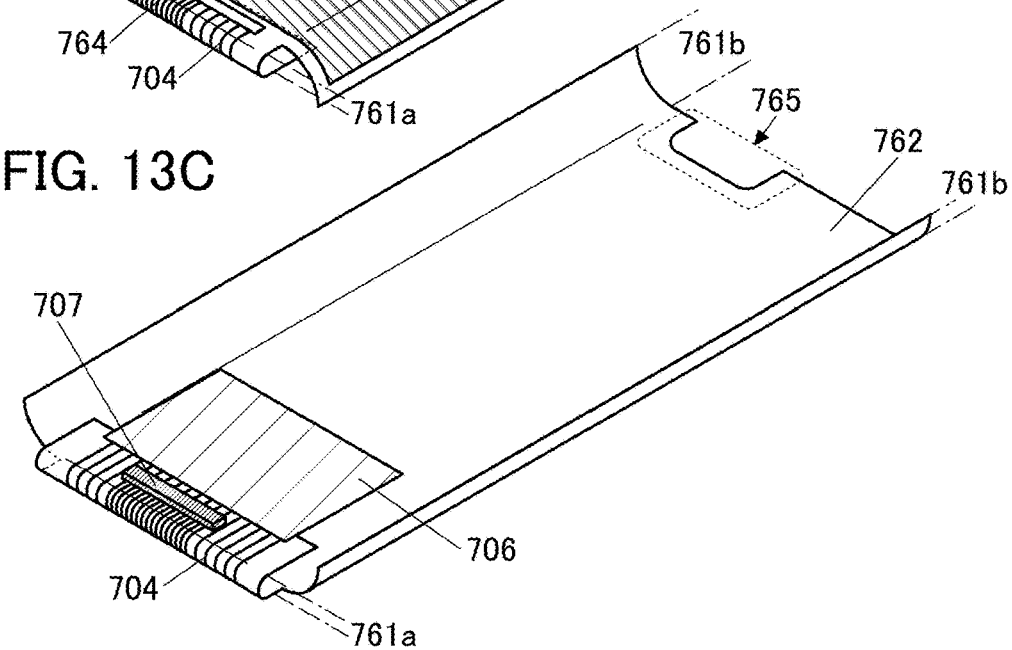

FIG. 13B and FIG. 13C are perspective views of the display device 700 in the case where the substrate 762 is bent at the bent portion 761a and the bent portion 761b to a side opposite to the display surface side. FIG. 13B is a perspective view including the display surface side, and FIG. 13C is a perspective view including the side opposite to the display surface side. FIG. 13C illustrates an FPC 706 connected to the connection terminal 703a and an IC 707 connected to the connection terminal 703b.

When both sides of the display portion 702 are bent as illustrated in FIG. 13B, at the time of incorporating the display device 700 in an electronic device, bent display portions can be provided on both sides of the electronic device. Thus, a highly functional electronic device can be provided.

Furthermore, as illustrated in FIG. 13B and FIG. 13C, owing to the bent portion 761a, part of the substrate 762 can be folded back to the side opposite to the display surface side. Specifically, the projecting portion of the substrate 762 can be folded back so that the wirings 704 are on an outer side. Accordingly, the connection terminals 703a and the connection terminals 703b can be placed on the side opposite to the display surface side; in addition, the FPC 706 can be placed on the side opposite to the display surface side. Thus, the area of a non-display portion can be reduced when the display device 700 is incorporated in an electronic device.

Furthermore, a notch 765 is provided in the substrate 762. The notch 765 is a portion in which, for example, a lens of a camera included in an electronic device, a variety of sensors such as an optical sensor, a lighting device, a design, or the like can be placed. Owing to the notch of part of the display portion 702, a further highly designed electronic device can be provided. In addition, owing to the notch, the screen occupation ratio with respect to the surface of a housing can be increased.

CROSS-SECTIONAL STRUCTURE EXAMPLES

Examples of a cross-sectional structure of the display device are described below.

Structure Example 1

Figure 14:
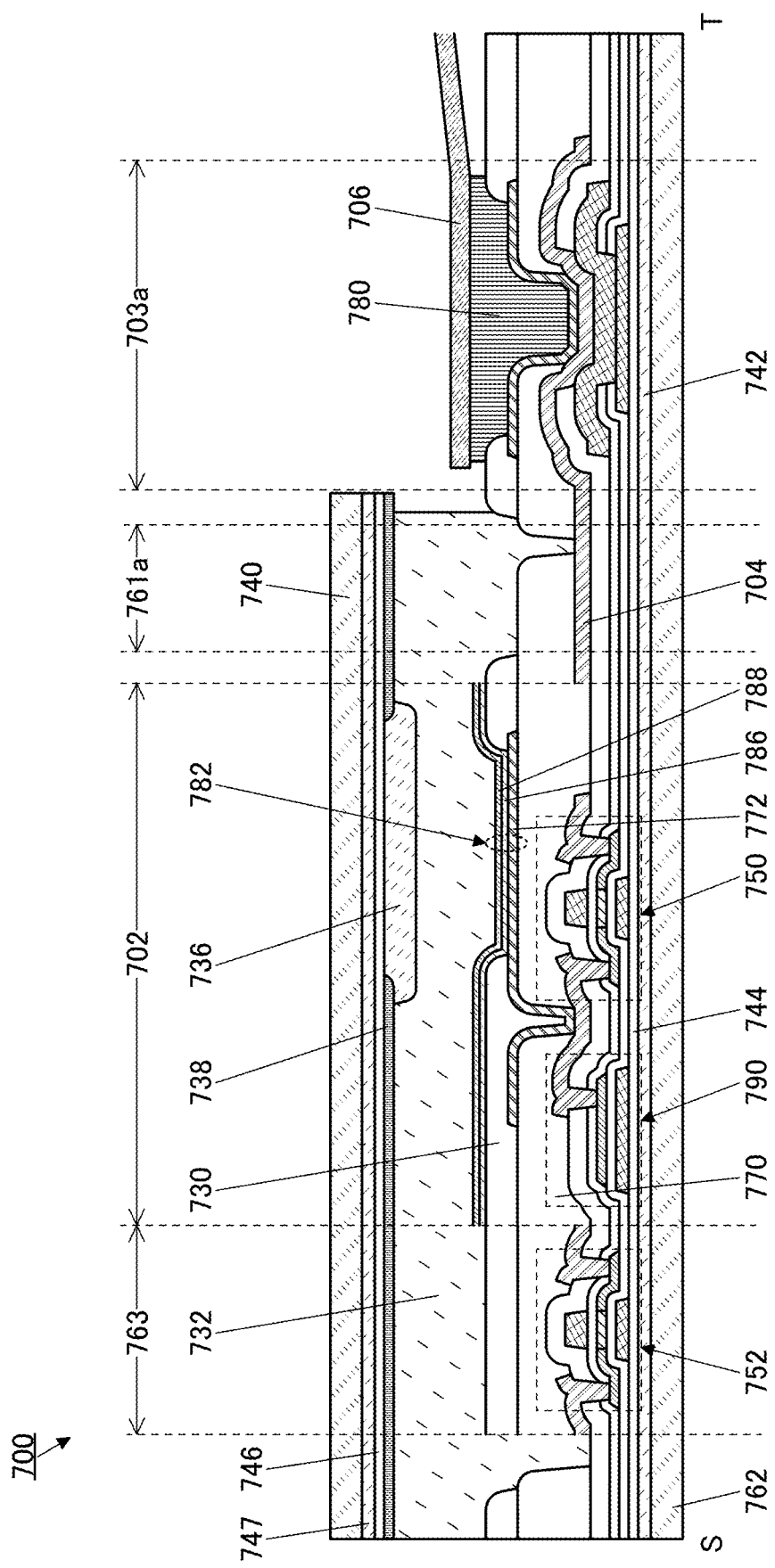
FIG. 14 shows a cross-sectional structure example of a display device.

FIG. 14 is a schematic cross-sectional view of the display device 700. FIG. 14 illustrates a cross section including the display portion 702, the circuit portion 763, the bent portion 761a, and the connection terminal 703a in the display device 700 illustrated in FIG. 13A. A transistor 750 and a capacitor 790 are provided in the display portion 702. A transistor 752 is provided in the circuit portion 763.

The transistor 750 and the transistor 752 are each a transistor using an oxide semiconductor for a semiconductor layer in which a channel is formed. Note that the transistors are not limited thereto, and a transistor using silicon (amorphous silicon, polycrystalline silicon, or single-crystal silicon) for its semiconductor layer or a transistor using an organic semiconductor for its semiconductor layer can be used.

The transistor used in this embodiment includes a highly purified oxide semiconductor in which formation of oxygen vacancies is inhibited. The off-state current of the transistors can be reduced significantly. Accordingly, in the pixel employing such a transistor, the retention time of an electrical signal such as an image signal can be extended, and the interval between writes of an image signal or the like can also be set longer. Accordingly, the frequency of refresh operations can be reduced, so that power consumption can be reduced.

The transistor used in this embodiment can have relatively high field-effect mobility and thus is capable of high-speed operation. For example, with the use of such a transistor capable of high-speed operation for a display device, a switching transistor in a pixel and a driver transistor used in a circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel can provide a high-quality image.

The capacitor 790 includes a lower electrode formed by processing the same film as a film used for the first gate electrode of the transistor 750 and an upper electrode formed by processing the same metal oxide as a film used for the semiconductor layer. The upper electrode has reduced resistance like a source region and a drain region of the transistor 750. Part of an insulating film functioning as a first gate insulating layer of the transistor 750 is provided between the lower electrode and the upper electrode. That is, the capacitor 790 has a stacked-layer structure in which an insulating film functioning as a dielectric film is positioned between a pair of electrodes. A wiring obtained by processing the same film as a film used for a source electrode and a drain electrode of the transistor 750 is connected to the upper electrode.

An insulating layer 770 that functions as a planarization film is provided over the transistor 750, the transistor 752, and the capacitor 790.

The transistor 750 in the display portion 702 and the transistor 752 in the circuit portion 763 may have different structures. For example, a top-gate transistor may be used as one of the transistors 750 and 752, and a bottom-gate transistor may be used as the other. Note that this description as for the circuit portions 763 can be applied to the circuit portion 764.

Note that Embodiment 2, which is described above, can be referred to for the structures of the transistor 750 and the transistor 752.

The connection terminal 703a includes part of the wiring 704. As illustrated in FIG. 14, the connection terminal 703a preferably has a stacked structure of a plurality of conductive films, in which case the conductivity of the connection terminal 703a or mechanical strength thereof is increased. The connection terminal 703a is electrically connected to the FPC 706 through a connection layer 780. As the connection layer 780, for example, an anisotropic conductive material or the like can be used.

The display device 700 includes the substrate 762 and a substrate 740, each of which functions as a support substrate. As the substrate 762 and the substrate 740, a glass substrate or a substrate having flexibility such as a plastic substrate can be used, for example.

The transistor 750, the transistor 752, the capacitor 790, and the like are provided over an insulating layer 744. The substrate 762 and the insulating layer 744 are bonded to each other with an adhesive layer 742.

The display device 700 includes a light-emitting element 782, a coloring layer 736, a light-blocking layer 738, and the like.

The light-emitting element 782 includes a conductive layer 772, an EL layer 786, and a conductive layer 788. The conductive layer 772 is electrically connected to the source electrode or the drain electrode included in the transistor 750. The conductive layer 772 is provided over the insulating layer 770 and functions as a pixel electrode. An insulating layer 730 is provided to cover an end portion of the conductive layer 772. Over the insulating layer 730 and the conductive layer 772, the EL layer 786 and the conductive layer 788 are stacked.

For the conductive layer 772, a material having a property of reflecting visible light can be used. For example, a material containing aluminum, silver, or the like can be used. For the conductive layer 788, a material that transmits visible light can be used. For example, an oxide material containing indium, zinc, tin, or the like is preferably used. Thus, the light-emitting element 782 is a top-emission light-emitting element, which emits light to the side opposite the formation surface (the substrate 740 side).

The EL layer 786 contains an organic compound or an inorganic compound such as quantum dots. The EL layer 786 contains a light-emitting material that exhibits light when current flows.

As the light-emitting material, a fluorescent material, a phosphorescent material, a thermally activated delayed fluorescence (TADF) material, an inorganic compound (e.g., a quantum dot material), or the like can be used. Examples of materials that can be used for quantum dots include a colloidal quantum dot material, an alloyed quantum dot material, a core-shell quantum dot material, and a core quantum dot material.

The light-blocking layer 738 and the coloring layer 736 are provided on one surface of an insulating layer 746. The coloring layer 736 is provided in a position overlapping with the light-emitting element 782. The light-blocking layer 738 is provided in a region not overlapping with the light-emitting element 782 in the display portion 702. The light-blocking layer 738 may also be provided to overlap with the circuit portion 763 or the like.

The substrate 740 is bonded to the other surface of the insulating layer 746 with an adhesive layer 747. The substrate 740 and the substrate 762 are bonded to each other with a sealing layer 732.

Here, for the EL layer 786 included in the light-emitting element 782, a light-emitting material that exhibits white light emission is used. White light emission by the light-emitting element 782 is colored by the coloring layer 736 to be emitted to the outside. The EL layer 786 is provided over the pixels that exhibit different colors. The pixels provided with the coloring layer 736 transmitting any of red (R), green (G), and blue (B) are arranged in a matrix in the display portion, whereby the display device 700 can perform full-color display.

A conductive film having a semi-transmissive property and a semi-reflective property may be used for the conductive layer 788. In this case, a microcavity structure is achieved between the conductive layer 772 and the conductive layer 788 such that light of a specific wavelength can be intensified to be emitted. Also in this case, an optical adjustment layer for adjusting an optical distance may be placed between the conductive layer 772 and the conductive layer 788 such that the thickness of the optical adjustment layer differs between pixels of different colors, whereby the color purity of light emitted from each pixel can be increased.

Note that a structure in which the coloring layer 736 or the above optical adjustment layer is not provided may be employed when the EL layer 786 is formed into an island shape for each pixel or into a stripe shape for each pixel column, i.e., the EL layer 786 is formed by separate coloring.

Here, an inorganic insulating film that functions as a barrier film having low permeability is preferably used for each of the insulating layer 744 and the insulating layer 746. With such a structure in which the light-emitting element 782, the transistor 750, and the like are interposed between the insulating layer 744 and the insulating layer 746, deterioration of them can be inhibited and a highly reliable display device can be achieved.

Structure Example 2

Figure 15:
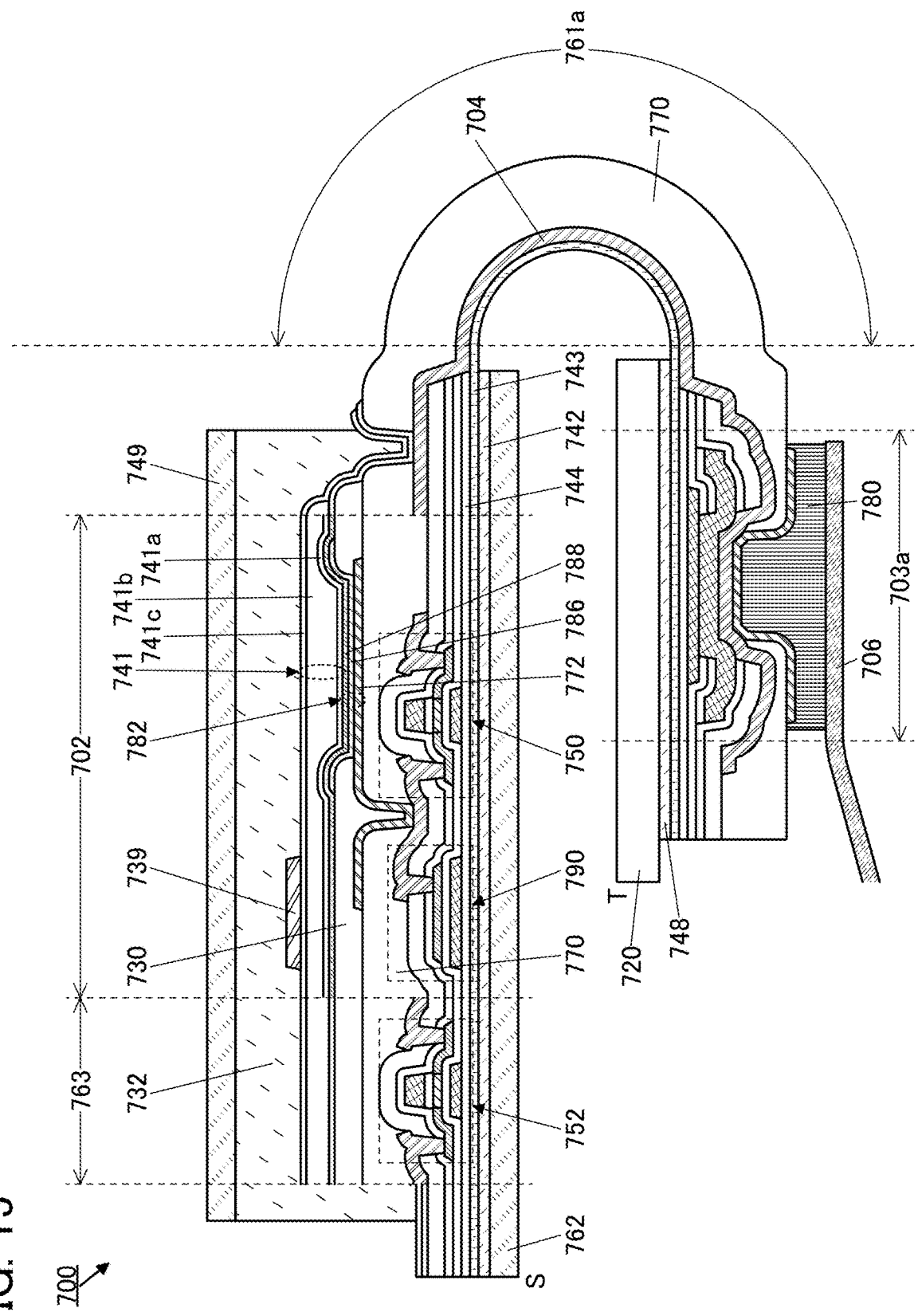
FIG. 15 shows a cross-sectional structure example of a display device.

FIG. 15 is a cross-sectional view of the display device 700 having a structure partly different from that of FIG. 14. Furthermore, FIG. 15 clearly shows an embodiment in which part of the display device 700 is bent in the bent portion 761a and folded back to the side opposite to the display surface side.

In the display device 700 illustrated in FIG. 15, a resin layer 743 is provided between the adhesive layer 742 and the insulating layer 744 illustrated in FIG. 14. A protection layer 749 is provided instead of the substrate 740.

The resin layer 743 is a layer containing an organic resin such as polyimide or acrylic. The insulating layer 744 includes an inorganic insulating film of a silicon oxide, a silicon oxynitride, a silicon nitride, or the like. The resin layer 743 and the substrate 762 are attached to each other with the adhesive layer 742. The resin layer 743 is preferably thinner than the substrate 762.

The protection layer 749 is attached to the sealing layer 732. A glass substrate, a resin film, or the like can be used as the protection layer 749. As the protection layer 749, an optical member such as a polarizing plate (including a circularly polarizing plate) or a scattering plate, an input device such as a touch sensor panel, or a structure in which two or more of these are stacked may be employed. Furthermore, the protection layer 749 may include a component included in part of a housing of an electronic device (for example, a portion to be a screen).

The EL layer 786 included in the light-emitting element 782 is provided over the insulating layer 730 and the conductive layer 772 in an island shape. The EL layers 786 are formed separately such that subpixels have the respective emission colors, whereby color display can be performed without use of the coloring layer 736.

A protection layer 741 is provided to cover the light-emitting element 782. The protection layer 741 has a function of preventing diffusion of impurities such as water into the light-emitting element 782. The protection layer 741 has a stacked-layer structure in which an insulating layer 741a, an insulating layer 741b, and an insulating layer 741c are stacked in this order from the conductive layer 788 side. In that case, it is preferable that inorganic insulating films with a high barrier property against impurities such as water be used as the insulating layer 741a and the insulating layer 741c, and an organic insulating film that functions as a planarization film be used as the insulating layer 741b. The protection layer 741 is preferably provided to extend also to the circuit portion 763 and the like.

An organic insulating film covering the transistor 750, the transistor 752, and the like is preferably formed in an island shape inward from the sealing layer 732. In other words, an end portion of the organic insulating film is preferably positioned inward from the sealing layer 732 or in a region overlapping with an end portion of the sealing layer 732. FIG. 15 shows an example in which the insulating layer 770, the insulating layer 730, and the insulating layer 741b are processed into island shapes. The insulating layer 741c and the insulating layer 741a are provided in contact with each other in a portion overlapping with the sealing layer 732, for example. Thus, a surface of the organic insulating film covering the transistor 750 and the transistor 752 is not exposed to the outside of the sealing layer 732, whereby diffusion of water or hydrogen from the outside to the transistor 750 and the transistor 752 through the organic insulating film can be favorably prevented. This can reduce variations in electrical characteristics of the transistors, so that a display device with extremely high reliability can be fabricated.

In FIG. 15, the bent portion 761a includes a portion where the substrate 762, the adhesive layer 742, and the inorganic insulating film such as the insulating layer 744 are not provided. The bent portion 761a has a structure in which the insulating layer 770 including an organic material covers the wiring 704 so that the wiring 704 is not exposed. In the structure illustrated in FIG. 15, the bent portion 761a has a stacked-layer structure in which the resin layer 743, the wiring 704, and the insulating layer 770 are stacked.

When a structure is employed in which an inorganic insulating film is not provided if possible in the bent portion 761a and only a conductive layer containing a metal or an alloy and a layer containing an organic material are stacked, generation of cracks caused at bending can be prevented. When the substrate 762 is not provided in the bent portion 761a, part of the display device 700 can be bent with an extremely small radius of curvature.

In a region overlapping with the connection terminal 703a, a support 720 is bonded to the resin layer 743 with an adhesive layer 748 positioned therebetween. A material having higher rigidity than the substrate 762 and the like can be used for the support 720. Alternatively, the support 720 may be part of a housing of an electronic device or part of a component placed in an electronic device.

In FIG. 15, a conductive layer 739 is provided over the protection layer 741. The conductive layer 739 can be used as a wiring or an electrode.

In the case where a touch sensor is provided so as to overlap with the display device 700, the conductive layer 739 can function as an electrostatic shielding film for preventing transmission of electrical noise to the touch sensor during pixel driving. In this case, the structure in which a predetermined constant potential is supplied to the conductive layer 739 can be employed.

Alternatively, the conductive layer 739 can be used as an electrode of the touch sensor, for example. This enables the display device 700 to function as a touch panel. For example, the conductive layer 739 can be used as an electrode or a wiring of a capacitive touch sensor. In this case, the conductive layer 739 can be used as a wiring or an electrode to which a sensor circuit is connected or a wiring or an electrode to which a sensor signal is input. When the touch sensor is formed over the light-emitting element 782 in this manner, the number of components can be reduced, and manufacturing cost of an electronic device or the like can be reduced.

The conductive layer 739 is preferably provided in a portion not overlapping with the light-emitting element 782. The conductive layer 739 can be provided in a position overlapping with the insulating layer 730, for example. Thus, a transparent conductive film with a relatively low conductivity is not necessarily used for the conductive layer 739, and a metal or an alloy having high conductivity or the like can be used, so that the sensitivity of the sensor can be increased.

As the type of the touch sensor that can be formed of the conductive layer 739, a variety of types such as a resistive type, a surface acoustic wave type, an infrared type, an optical type, and a pressure-sensitive type can be used, without limitation to a capacitive type. Alternatively, two or more of these types may be combined and used.

Structure Example 3

Figure 16:
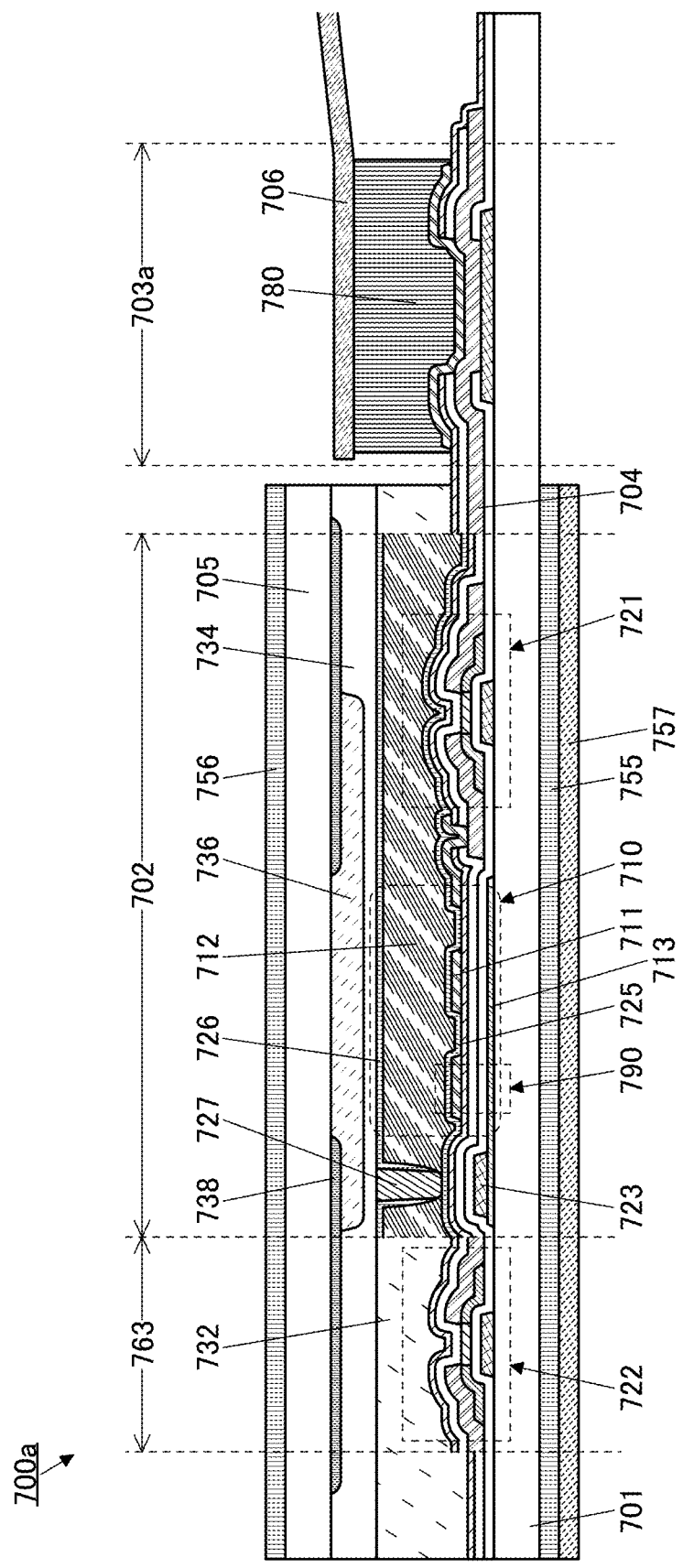
FIG. 16 shows a cross-sectional structure example of a display device.

FIG. 16 illustrates a schematic cross-sectional view of the display device 700a in the case where a liquid crystal element is used as a display element. FIG. 16 is a cross-sectional view of a region including the circuit portion 763, the display portion 702, and the connection terminal 703a.

The display device 700a illustrated in FIG. 16 includes a transistor 721, a transistor 722, a liquid crystal element 710, and the like between a substrate 701 and a substrate 705. The substrate 701 and the substrate 705 are bonded to each other with the sealing layer 732.

Here, the case where bottom-gate transistors are used as the transistor 721 and the transistor 722 is described.

The liquid crystal element 710 includes a conductive layer 711, a liquid crystal 712, and a conductive layer 713. The conductive layer 713 is provided over the substrate 701. One or more insulating layers are provided over the conductive layer 713, and the conductive layer 711 is provided over the insulating layer(s). Furthermore, the liquid crystal 712 is positioned between the conductive layer 711 and the substrate 705. The conductive layer 713 is electrically connected to a wiring 723 and functions as a common electrode. The conductive layer 711 is electrically connected to the transistor 721 and serves as a pixel electrode. A common potential is supplied to the wiring 723.

The liquid crystal element 710 illustrated in FIG. 16 is a liquid crystal element to which a horizontal electric field mode (e.g., an FFS mode) is applied. The conductive layer 711 has a comb-like top surface shape or a top surface shape including a slit. In the liquid crystal element 710, the alignment state of the liquid crystal 712 is controlled by an electric field generated between the conductive layer 711 and the conductive layer 713.

Furthermore, the capacitor 790 functioning as a storage capacitor is formed of a stacked-layer structure of the conductive layer 711, the conductive layer 713, and one or more insulating layers sandwiched between the conductive layer 711 and the conductive layer 713. Thus, another capacitor need not be provided, and thus the aperture ratio can be increased.

A material that transmits visible light or a material that reflects visible light can be used for the conductive layer 711 and the conductive layer 713. As a light-transmitting material, for example, an oxide material containing indium, zinc, tin, or the like is preferably used. As a reflective material, for example, a material containing aluminum, silver, or the like is preferably used.

When a reflective material is used for one or both of the conductive layer 711 and the conductive layer 713, the display device 700a is a reflective liquid crystal display device. In contrast, when a light-transmitting material is used for both of the conductive layer 711 and the conductive layer 713, the display device 700a is a transmissive liquid crystal display device. For a reflective liquid crystal display device, a polarizing plate is provided on the viewer side. By contrast, for a transmissive liquid crystal display device, a pair of polarizing plates is provided so that the liquid crystal element is placed therebetween.

FIG. 16 shows an example of a transmissive liquid crystal display device. A polarizing plate 755 and a light source 757 are provided on the outer side of the substrate 701, and a polarizing plate 756 is provided on the outer side of the substrate 705. The light source 757 functions as a backlight.

The light-blocking layer 738 and the coloring layer 736 are provided on a surface of the substrate 705 that is on the substrate 701 side. An insulating layer 734 functioning as a planarization layer is provided to cover the light-blocking layer 738 and the coloring layer 736. A spacer 727 is provided on a surface of the insulating layer 734 that is on the substrate 701 side.

The liquid crystal 712 is positioned between an alignment film 725 covering the conductive layer 711 and an alignment film 726 covering the insulating layer 734. Note that the alignment film 725 and the alignment film 726 are not necessarily provided when not needed.

Although not illustrated in FIG. 16, an optical member (optical film) such as a retardation film or an anti-reflection film, a protection film, an antifouling film, or the like can be provided on the outer side of the substrate 705 as appropriate. As examples of the anti-reflection film, an AG (Anti Glear) film, an AR (Anti Reflection) film, or the like can be given.

As the liquid crystal 712, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

As the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like can be employed.

In addition, a scattering liquid crystal employing a polymer dispersed liquid crystal, a polymer network liquid crystal, or the like can be used for the liquid crystal 712. At this time, monochrome display may be performed without the coloring layer 736, or color display may be performed using the coloring layer 736.

As a driving method of the liquid crystal element, a time-division display method (also referred to as a field-sequential driving method) by which color display is performed by a successive additive color mixing method may be used. In that case, a structure without the coloring layer 736 can be employed. In the case where the time-division display method is employed, advantages such as the aperture ratio of each pixel or the resolution being increased can be obtained because subpixels that exhibit R (red), G (green), and B (blue), for example, need not be provided.

The display device 700a illustrated in FIG. 16 has a structure in which an organic insulating film functioning as a planarization layer is not provided on a surface on which the conductive layer 711 functioning as a pixel electrode or the conductive layer 713 functioning as a common electrode is provided. Furthermore, bottom-gate transistors, which can be manufactured through a relatively short process, are used as the transistor 721 and the like included in the display device 700a. Moreover, the wiring 704, the connection terminal 703a, and the like can be manufactured with steps common to the manufacturing steps of the transistors, the liquid crystal element, and the like without special steps. With such a structure, the manufacturing cost can be reduced and the manufacturing yield can be increased, so that a display device having high reliability can be provided at low cost.

At least part of the structure examples, the drawings corresponding thereto, and the like described in this embodiment as examples can be implemented in combination with the other structure examples, the other drawings, and the like as appropriate.

At least part of this embodiment can be implemented in combination with the other embodiments described in this specification as appropriate.

Embodiment 4

In this embodiment, a display device that includes the semiconductor device of one embodiment of the present invention is described with reference to FIG. 17A to FIG. 17C.

Figure 17A:
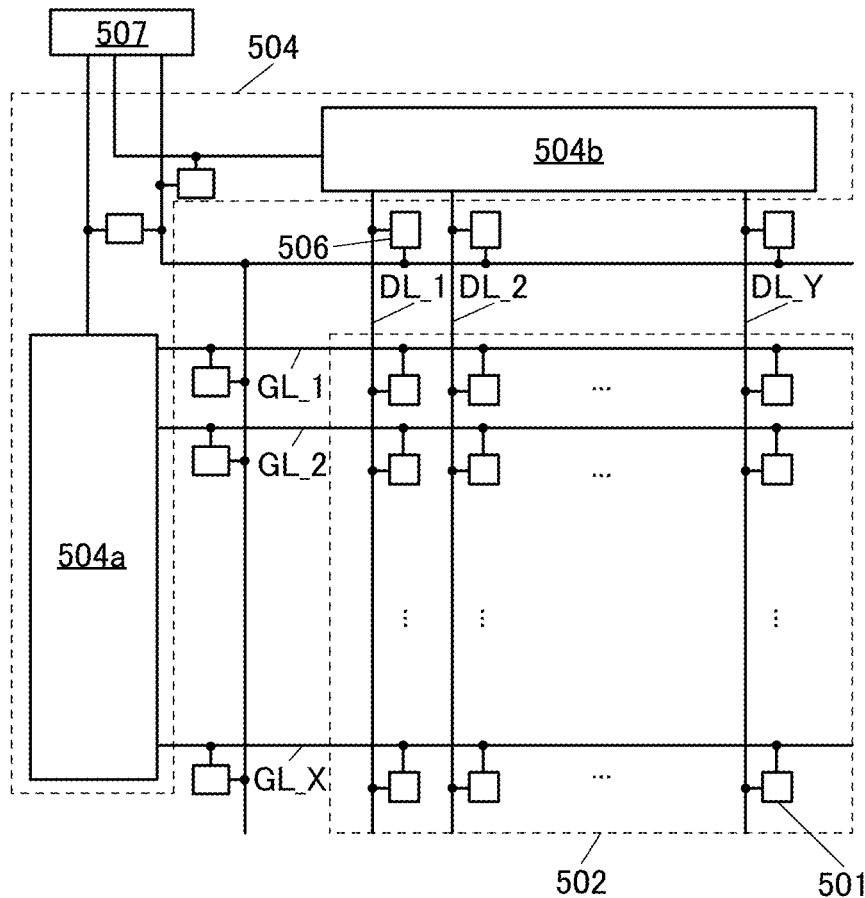
FIG. 17A is a block diagram of a display device.

A display device illustrated in FIG. 17A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501, each of which includes a circuit for driving a display element, arranged in X rows and Y columns (X and Y each independently represent a natural number of 2 or more).

The driver circuit portion 504 includes driver circuits such as a gate driver 504a that outputs a scanning signal to a scan line GL_1 to a scan line GL_X and a source driver 504b that supplies a data signal to a data line DL_1 to a data line DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is supplied to a wiring to which the protection circuit 506 is connected, establishes continuity between the wiring and another wiring. The protection circuit 506 illustrated in FIG. 17A is connected to a variety of wirings such as the scan lines GL (the scan line GL_1 to the scan line GL_X) that are wirings between the gate driver 504a and the pixel circuits 501 and the data lines DL (the data line DL_1 to the data line DL_Y) that are wirings between the source driver 504b and the pixel circuits 501, for example.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 17B:
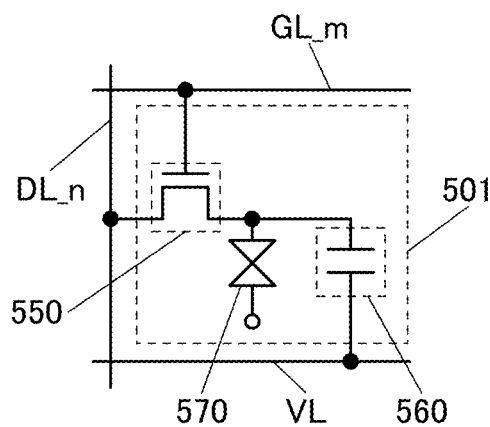
FIG. 17B and FIG. 17C are circuit diagrams of a pixel circuit included in the display device.
Figure 17C:
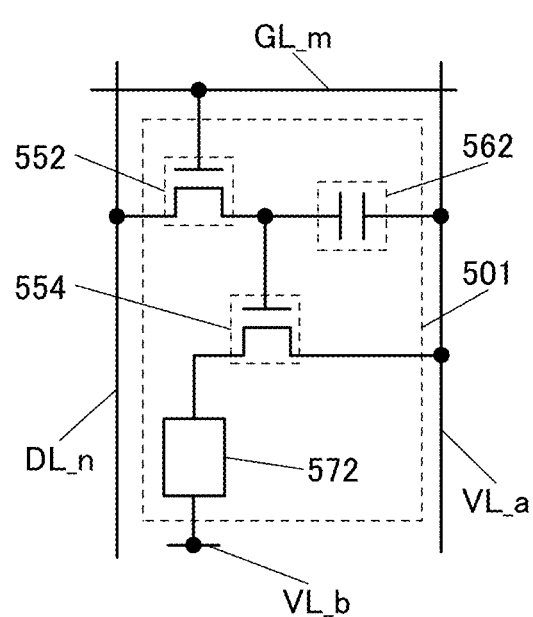

The plurality of pixel circuits 501 illustrated in FIG. 17A can have a configuration illustrated in FIG. 17B or FIG. 17C, for example.

The pixel circuit 501 illustrated in FIG. 17B includes a liquid crystal element 570, a transistor 550, and a capacitor 560. The data line DL_n, the scan line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Moreover, a different potential may be supplied to one of the pair of electrodes of the liquid crystal element 570 of the pixel circuit 501 in each row.

The pixel circuit 501 illustrated in FIG. 17C includes a transistor 552, a transistor 554, a capacitor 562, and a light-emitting element 572. The data line DL_n, the scan line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential supplied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 5

A pixel circuit including a memory for correcting gray levels displayed by pixels and a display device including the pixel circuit are described below. The transistor including the metal oxide described in Embodiment 1 can be used as a transistor used in the pixel circuit described below.

[Circuit Configuration]

Figure 18A:
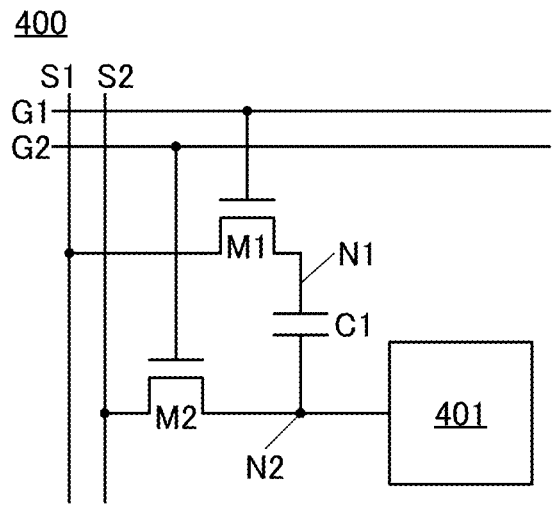
FIG. 18A, FIG. 18C, and FIG. 18D are circuit diagrams of display devices.

FIG. 18A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1.

In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as N1, and a node connecting the transistor M2, the capacitor C1, and the circuit 401 is denoted as N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1 as an example, can be used as one or both of the transistor M1 and the transistor M2. Accordingly, owing to an extremely small off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Driving Method Example

Figure 18B:
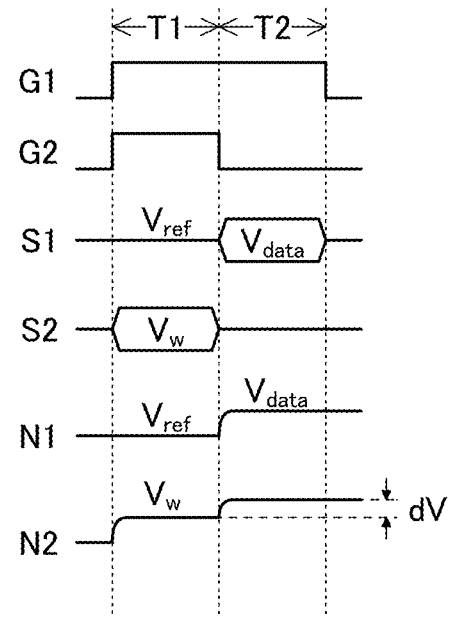
FIG. 18B is a timing chart.

Next, an example of a method for operating the pixel circuit 400 is described with reference to FIG. 18B. FIG. 18B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 18B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a fixed potential $V_{ref}$ that is a constant potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w - V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into floating.

The second data potential $V_{aasa}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although the potential dV is shown as a positive value in FIG. 18B, dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case where a light-emitting element is used, high-dynamic range (HDR) display or the like can be performed. In the case where a liquid crystal element is used, overdriving or the like can be achieved.

Application Examples

Example Using Liquid Crystal Element

Figure 18C:
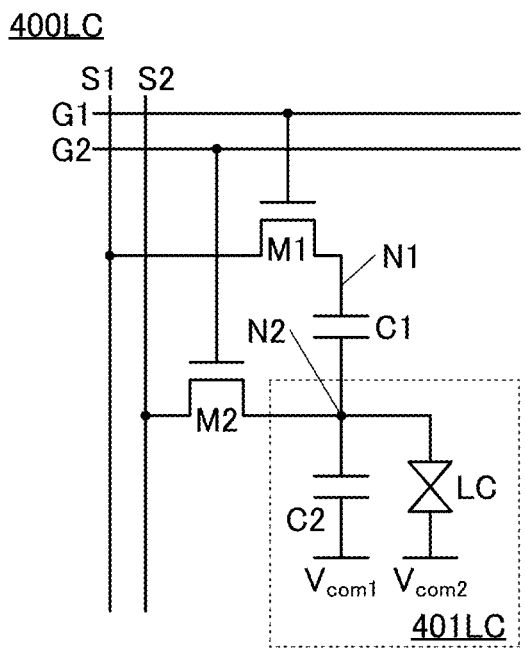

A pixel circuit 400LC illustrated in FIG. 18C includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

Example Using Light-Emitting Element

Figure 18D:
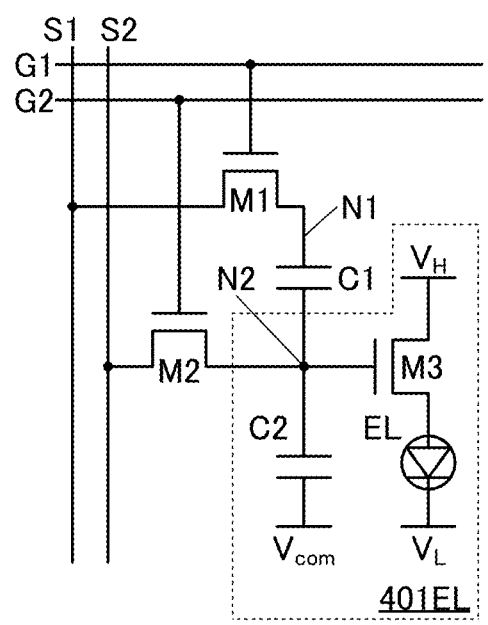

A pixel circuit 400EL illustrated in FIG. 18D includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is supplied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits shown in FIG. 18C and FIG. 18D, and a configuration to which a transistor, a capacitor, or the like is further added may be employed.

At least part of this embodiment can be implemented in combination with the other embodiments described in this specification as appropriate.

Embodiment 6

In this embodiment, a display module that can be fabricated using one embodiment of the present invention will be described.

Figure 19A:
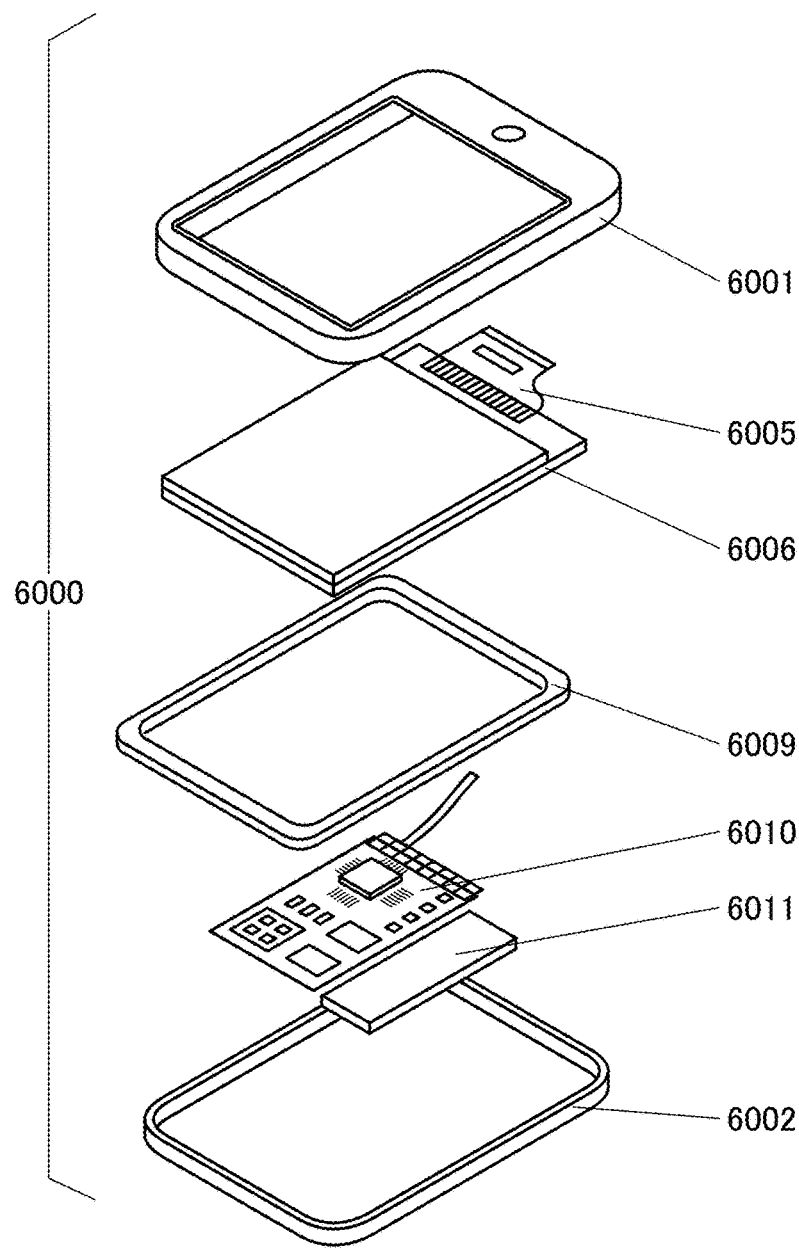
FIG. 19A and FIG. 19B show a structure example of a display module.

In a display module 6000 illustrated in FIG. 19A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like. The power supply may be from the battery 6011.

Figure 19B:
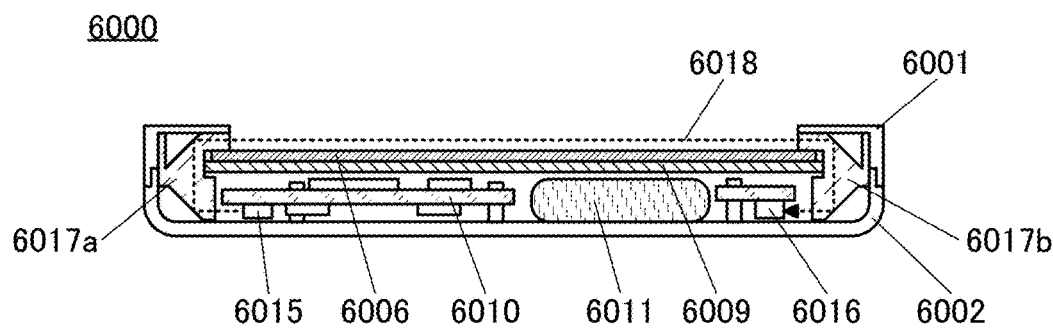

FIG. 19B is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display device 6006 overlaps with the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information on the position of touch operation can be acquired.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin that absorbs visible light and transmits infrared rays is used, a malfunction of the touch sensor can be suppressed more effectively.

At least part of this embodiment can be implemented in combination with the other embodiments described in this specification as appropriate.

Embodiment 7

In this embodiment, examples of an electronic device for which a display device of one embodiment of the present invention can be used are described.

Figure 20A:
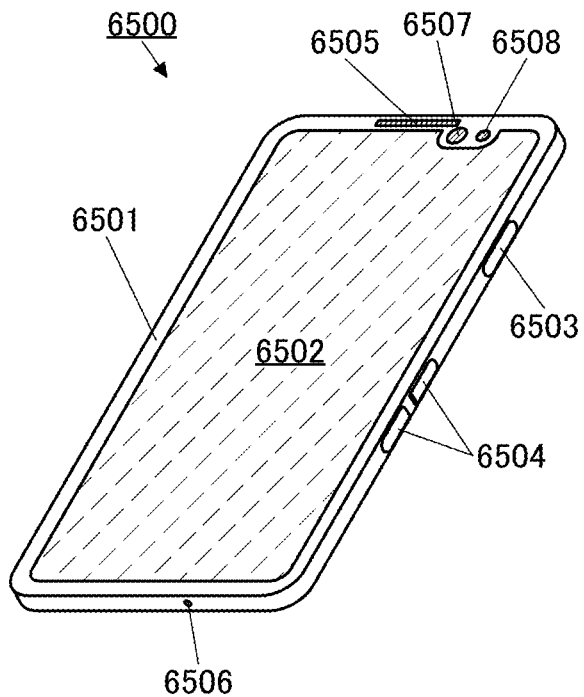
FIG. 20A to FIG. 20C show structure examples of an electronic device.

An electronic device 6500 illustrated in FIG. 20A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

The display portion 6502 has a notch, and the camera 6507 and the light source 6508 are provided to be engaged with the notch. With such a structure, an area occupied by the display portion 6502 with respect to the housing 6501 can be large.

Figure 20B:
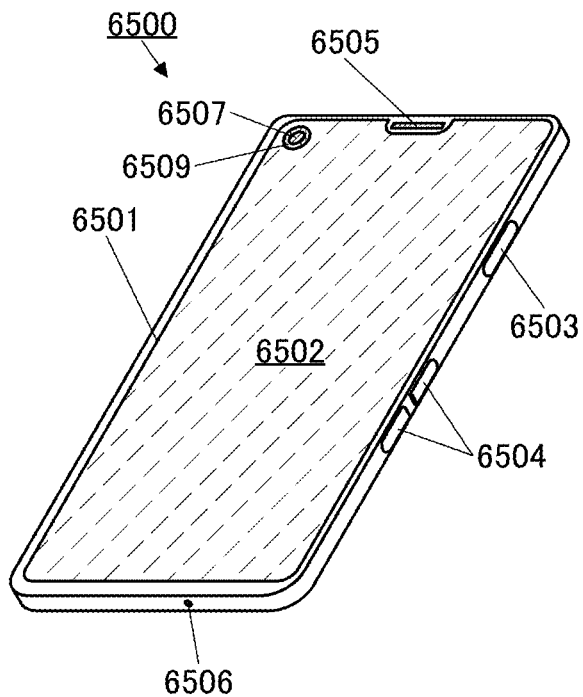

Moreover, FIG. 20B shows an example in which the display portion 6502 has an opening, and the camera 6507 and an annular light source 6509 surrounding the camera 6507 are placed in the opening. Furthermore, the speaker 6505 is provided to be engaged with the notch of the display portion 6502. The display portion 6502 may be used as a light source that illuminates a subject. With such a structure, an area occupied by the display portion 6502 with respect to the housing 6501 can be large.

Figure 20C:
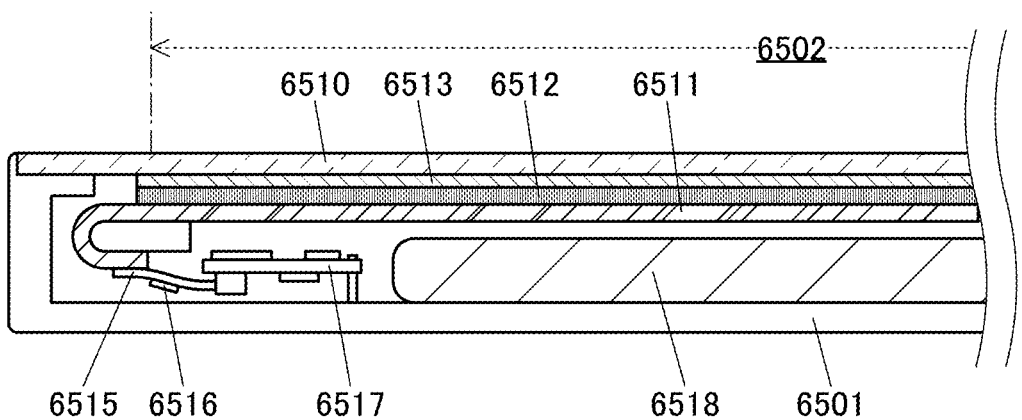

FIG. 20C is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with an adhesive layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with the other embodiments described in this specification as appropriate.

Embodiment 8

In this embodiment, electronic devices each including a display device fabricated using one embodiment of the present invention are described.

Electronic devices described below are each provided with a display device of one embodiment of the present invention in a display portion. Thus, the electronic devices achieve high resolution. In addition, the electronic devices can achieve both high resolution and a large screen.

The display portion of the electronic device of one embodiment of the present invention can display, for example, an image with a resolution of full high definition, 4K2K, 8K4K, 16K8K, or more.

Examples of electronic devices include electronic devices having relatively large screens, such as a television device, a laptop personal computer, a monitor, digital signage, a pachinko machine, and a game machine; a digital camera; a digital video camera; a digital photo frame; a mobile phone; a portable game console; a portable information terminal; an audio reproducing device; and the like.

The electronic device using one embodiment of the present invention can be incorporated along a flat surface or a curved surface of an inside wall or an outside wall of a house or a building, an interior or an exterior of a car, or the like.

Figure 21A:
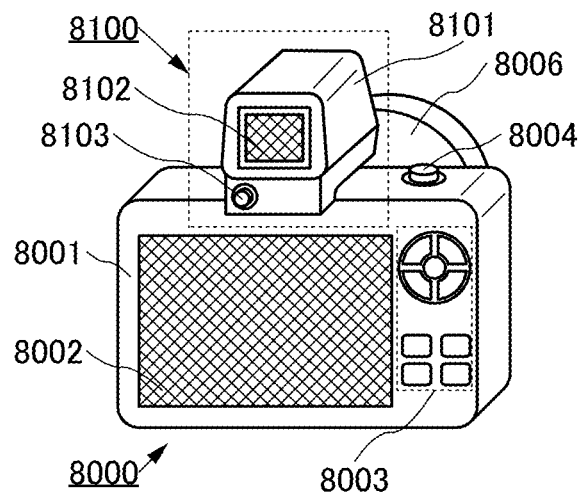
FIG. 21A to FIG. 21E show structure examples of electronic devices.

FIG. 21A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000.

Note that the lens 8006 may be included in the housing of the camera 8000.

Images can be taken with the camera 8000 at the press of the shutter button 8004 or the touch of the display portion 8002 functioning as a touch panel.

The housing 8001 includes a mount including an electrode, so that the finder 8100, a stroboscope, or the like can be connected.

The finder 8100 includes a housing 8101, a display portion 8102, a button 8103, and the like.

The housing 8101 is attached to the camera 8000 by a mount for engagement with the mount of the camera 8000. In the finder 8100, an image or the like received from the camera 8000 can be displayed on the display portion 8102.

The button 8103 has a function of a power supply button and the like.

A display device of one embodiment of the present invention can be used in the display portion 8002 of the camera 8000 and the display portion 8102 of the finder 8100.

Note that a finder may be incorporated in the camera 8000.

Figure 21B:
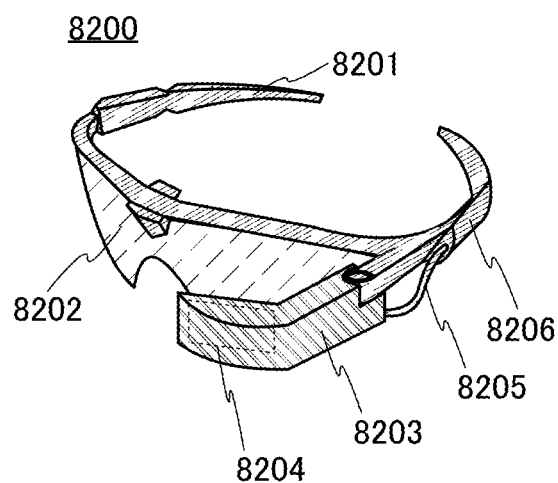

FIG. 21B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive image data and display it on the display portion 8204. The main body 8203 includes a camera, and information on the movement of the eyeballs or the eyelids of the user can be used as an input means.

The mounting portion 8201 may include a plurality of electrodes capable of sensing current flowing with the movement of the user's eyeball at a position in contact with the user to achieve a function of recognizing the user's sight line. The mounting portion 8201 may have a function of monitoring the user's pulse with the use of current flowing in the electrodes. The mounting portion 8201 may include various kinds of sensors such as a temperature sensor, a pressure sensor, and an acceleration sensor to achieve a function of displaying the user's biological information on the display portion 8204 and a function of changing an image displayed on the display portion 8204 in accordance with the movement of the user's head.

A display device of one embodiment of the present invention can be used in the display portion 8204.

Figure 21C:
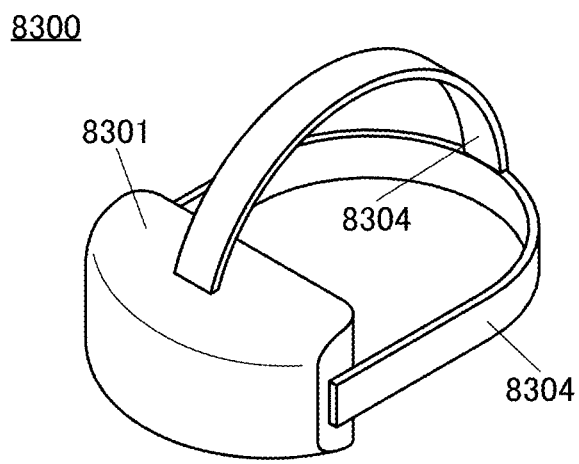
Figure 21D:
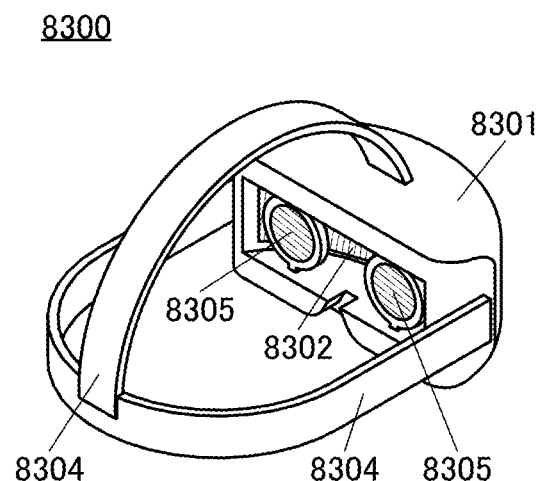
Figure 21E:
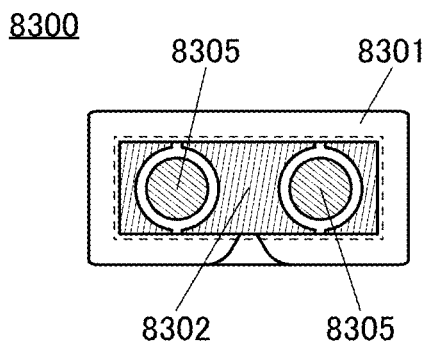

FIG. 21C to FIG. 21E are external views of a head-mounted display 8300. The head-mounted display 8300 includes a housing 8301, a display portion 8302, a fixing band 8304, and a pair of lenses 8305.

A user can see display on the display portion 8302 through the lenses 8305.

Note that the display portion 8302 is preferably curved because the user can feel a high realistic sensation. Another image displayed in another region of the display portion 8302 is viewed through the lenses 8305, so that three-dimensional display using parallax or the like can be performed. Note that the number of the display portions 8302 is not limited to one; two display portions 8302 may be provided for user's respective eyes.

Note that a display device of one embodiment of the present invention can be used in the display portion 8302. A display device including a semiconductor device of one embodiment of the present invention has an extremely high resolution; thus, even when an image is magnified using the lenses 8305 as illustrated in FIG. 21E, the user does not perceive pixels, and thus a more realistic image can be displayed.

Electronic devices illustrated in FIG. 22A to FIG. 22G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIG. 22A to FIG. 22G have a variety of functions. For example, the electronic devices can have a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of reading a program or data stored in a storage medium and processing the program or data, and the like. Note that the electronic devices can have a variety of functions without limitation to the above. The electronic devices may each include a plurality of display portions. The electronic devices may each be provided with a camera or the like and have a function of taking a still image or a moving image, a function of storing the taken image in a storage medium (an external memory medium or a memory medium incorporated in the camera), a function of displaying the taken image on the display portion, or the like.

The electronic devices in FIG. 22A to FIG. 22G are described in detail below.

Figure 22A:
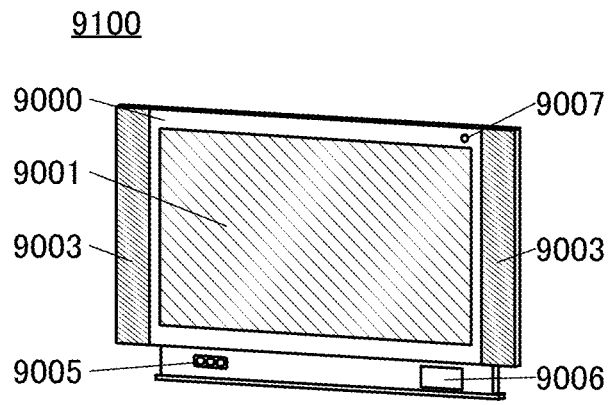
FIG. 22A to FIG. 22G show structure examples of electronic devices.

FIG. 22A is a perspective view illustrating a television device 9100. The television device 9100 can include the display portion 9001 having a large screen size of, for example, 50 inches or more, or 100 inches or more.

Figure 22D:
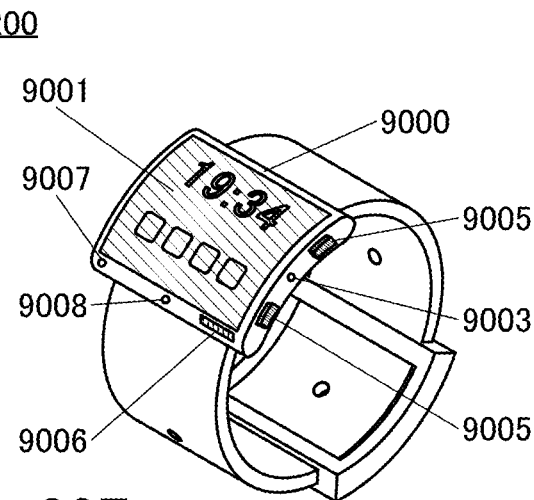
Figure 22B:
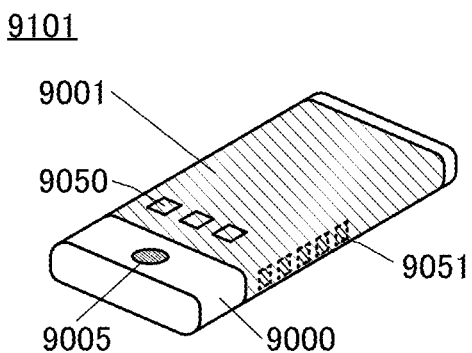

FIG. 22B is a perspective view of a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. In the example shown in FIG. 22B, three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed at the position where the information 9051 is displayed.

Figure 22E:
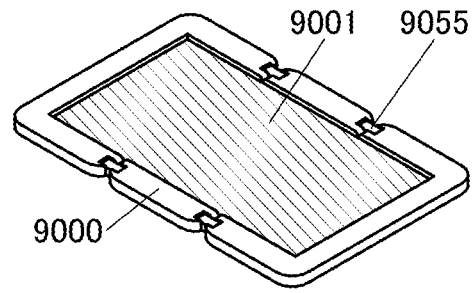
Figure 22C:
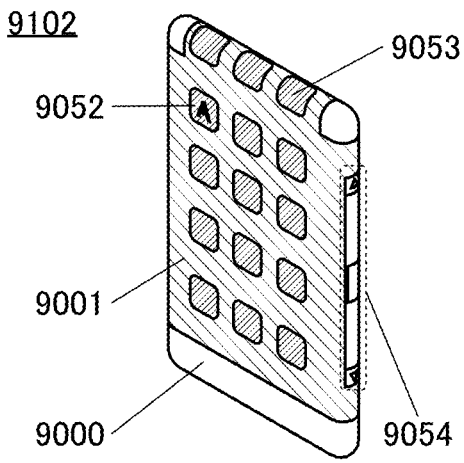

FIG. 22C is a perspective view of a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be seen from above the portable information terminal 9102, with the portable information terminal 9102 put in a breast pocket of his/her clothes. The user can see the display without taking out the portable information terminal 9102 from the pocket and decide whether to answer the call, for example.

FIG. 22D is a perspective view of a watch-type portable information terminal 9200. For example, the portable information terminal 9200 can be used as a smartwatch. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. The connection terminal 9006 of the portable information terminal 9200 allows mutual data transmission with another information terminal and charging. Note that the charging operation may be performed by wireless power feeding.

Figure 22F:
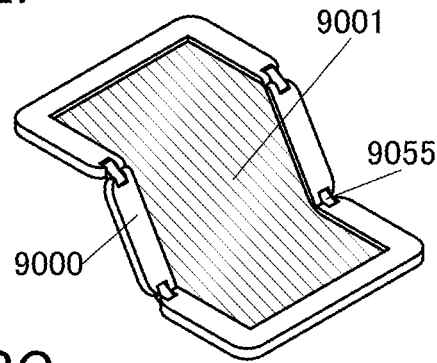
Figure 22G:
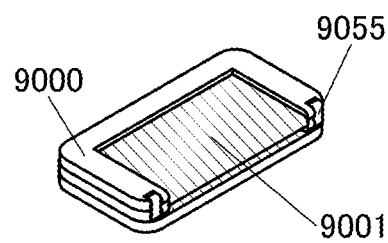

FIG. 22E to FIG. 22G are perspective views of a foldable portable information terminal 9201. FIG. 22E is a perspective view illustrating the portable information terminal 9201 that is opened. FIG. 22G is a perspective view illustrating the portable information terminal 9201 that is folded. FIG. 22F is a perspective view illustrating the portable information terminal 9201 that is shifted from one of the states in FIG. 22E and FIG. 22G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. For example, the display portion 9001 can be bent with a radius of curvature of greater than or equal to 1 mm and less than or equal to 150 mm.

Figure 23A:
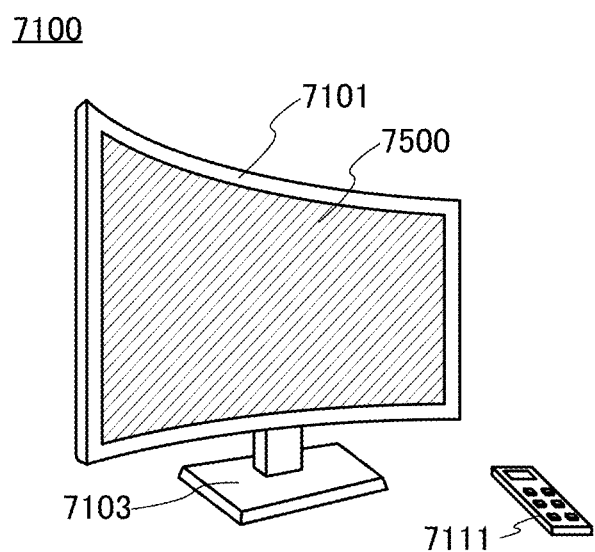
FIG. 23A to FIG. 23D show structure examples of electronic devices.

FIG. 23A illustrates an example of a television device. In a television device 7100, a display portion 7500 is incorporated in a housing 7101. Here, the housing 7101 is supported by a stand 7103.

The television device 7100 illustrated in FIG. 23A can be operated with an operation switch provided in the housing 7101 or a separate remote controller 7111. Alternatively, a touch panel may be used in the display portion 7500 so that the television device 7100 can be operated by touching the touch panel. The remote controller 7111 may be provided with a display portion in addition to operation buttons.

Note that the television device 7100 may include a television receiver and a communication device for a network connection.

Figure 23B:
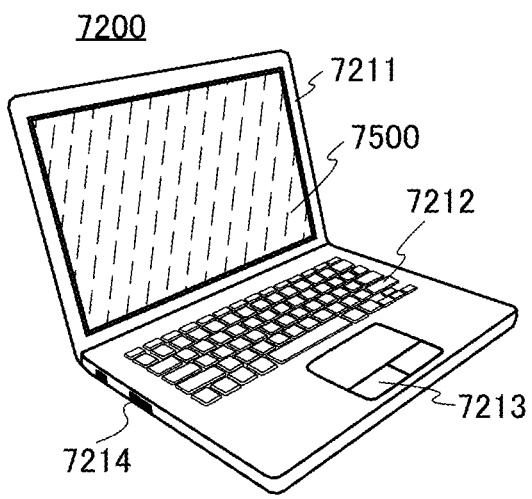

FIG. 23B illustrates a laptop personal computer 7200. The laptop personal computer 7200 includes a housing 7211, a keyboard 7212, a pointing device 7213, an external connection port 7214, and the like. In the housing 7211, the display portion 7500 is incorporated.

Figure 23C:
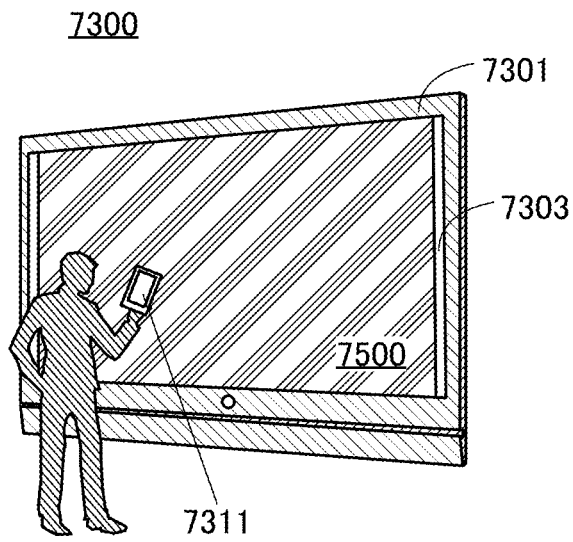
Figure 23D:
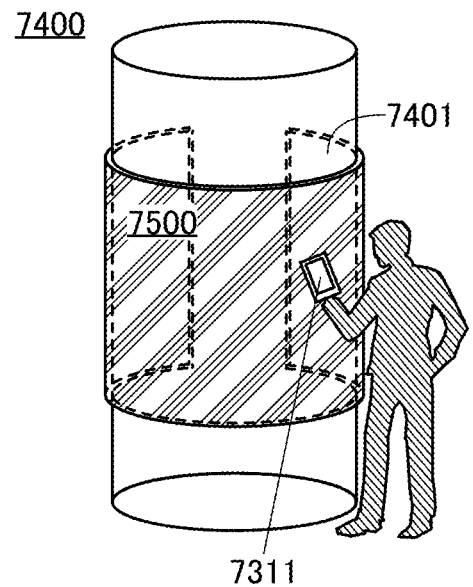

FIG. 23C and FIG. 23D illustrate examples of digital signage.

A digital signage 7300 illustrated in FIG. 23C includes a housing 7301, the display portion 7500, a speaker 7303, and the like. The digital signage 7300 can also include an LED lamp, an operation key (including a power switch or an operation switch), a connection terminal, a variety of sensors, a microphone, and the like.

FIG. 23D illustrates a digital signage 7400 mounted on a cylindrical pillar 7401. The digital signage 7400 includes the display portion 7500 provided along a curved surface of the pillar 7401.

The larger display portion 7500 can provide a larger amount of information at a time and attract more attention, so that the effectiveness of advertisement can be increased, for example.

A touch panel is preferably used in the display portion 7500 so that the user can operate the digital signage. Thus, the digital signage can be used for not only advertising but also providing information that the user needs, such as route information, traffic information, and an information map of a commercial facility.

Furthermore, as illustrated in FIG. 23C and FIG. 23D, it is preferable that the digital signage 7300 or the digital signage 7400 be capable of working with an information terminal 7311 such as a user's smartphone through wireless communication. For example, information of the advertisement displayed on the display portion 7500 can also be displayed on a screen of the information terminal 7311, or display on the display portion 7500 can be switched by operating the information terminal 7311.

Furthermore, it is possible to make the digital signage 7300 or the digital signage 7400 execute a game with the use of the information terminal 7311 as an operation means (controller). Thus, an unspecified number of users can join in and enjoy the game concurrently.

A display device of one embodiment of the present invention can be used in each of the display portions 7500 in FIG. 23A to FIG. 23D.

The electronic devices of this embodiment each include a display portion; however, one embodiment of the present invention can also be used in an electronic device without a display portion.

At least part of this embodiment can be implemented in combination with the other embodiments described in this specification as appropriate.

Embodiment 9

In this embodiment, an example of a semiconductor device using a metal oxide of one embodiment of the present invention will be described.

Structure Example of Semiconductor Device

Figure 24A:
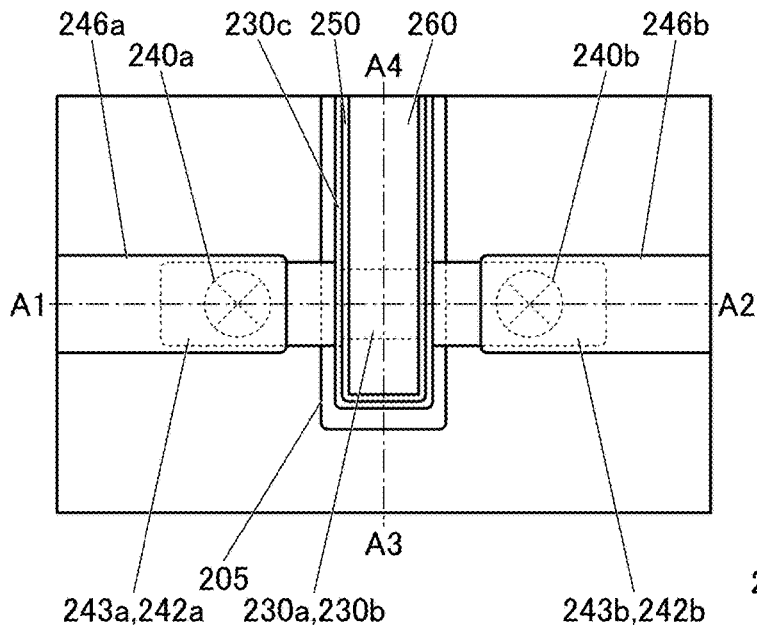
FIG. 24A is a top view of a semiconductor device.
Figure 24C:
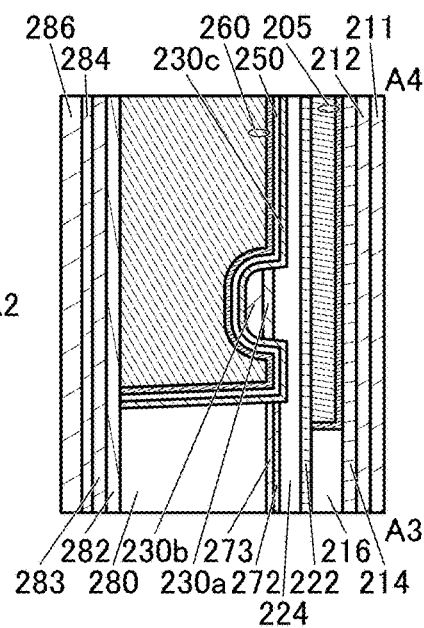
FIG. 24B and FIG. 24C are cross-sectional views of the semiconductor device.
Figure 24B:
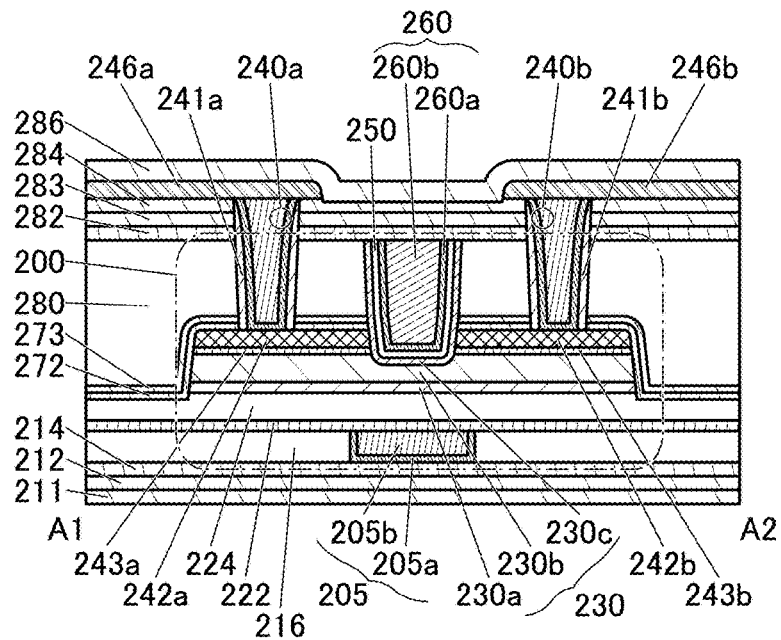

FIG. 24A to FIG. 24C are a top view and cross-sectional views of a semiconductor device including the transistor 200. FIG. 24A is a top view of the semiconductor device. FIG. 24B and FIG. 24C are cross-sectional views of the semiconductor device. Here, FIG. 24B is a cross-sectional view of a portion indicated by the dashed-dotted line A1-A2 in FIG. 24A, and is a cross-sectional view in the channel length direction of the transistor 200. FIG. 24C is a cross-sectional view of a portion indicated by the dashed-dotted line A3-A4 in FIG. 24A, and is a cross-sectional view of the transistor 200 in the channel width direction. Note that for clarity of the drawing, some components are not illustrated in the top view of FIG. 24A.

The semiconductor device of one embodiment of the present invention includes an insulator 211 over a substrate (not illustrated), an insulator 212 over the insulator 211, an insulator 214 over the insulator 212, the transistor 200 over the insulator 214, an insulator 280 over the transistor 200, an insulator 282 over the insulator 280, an insulator 283 over the insulator 282, and an insulator 284 over the insulator 283. The insulator 211, the insulator 212, the insulator 214, the insulator 280, the insulator 282, the insulator 283, and the insulator 284 function as interlayer films. A conductor 240*a* and a conductor 240*b* which are electrically connected to the transistor 200 and function as a plug are also included. Note that an insulator 241*a* is provided in contact with a side surface of the conductor 240*a* and an insulator 241*b* is provided in contact with a side surface of the conductor 240*b*. A conductor 246*a* that is electrically connected to the conductor 240*a* and functions as a wiring is provided over the insulator 284 and the conductor 240*a*, and a conductor 246*b* that is electrically connected to the conductor 240*b* and functions as a wiring is provided over the insulator 284 and the conductor 240*b*. An insulator 286 is provided over the conductor 246*a*, the conductor 246*b*, and the insulator 284.

The insulator 241*a* is provided in contact with the inner wall of an opening in an insulator 272, an insulator 273, the insulator 280, the insulator 282, the insulator 283, and the insulator 284; a first conductor of the conductor 240*a* is provided in contact with a side surface of the insulator 241*a*; and a second conductor of the conductor 240*a* is provided on the inner side thereof. The insulator 241*b* is provided in contact with the inner wall of an opening in the insulator 272, the insulator 273, the insulator 280, the insulator 282, the insulator 283, and the insulator 284; a first conductor of the conductor 240*b* is provided in contact with a side surface of the insulator 241*b*; and a second conductor of the conductor 240*b* is provided on the inner side thereof. Here, the level of top surfaces of the conductor 240*a* and the conductor 240*b* and the level of a top surface of the insulator 284 in regions overlapping with the conductor 246*a* and the conductor 246*b* can be substantially the same. Note that although the transistor 200 has a structure in which the first conductor of the conductor 240*a* and the second conductor of the conductor 240*a* are stacked and the first conductor of the conductor 240*b* and the second conductor of the conductor 240*b* are stacked, the present invention is not limited thereto. For example, each of the conductor 240*a* and the conductor 240*b* may be provided as a single layer or to have a stacked-layer structure of three or more layers. In the case where a structure body has a stacked-layer structure, layers may be distinguished by ordinal numbers corresponding to the formation order.

[Transistor 200]

As illustrated in FIG. 24A to FIG. 24C, the transistor 200 includes an insulator 216 over the insulator 214; a conductor 205 (a conductor 205*a* and a conductor 205*b*) disposed so as to be embedded in the insulator 214 and/or the insulator 216; an insulator 222 over the insulator 216 and the conductor 205; an insulator 224 over the insulator 222; an oxide 230*a* over the insulator 224; an oxide 230*b* over the oxide 230*a*; an oxide 243*a*, an oxide 243*b*, and an oxide 230*c* over the oxide 230*b*; an insulator 250 over the oxide 230*c*; a conductor 260 (a conductor 260*a* and a conductor 260*b*) over the insulator 250; an oxide 242*a* over the oxide 243*a*; a conductor 242*b* over the oxide 243*b*; an insulator 272 in contact with part of a top surface of the insulator 224, a side surface of the oxide 230*a*, a side surface of the oxide 230*b*, part of a side surface of the oxide 243*a*, part of a side surface of the oxide 243*b*, part of a side surface of the conductor 242*a*, a top surface of the conductor 242*a*, part of a side surface of the conductor 242*b*, and a top surface of the conductor 242*b*; and an insulator 273 over the insulator 272.

Here, as illustrated in FIG. 24B and FIG. 24C, the oxide 230*c* is in contact with the side surface of the conductor 242*a* and the side surface of the conductor 242*b*. A top surface of the conductor 260 is substantially aligned with a top surface of the insulator 250 and a top surface of the oxide 230*c*. The insulator 282 is in contact with the top surfaces of the conductor 260, the insulator 250, the oxide 230*c*, and the insulator 280.

An opening reaching the oxide 230*b* is provided in the insulator 280, the insulator 273, and the insulator 272. The oxide 230*c*, the insulator 250, and the conductor 260 are provided in the opening In addition, in the channel length direction of the transistor 200, the conductor 260, the insulator 250, and the oxide 230*c* are provided between the conductor 242*a* and the conductor 242*b*. The insulator 250 includes a region overlapping with a side surface of the conductor 260 and a region overlapping with a bottom surface of the conductor 260. The oxide 230*c* includes a region in contact with the oxide 230*b*, a region overlapping with the side surface of the conductor 260 with the insulator 250 therebetween, and a region overlapping with the bottom surface of the conductor 260 with the insulator 250 therebetween.

The oxide 230 preferably includes the oxide 230*a* positioned over the insulator 224, the oxide 230*b* positioned over the oxide 230a, and the oxide 230c that is positioned over the oxide 230b and is at least partly in contact with the oxide 230b. The oxide 230a included below the oxide 230b can inhibit diffusion of impurities into the oxide 230b from the components formed below the oxide 230a. Moreover, the oxide 230c included over the oxide 230b can inhibit diffusion of impurities into the oxide 230b from the components formed above the oxide 230c.

Although the oxide 230 in the transistor 200 has a three-layer stacked structure of the oxide 230a, the oxide 230b, and the oxide 230c, the present invention is not limited thereto. For example, the oxide 230 may be a single layer of the oxide 230b or may have a two-layer structure of the oxide 230a and the oxide 230b, a two-layer structure of the oxide 230b and the oxide 230c, or a stacked-layer structure of four or more layers. Alternatively, one or more of the oxide 230a, the oxide 230b, and the oxide 230c may each have a stacked-layer structure.

One or more of the oxide 230a, the oxide 230b, and the oxide 230c function as a channel formation region. The metal oxide described in Embodiment 1 as an example can be used as one or more of the oxide 230a, the oxide 230b, and the oxide 230c.

In a cross-sectional view of the transistor 200 in the channel length direction, it is preferable that a groove portion be provided in the oxide 230b and the oxide 230c be embedded in the groove portion in the transistor 200. At this time, the oxide 230c is provided to cover an inner wall (a side wall and a bottom surface) of the groove portion. The thickness of the oxide 230c is preferably substantially equal to the depth of the groove portion.

Typically, the depth of the groove portion is greater than 0 nm and less than or equal to 10 nm, preferably greater than or equal to 1 nm and less than or equal to 7 nm, and further preferably greater than or equal to 2 nm and less than or equal to 5 nm.

The thickness (film thickness) of the oxide 230c in a region overlapping with the groove portion and the conductor 260 is typically greater than or equal to 0.5 nm and less than or equal to 7 nm, preferably greater than or equal to 1 nm and less than or equal to 5 nm, further preferably greater than or equal to 2 nm and less than or equal to 4 nm.

Note that a main carrier path may be the oxide 230b, the oxide 230c, or an interface between the oxide 230b and the oxide 230c and the vicinity thereof, depending on the depth of the groove portion provided in the oxide 230b.

Here, the conduction band minimum of the oxide 230b is preferably farther from the vacuum level than the conduction band minimum of the oxide 230a. In other words, the electron affinity of the oxide 230b is preferably larger than the electron affinity of the oxide 230a. It is preferable that the conduction band minimum of the oxide 230c be closer to the vacuum level than the conduction band minimum of the oxide 230b or substantially equal to the conduction band minimum of the oxide 230b. In other words, it is preferable that the electron affinity of the oxide 230c be larger than or substantially equal to the electron affinity of the oxide 230b. At this time, the oxide 230b, the oxide 230c, or the interface between the oxide 230b and the oxide 230c and the vicinity thereof serve as a main carrier path.

The on-state current, the field-effect mobility, or the like of the transistor can be increased by increasing the proportion of indium in the metal oxide, and the composition of the oxide 230 may be adjusted as appropriate depending on the depth of the groove portion provided in the oxide 230b, the structure of the transistor 200, or the like. For example, in order to make the oxide 230c serve as a main carrier path, the atomic ratio of indium to a metal element that is a main component in the oxide 230c is preferably higher than the atomic ratio of indium to a metal element that is a main component in the oxide 230b.

With the above structure, an effective channel length can be substantially the same as the channel length in a planar view of the transistor. Accordingly, the transistor can have high on-state current and high field-effect mobility. Therefore, a semiconductor device with high on-state current can be provided.

Furthermore, with the above structure, impurities in the vicinity of a top surface of the oxide 230b can be removed, low-resistance regions in the vicinity of the top surface of the oxide 230b can be reduced, and leakage current (parasitic channel) between a source electrode and a drain electrode of the transistor can be prevented from occurring. Accordingly, a semiconductor device having favorable electrical characteristics can be provided. Furthermore, a semiconductor device with less variations in transistor characteristics and high reliability can be provided.

The oxide 230b and the oxide 230c preferably have crystallinity. An oxide having crystallinity has a dense structure with small amounts of impurities and defects (e.g., oxygen vacancies) and high crystallinity. This can inhibit oxygen extraction from the oxide 230 by the source electrode or the drain electrode. Accordingly, oxygen extraction from the oxide 230 can be reduced even when heat treatment is performed; thus, the transistor 200 is stable against high temperatures in a manufacturing process (what is called thermal budget).

For the oxide 230c, a CAAC-OS may be used; the c-axis of a crystal included in the oxide 230c may be aligned in a direction substantially perpendicular to the formation surface or the top surface of the oxide 230c. The CAAC-OS has a property of making oxygen move easily in the direction perpendicular to the c-axis. Thus, oxygen contained in the oxide 230c can be efficiently supplied to the oxide 230b.

Note that in the case where an In-M-Zn oxide with a small content of the element M or zinc is used as the oxide 230, the crystallinity of the oxide 230 may be low. The In-M-Zn oxide film with a small content of the element M or zinc becomes a polycrystalline film in some cases by increasing the crystallinity. The polycrystalline film includes a crystal grain boundary, and the crystal grain boundary serves as a defect state to be a carrier trap or a carrier generation source in some cases. Accordingly, a transistor using a polycrystalline In-M-Zn oxide has electrical characteristics which vary largely and low reliability in some cases.

The conduction band minimum preferably gradually changes at a junction portion of the oxide 230a, the oxide 230b, and the oxide 230c. In other words, the conduction band minimum at the junction portion of the oxide 230a, the oxide 230b, and the oxide 230c continuously changes or is continuously connected. To achieve this, the density of defect states in a mixed layer formed at the interface between the oxide 230a and the oxide 230b and the interface between the oxide 230b and the oxide 230c is preferably made low.

Specifically, when the oxide 230a and the oxide 230b or the oxide 230b and the oxide 230c contain the same element as a main component in addition to oxygen, a mixed layer with a low density of defect states can be formed. For example, in the case where the oxide 230b is an In-M-Zn oxide, an In-M-Zn oxide, an M-Zn oxide, an oxide of the element M, an In—Zn oxide, an indium oxide, or the like may be used as the oxide 230a and the oxide 230c.

The oxide 230 preferably has a stacked-layer structure of a plurality of oxide layers with different chemical compositions. Specifically, the atomic ratio of the element M to the metal element as the main component in the metal oxide used as the oxide 230a is preferably greater than the atomic ratio of the element M to the metal element as the main component in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a.

More specifically, as the oxide 230a, a metal oxide having In:M:Zn=1:3:4 [atomic ratio] or a composition in the vicinity thereof, or In:M:Zn=1:1:0.5 [atomic ratio] or a composition in the vicinity thereof is used. As the oxide 230b, a metal oxide having In:M:Zn=1:1:1 [atomic ratio] or a composition in the vicinity thereof, In:M:Zn=4:2:3 [atomic ratio] or a composition in the vicinity thereof, In:M:Zn=5:1:3 [atomic ratio] or a composition in the vicinity thereof, or In:M:Zn=10:1:3 [atomic ratio] or a composition in the vicinity thereof, or an In—Zn oxide may be used. As the oxide 230c, a metal oxide that can be used as the oxide 230a or the oxide 230b may be used. Note that a composition in the vicinity includes ±30% of an intended atomic ratio. Gallium is preferably used as the element M.

When the oxide 230a, the oxide 230b, and the oxide 230c have the above structures, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and excellent frequency characteristics.

The oxide 230c may have a stacked-layer structure of two or more layers. For example, in the case where the oxide 230c has a two-layer stacked structure, the oxide 230c positioned on the insulator 250 side (also referred to as an upper layer of the oxide 230c) preferably contains at least one metal element included in a metal oxide used for the oxide 230c positioned on the oxide 230b side (also referred to as a lower layer of the oxide 230c), and further preferably contains all of the metal elements. For example, an In-M-Zn oxide, an In—Zn oxide, or indium oxide is preferably used as the lower layer of the oxide 230c, and an In-M-Zn oxide, an M-Zn oxide, or an oxide of the element M is preferably used as the upper layer of the oxide 230c. Accordingly, the density of defect states at an interface between the lower layer of the oxide 230c and the upper layer of the oxide 230c can be low.

The conduction band minimum of the upper layer of the oxide 230c is preferably closer to the vacuum level than the conduction band minimum of the lower layer of the oxide 230c. In other words, the electron affinity of the upper layer of the oxide 230c is preferably smaller than the electron affinity of the lower layer of the oxide 230c. In that case, the metal oxide that can be used as the oxide 230a or the oxide 230b is preferably used for the upper layer of the oxide 230c. In that case, a main carrier path is the oxide 230b, the lower layer of the oxide 230c, or the interface between the oxide 230b and the lower layer of the oxide 230c and the vicinity thereof.

Specifically, a metal oxide having In:M:Zn=5:1:3 [atomic ratio] or a composition in the vicinity thereof, a metal oxide having In:M:Zn=10:1:3 [atomic ratio] or a composition in the vicinity thereof, or an In—Zn oxide may be used for the lower layer of the oxide 230c; a metal oxide having In:M:Zn=1:3:4 [atomic ratio] or a composition in the vicinity thereof, a metal oxide having M:Zn=2:1 [atomic ratio] or a composition in the vicinity thereof, a metal oxide having M:Zn=2:5 [atomic ratio] or a composition in the vicinity thereof, or an oxide of the element M may be used for the upper layer of the oxide 230c.

The upper layer of the oxide 230c is preferably a metal oxide that inhibits diffusion or passage of oxygen from the lower layer of the oxide 230c. Providing the upper layer of the oxide 230c between the insulator 250 and the lower layer of the oxide 230c can inhibit diffusion of oxygen contained in the insulator 280 into the insulator 250. Thus, the oxygen can be efficiently supplied to the oxide 230b through the lower layer of the oxide 230c.

When the atomic ratio of In to the metal element as the main component in the metal oxide used for the upper layer of the oxide 230c is smaller than the atomic ratio of In to the metal element as the main component in the metal oxide used for the lower layer of the oxide 230c, diffusion of In to the insulator 250 side can be inhibited. Since the insulator 250 functions as a gate insulator, the transistor exhibits poor characteristics when In enters the insulator 250 or the like. Thus, when the upper layer of the oxide 230c is provided between the lower layer of the oxide 230c and the insulator 250, a semiconductor device with high reliability can be provided.

Note that layers having different crystallinity may be used for the lower layer of the oxide 230c and the upper layer of the oxide 230c.

The oxide 230c may be provided for each of the transistors 200. That is, the oxide 230c of the transistor 200 and the oxide 230c of another transistor 200 adjacent to the transistor 200 are not necessarily in contact with each other. Furthermore, the oxide 230c of the transistor 200 and the oxide 230c of the adjacent transistor 200 may be apart from each other. In other words, a structure in which the oxide 230c is not positioned between the adjacent transistors 200 may be employed.

In the semiconductor device where the plurality of transistors 200 are provided in the channel width direction and the above structure is employed, the oxide 230c is individually provided for each of the transistors 200. Accordingly, the formation of a parasitic transistor between the adjacent transistors 200 is inhibited, and the generation of the leakage path can be inhibited. Therefore, a semiconductor device that has favorable electrical characteristics and can be miniaturized or highly integrated can be provided.

Note that each of the conductors 260 and each of the insulators 250 may be shared by the adjacent transistors 200. That is, the conductor 260 of the transistor 200 includes a region continuous with the conductor 260 of the adjacent transistor 200. The insulator 250 of the transistor 200 includes a region continuous with the insulator 250 of the adjacent transistor 200. In addition, the insulator 250 includes a region in contact with the insulator 224 between the adjacent transistors 200.

Note that in the case where the oxide 230c has a two-layer stacked structure, the lower layer of the oxide 230c and the upper layer of the oxide 230c in the transistor 200 may be apart from the lower layer of the oxide 230c and the upper layer of the oxide 230c in the adjacent transistor 200, or a structure in which the lower layer of the oxide 230c in the transistor 200 and the lower layer of the oxide 230c in the adjacent transistor 200 are apart from each other and the upper layer of the oxide 230c in the transistor 200 includes a region continuous with the upper layer of the oxide 230c in the adjacent transistor 200 may be employed. At this time, the upper layer of the oxide 230c includes a region in contact with the insulator 224 between the adjacent transistors 200.

The insulator 211, the insulator 212, the insulator 214, the insulator 272, the insulator 273, the insulator 282, the insulator 283, the insulator 284, and the insulator 286 preferably function as barrier insulating films that inhibit impurities such as water and hydrogen from diffusing into the transistor 200 from the substrate side or from above the transistor 200. Thus, for each of the insulator 211, the insulator 212, the insulator 214, the insulator 272, the insulator 273, the insulator 282, the insulator 283, the insulator 284, and the insulator 286, an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities are less likely to pass) is preferably used. Alternatively, it is preferable to use an insulating material having a function of inhibiting diffusion of oxygen (e.g., at least one of an oxygen atom, an oxygen molecule, and the like) (through which the above oxygen is less likely to pass).

For example, a silicon nitride or the like is preferably used for the insulator 211, the insulator 212, the insulator 283, and the insulator 284, and aluminum oxide or the like is preferably used for the insulator 214, the insulator 272, the insulator 273, and the insulator 282. Accordingly, impurities such as water and hydrogen can be inhibited from being diffused to the transistor 200 side from the substrate side through the insulator 211, the insulator 212 and the insulator 214. Alternatively, oxygen contained in the insulator 224 or the like can be inhibited from being diffused to the substrate side through the insulator 211, the insulator 212, and the insulator 214. Furthermore, impurities such as water and hydrogen can be inhibited from being diffused into the transistor 200 side from the insulator 280, the conductor 246a, the conductor 246b, and the like, which are placed above the insulator 273, through the insulator 272 and the insulator 273. In this manner, the transistor 200 is preferably surrounded by the insulator 211, the insulator 212, the insulator 214, the insulator 272, the insulator 273, the insulator 282, the insulator 283, and the insulator 284 having a function of inhibiting diffusion of oxygen and impurities such as water and hydrogen.

The resistivities of the insulator 211 the insulator 284, and the insulator 286 are preferably low in some cases. For example, by setting the resistivities of the insulator 211, the insulator 284, and the insulator 286 to approximately $1\times10^{13}$ Ωcm, the insulator 211, the insulator 284, and the insulator 286 can sometimes reduce charge up of the conductor 205, the conductor 242a, the conductor 242b, the conductor 260, the conductor 246a, or the conductor 246b in treatment using plasma or the like in the manufacturing process of a semiconductor device. The resistivities of the insulator 211, the insulator 284, and the insulator 286 are preferably higher than or equal to $1\times10^{10}$ Ωcm and lower than or equal to $1\times10^{15}$ Ωcm.

Note that the insulator 211 or the insulator 212 is not necessarily provided, and the insulator 283 or the insulator 284 is not necessarily provided. This applies to, for example, the case where the insulator 212 and the insulator 284 are deposited by a chemical vapor deposition (CVD) method using a compound gas which does not contain a hydrogen atom or whose hydrogen atom content is small.

The insulator 216 and the insulator 280 preferably have a lower dielectric constant than the insulator 214. When a material with a low dielectric constant is used for the interlayer film, the parasitic capacitance generated between wirings can be reduced. For example, a silicon oxide, a silicon oxynitride, a silicon nitride oxide, a silicon nitride, a silicon oxide to which fluorine is added, a silicon oxide to which carbon is added, a silicon oxide to which carbon and nitrogen are added, or a porous silicon oxide is used as appropriate for the insulator 216 and the insulator 280. In particular, a silicon oxide and a silicon oxynitride, which have thermal stability, are preferable. Materials such as a silicon oxide, a silicon oxynitride, and a porous silicon oxide are particularly preferable because a region containing oxygen released by heating can be easily formed.

The insulator 212, the insulator 214, the insulator 216, the insulator 222, the insulator 224, the insulator 272, the insulator 273, the insulator 280, and the insulator 282 may be patterned, and the insulator 283 and the insulator 284 may cover the insulator 212, the insulator 214, the insulator 216, the insulator 222, the insulator 224, the insulator 272, the insulator 273, the insulator 280, and the insulator 282. That is, the insulator 283 is in contact with a top surface and a side surface of the insulator 282, a side surface of the insulator 280, a side surface of the insulator 273, a side surface of the insulator 272, a side surface of the insulator 224, a side surface of the insulator 222, a side surface of the insulator 216, a side surface of the insulator 214, a side surface of the insulator 212, and a top surface of the insulator 211, and the insulator 284 is in contact with a top surface and a side surface of the insulator 283. Accordingly, the insulator 212, the insulator 214, the insulator 216, the insulator 222, the insulator 224, the insulator 272, the insulator 273, the insulator 280, and the insulator 282 in addition to the oxide 230 and the like are isolated from the outside by the insulator 283, the insulator 284, and the insulator 211. In other words, the transistor 200 is positioned in a region sealed by the insulator 283, the insulator 284, and the insulator 211.

For example, the insulator 212, the insulator 214, and the insulator 282 are preferably formed using a material having a function of trapping and fixing hydrogen, and the insulator 211, the insulator 283, and the insulator 284 are preferably formed using a material having a function of suppressing diffusion of hydrogen and oxygen. For the insulator 212, the insulator 214, and the insulator 282, an aluminum oxide can be used typically. For the insulator 211, the insulator 283, and the insulator 284, a silicon nitride can be used typically.

With the above structure, entry of hydrogen contained in a region outside the sealed region into the sealed region can be inhibited.

The structure where the insulator 211, the insulator 283, and the insulator 284 are each provided as a single layer is described; however, the present invention is not limited to this structure. For example, each of the insulator 211, the insulator 283, and the insulator 284 may have a stacked-layer structure of two or more layers.

The conductor 205 is provided to overlap with the oxide 230 and the conductor 260.

As illustrated in FIG. 24A, the conductor 205 is preferably provided to be larger than a region of the oxide 230 that does not overlap with the conductor 242a or the conductor 242b. As illustrated in FIG. 24C, it is particularly preferable that the conductor 205 extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction. Since the above-described structure is included, the channel formation region of the oxide 230 can be electrically surrounded by the electric field of the conductor 260 functioning as the first gate (also referred to as top gate) electrode and the electric field of the conductor 205 functioning as the second gate (also referred to as back gate) electrode. In this specification, a transistor structure in which a channel formation region is electrically surrounded by electric fields of the first gate and the second gate is referred to as a surrounded channel (S-channel) structure.

In this specification and the like, the S-channel structure refers to a transistor structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the conductor 260 functions as a first gate electrode and the conductor 205 functions as a second gate electrode, by changing a potential applied to the conductor 205 not in conjunction with but independently of a potential applied to the conductor 260, the threshold voltage (Vth) of the transistor 200 can be adjusted. In particular, by applying a negative potential to the conductor 205, Vth of the transistor 200 can be further increased, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

Furthermore, as shown in FIG. 24C, the conductor 205 extends to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Although the transistor 200 having a structure in which the conductor 205 has a stacked structure of the conductor 205a and the conductor 205b is illustrated, the present invention is not limited thereto. For example, the conductor 205 may have a single-layer structure or a stacked-layer structure of three or more layers.

Here, for the conductor 205a, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom is preferably used. Alternatively, it is preferable to use a conductive material having a function of inhibiting diffusion of oxygen (e.g., at least one of oxygen atoms, oxygen molecules, and the like).

When a conductive material having a function of inhibiting oxygen diffusion is used for the conductor 205a, the conductivity of the conductor 205b can be inhibited from being lowered because of oxidation. As a conductive material having a function of inhibiting diffusion of oxygen, for example, tantalum, a tantalum nitride, ruthenium, or a ruthenium oxide is preferably used. Thus, the conductor 205a is a single layer or a stacked layer of the above conductive materials. For example, the conductor 205a may be a stack of tantalum, a tantalum nitride, ruthenium, or a ruthenium oxide and titanium or a titanium nitride.

Moreover, the conductor 205b is preferably formed using a conductive material containing tungsten, copper, or aluminum as its main component. Note that the conductor 205b is illustrated as a single layer but may have a stacked-layer structure, for example, a stack of any of the above conductive materials and titanium or a titanium nitride.

The insulator 222 and the insulator 224 function as a second gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has higher capability of inhibiting diffusion of one or both of hydrogen and oxygen than the insulator 224.

For the insulator 222, an insulator containing an oxide of one or both of aluminum and hafnium, which is an insulating material, is preferably used. In particular, it is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, an aluminum oxide, a bismuth oxide, a germanium oxide, a niobium oxide, a silicon oxide, a titanium oxide, a tungsten oxide, an yttrium oxide, or a zirconium oxide may be added to the above insulator, for example. Alternatively, these insulators may be subjected to nitriding treatment. A stack of a silicon oxide, a silicon oxynitride, or a silicon nitride over these insulators may be used as the insulator 222.

A single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) may be used as the insulator 222. With miniaturization and high integration of transistors, a problem such as leakage current may arise because of a thinner gate insulator. When a high-k material is used for the insulator functioning as a gate insulator, a gate potential during operation of the transistor can be reduced while the physical thickness of the gate insulator is maintained.

It is preferable that oxygen be released from the insulator 224 in contact with the oxide 230 by heating. A silicon oxide, a silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating, in other words, an insulating material including an excess-oxygen region is preferably used. An oxide film that releases oxygen by heating is an oxide film in which the amount of released oxygen converted into oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis is preferably within the range of from 100° C. to 700° C., or from 100° C. to 400° C.

Note that the insulator 222 and the insulator 224 may each have a stacked-layer structure of two or more layers. In such cases, without limitation to a stacked-layer structure formed of the same material, a stacked-layer structure formed of different materials may be employed.

The oxide 243a and the oxide 243b preferably have a function of inhibiting passage of oxygen. It is preferable to dispose the oxide 243a or the oxide 243b having a function of inhibiting passage of oxygen between the oxide 230b and the conductor 242a or the conductor 242b that functions as the source electrode or the drain electrode, in which case the electrical resistance between the oxide 230b and the conductor 242a or the conductor 242b is reduced. Such a structure can improve the electrical characteristics of the transistor 200 and the reliability of the transistor 200.

A metal oxide containing the element M may be used as the oxide 243a and the oxide 243b. In particular, aluminum, gallium, yttrium, or tin is preferably used as the element M. The concentration of the element M in the oxide 243a and the oxide 243b is preferably higher than that in the oxide 230b. Furthermore, gallium oxide may be used as the oxide 243a and the oxide 243b. A metal oxide such as an In-M-Zn oxide may be used as the oxide 243a and the oxide 243b. Specifically, the atomic ratio of the element M to In in the metal oxide used as the oxide 243a and the oxide 243b is preferably greater than the atomic ratio of the element M to In in the metal oxide used as the oxide 230b. The thicknesses of the oxide 243a and the oxide 243b are preferably greater than or equal to 0.5 nm and less than or equal to 5 nm, further preferably greater than or equal to 1 nm and less than or equal to 3 nm, still further preferably greater than or equal to 1 nm and less than or equal to 2 nm. The oxide 243a and the oxide 243b preferably have crystallinity. In the case where the oxide 243a and the oxide 243b have crystallinity, release of oxygen from the oxide 230 can be favorably inhibited. When the oxide 243a and the oxide 243b have a hexagonal crystal structure, for example, release of oxygen from the oxide 230 can be inhibited in some cases.

The conductor 242a and the conductor 242b are provided over the oxide 243a and the oxide 243b, respectively. The conductor 242a and the conductor 242b function as a source electrode and a drain electrode of the transistor 200.

For the conductor 242a and the conductor 242b, for example, a nitride containing tantalum, a nitride containing titanium, a nitride containing molybdenum, a nitride containing tungsten, a nitride containing tantalum and aluminum, a nitride containing titanium and aluminum, or the like is preferably used, and a nitride containing tantalum is particularly preferable. As another example, a ruthenium oxide, a ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

Note that hydrogen contained in the oxide 230b, the oxide 230c, or the like is diffused into the conductor 242a or the conductor 242b in some cases. In particular, when a nitride containing tantalum is used for the conductor 242a and the conductor 242b, hydrogen contained in the oxide 230b, the oxide 230c, or the like is likely to be diffused into the conductor 242a or the conductor 242b, and the diffused hydrogen is bonded to nitrogen contained in the conductor 242a or the conductor 242b in some cases. That is, hydrogen contained in the oxide 230b, the oxide 230c, or the like is absorbed by the conductor 242a or the conductor 242b in some cases.

There is a curved surface between the side surface of the conductor 242a and the top surface of the conductor 242a and between the side surface of the conductor 242b and the top surface of the conductor 242b in some cases. That is, the end portion of the side surface and the end portion of the top surface are curved in some cases. The curvature radius of the curved surface at an end portion of each of the conductor 242a and the conductor 242b is greater than or equal to 3 nm and less than or equal to 10 nm, preferably greater than or equal to 5 nm and less than or equal to 6 nm, for example. When the end portions are not angular, the coverage with films in later deposition steps is improved.

The insulator 272 is provided in contact with top surfaces of the conductor 242a and the conductor 242b and preferably functions as a barrier layer. With this structure, absorption of excess oxygen contained in the insulator 280 by the conductor 242a and the conductor 242b can be inhibited. Furthermore, by inhibiting oxidation of the conductor 242a and the conductor 242b, an increase in the contact resistance between the transistor 200 and a wiring can be inhibited. Consequently, the transistor 200 can have favorable electrical characteristics and reliability.

Thus, the insulator 272 preferably has a function of inhibiting diffusion of oxygen. For example, the insulator 272 preferably has higher capability of inhibiting diffusion of oxygen than the insulator 280. An insulator containing an oxide of one or both of aluminum and hafnium is preferably deposited as the insulator 272, for example. An insulator containing an aluminum nitride may be used as the insulator 272, for example.

In addition, oxygen can be supplied to the insulator 224 at the time of forming the insulator 272 in some cases. The insulator 224 is sealed with the insulator 272 and the insulator 273; thus, oxygen supplied to the insulator 224 is inhibited from diffusing to the outside and can be efficiently supplied to the oxide 230. Moreover, hydrogen in the insulator 224 may be absorbed by the insulator 272 or the insulator 273, which is preferable.

The insulator 250 functions as a first gate insulator. The insulator 250 is preferably positioned in contact with at least part of the oxide 230c. For the insulator 250, a silicon oxide, a silicon oxynitride, a silicon nitride oxide, a silicon nitride, a silicon oxide to which fluorine is added, a silicon oxide to which carbon is added, a silicon oxide to which carbon and nitrogen are added, a porous silicon oxide, or the like can be used. In particular, a silicon oxide and a silicon oxynitride, which have thermal stability, are preferable.

Like the insulator 224, the insulator 250 is preferably formed using an insulator that releases oxygen by heating. When an insulator from which oxygen is released by heating is provided as the insulator 250 in contact with at least part of the oxide 230c, oxygen can be efficiently supplied to the channel formation region of the oxide 230 and oxygen defects in the channel formation region of the oxide 230 can be reduced. Thus, a transistor that has stable electrical characteristics with less variations in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Although the insulator 250 is a single layer in FIG. 24B and FIG. 24C, a stacked-layer structure of two or more layers may be employed. In the case where the insulator 250 has a stacked-layer structure including two layers, it is preferable that a lower layer of the insulator 250 be formed using an insulator from which oxygen is released by heating and an upper layer of the insulator 250 be formed using an insulator having a function of inhibiting diffusion of oxygen. With such a structure, oxygen contained in the lower layer of the insulator 250 can be inhibited from diffusing into the conductor 260. That is, a reduction in the amount of oxygen supplied to the oxide 230 can be inhibited. In addition, oxidation of the conductor 260 due to oxygen from the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where a silicon oxide, a silicon oxynitride, or the like is used for the lower layer of the insulator 250, the upper layer of the insulator 250 may be formed using an insulating material that is a high-k material having a high relative dielectric constant. The gate insulator having a stacked-layer structure of the lower layer of the insulator 250 and the upper layer of the insulator 250 can be thermally stable and can have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used as the upper layer of the insulator 250. Alternatively, the metal oxide that can be used for the oxide 230 can be used. In particular, an insulator containing an oxide of one or both of aluminum and hafnium is preferably used.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. In addition, oxidation of the conductor 260 due to oxygen from the insulator 250 can be inhibited.

The metal oxide preferably has a function of part of the first gate electrode. For example, a metal oxide that can be used for the oxide 230 can be used as the metal oxide. In that case, when the conductor 260a is deposited by a sputtering method, the metal oxide can have a reduced electric resistance value to be a conductor. This can be referred to as an OC (Oxide Conductor) electrode.

With the above metal oxide, the on-state current of the transistor 200 can be increased without a reduction in the influence of the electric field from the conductor 260. Since the distance between the conductor 260 and the oxide 230 is kept by the physical thicknesses of the insulator 250 and the metal oxide, leakage current between the conductor 260 and the oxide 230 can be reduced. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The conductor 260 functions as a first gate electrode of the transistor 200. The conductor 260 preferably includes the conductor 260a and the conductor 260b positioned over the conductor 260a. For example, the conductor 260a is preferably positioned to cover a bottom surface and a side surface of the conductor 260b. Note that although the conductor 260 has a two-layer structure of the conductor 260a and the conductor 260b in FIG. 24B and FIG. 24C, the conductor 260 can have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of oxygen atoms, oxygen molecules, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, a tantalum nitride, ruthenium, or a ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of any of the above conductive materials and titanium or a titanium nitride.

In the transistor 200, the conductor 260 is formed in a self-aligned manner to fill an opening formed in the insulator 280 and the like. The formation of the conductor 260 in this manner allows the conductor 260 to be positioned certainly in a region between the conductor 242a and the conductor 242b without alignment.

As illustrated in FIG. 24C in the channel width direction of the transistor 200, the level of the bottom surface of the conductor 260 in a region where the conductor 260 and the oxide 230b do not overlap with each other is preferably lower than the level of the bottom surface of the oxide 230b. When the conductor 260 functioning as the gate electrode covers the side and top surfaces of the channel formation region of the oxide 230 with the insulator 250 and the like therebetween, the electric field of the conductor 260 is likely to affect the entire channel formation region of the oxide 230. Thus, the on-state current of the transistor 200 can be increased and the frequency characteristics of the transistor 200 can be improved.

The insulator 280 is provided over the insulator 273. In addition, a top surface of the insulator 280 may be planarized.

The concentration of impurities such as water and hydrogen in the insulator 280 is preferably reduced. Moreover, the insulator 280 preferably has a low hydrogen concentration and includes an excess-oxygen region or excess oxygen, and may be formed using a material similar to that for the insulator 216, for example. The insulator 280 may have a stacked-layer structure of the above materials; silicon oxide formed by a sputtering method and a silicon oxynitride formed by a CVD method stacked thereover. Furthermore, a silicon nitride may be stacked thereover.

The insulator 282 or the insulator 283 preferably functions as barrier insulating films that inhibit impurities such as water and hydrogen from diffusing into the insulator 280 from above. The insulator 282 or the insulator 283 preferably functions as barrier insulating films for inhibiting passage of oxygen. As the insulator 282 and the insulator 283, for example, an insulator such as an aluminum oxide, a silicon nitride, or a silicon nitride oxide may be used. The insulator 282 may be formed using an aluminum oxide that has high blocking property against oxygen and the insulator 283 may be formed using a silicon nitride that has high blocking property against hydrogen, for example.

For the conductor 240a and the conductor 240b, a conductive material containing tungsten, copper, or aluminum as its main component is preferably used. The conductor 240a and the conductor 240b may each have a stacked-layer structure.

In the case where the conductor 240a and the conductor 240b have a stacked-layer structure, a conductive material having a function of inhibiting transmission of impurities such as water and hydrogen is preferably used for a conductor in contact with the insulator 284, the insulator 283, the insulator 282, the insulator 280, the insulator 273, and the insulator 272. For example, tantalum, a tantalum nitride, titanium, a titanium nitride, ruthenium, a ruthenium oxide, or the like is preferably used. The conductive material having a function of inhibiting passage of impurities such as water and hydrogen may be used as a single layer or stacked layers. The use of the conductive material can prevent oxygen added to the insulator 280 from being absorbed by the conductor 240a and the conductor 240b. Moreover, impurities such as water and hydrogen contained in a layer above the insulator 284 can be inhibited from entering the oxide 230 through the conductor 240a and the conductor 240b.

For the insulator 241a and the insulator 241b, for example, an insulator such as a silicon nitride, an aluminum oxide, or a silicon nitride oxide may be used. Since the insulator 241a and the insulator 241b are provided in contact with the insulator 273 and the insulator 272, impurities such as water and hydrogen contained in the insulator 280 or the like can be inhibited from entering the oxide 230 through the conductor 240a and the conductor 240b. In particular, a silicon nitride is suitable because of having a high blocking property against hydrogen. In addition, oxygen contained in the insulator 280 can be prevented from being absorbed by the conductor 240a and the conductor 240b.

The conductor 246a functioning as a wiring may be provided in contact with a top surface of the conductor 240a, and the conductor 246b functioning as a wiring may be provided in contact with a top surface of the conductor 240b. The conductor 246a and the conductor 246b are preferably formed using a conductive material containing tungsten, copper, or aluminum as its main component. Furthermore, the conductor may have a stacked-layer structure and may be a stack of titanium or a titanium nitride and any of the above conductive materials, for example. Note that the conductor may be formed to be embedded in an opening provided in an insulator.

The insulator 286 is provided over the conductor 246a, the conductor 246b, and the insulator 284. Accordingly, the top surface of the conductor 246a, the side surface of the conductor 246a, the top surface of the conductor 246b, and the side surface of the conductor 246b are in contact with the insulator 286, and the bottom surface of the conductor 246a and the bottom surface of the conductor 246b are in contact with the insulator 284. In other words, the conductor 246a and the conductor 246b can be surrounded by the insulator 284 and the insulator 286. The structure can inhibit transmission of oxygen from the outside and oxidation of the conductor 246a and the conductor 246b. Furthermore, the structure is preferable because impurities such as water and hydrogen can be prevented from diffusing from the conductor 246a and the conductor 246b to the outside.

<Material for Semiconductor Device>

Materials that can be used for the semiconductor device are described below.

[Substrate]

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate including silicon or germanium, and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used as the insulator functioning as a gate insulator, the voltage during operation of the transistor can be lowered while the physical thickness of the gate insulator is maintained. In contrast, when a material with a low relative dielectric constant is used as the insulator functioning as an interlayer film, parasitic capacitance generated between wirings can be reduced. Accordingly, a material is preferably selected depending on the function of an insulator.

Examples of the insulator with a high relative dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include a silicon oxide, a silicon oxynitride, a silicon nitride oxide, a silicon nitride, a silicon oxide to which fluorine is added, a silicon oxide to which carbon is added, a silicon oxide to which carbon and nitrogen are added, a porous silicon oxide, and a resin.

When a transistor using a metal oxide is surrounded by insulators having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as an aluminum nitride, a silicon nitride oxide, or a silicon nitride can be used.

The insulator functioning as the gate insulator is preferably an insulator including a region containing oxygen released by heating. For example, when a structure is employed in which a silicon oxide or a silicon oxynitride including a region containing oxygen released by heating is in contact with the oxide 230, oxygen vacancies included in the oxide 230 can be filled.

[Conductor]

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use a tantalum nitride, a titanium nitride, tungsten, a nitride containing titanium and aluminum, a nitride containing tantalum and aluminum, a ruthenium oxide, a ruthenium nitride, an oxide containing strontium and ruthenium, an oxide containing lanthanum and nickel, or the like. Tantalum nitride, a titanium nitride, a nitride containing titanium and aluminum, a nitride containing tantalum and aluminum, a ruthenium oxide, a ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as a nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as a titanium nitride or a tantalum nitride, may be used. Alternatively, an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which silicon is added may be used. Furthermore, an indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

According to one embodiment of the present invention, a semiconductor device having a high on-state current can be provided. According to one embodiment of the present invention, a semiconductor device with less variations in transistor characteristics can be provided. Furthermore, according to one embodiment of the present invention, a highly reliable semiconductor device can be provided. Furthermore, according to one embodiment of the present invention, a semiconductor device having favorable electrical characteristics can be provided. Furthermore, according to one embodiment of the present invention, a semiconductor device that can be miniaturized or highly integrated can be provided.

The structure, the method, and the like described above in this embodiment can be used in an appropriate combination with the structures, the methods, and the like described in the other embodiments and examples.

Embodiment 10

In this embodiment, a storage device including a transistor in which a metal oxide of one embodiment of the present invention is used for a semiconductor (hereinafter referred to as an OS transistor in some cases) and a capacitor (hereinafter referred to as an OS memory device in some cases), is described with reference to FIG. 25A and FIG. 25B and FIG. 26A to FIG. 26H. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

Structure Example of Storage Device

Figure 25A:
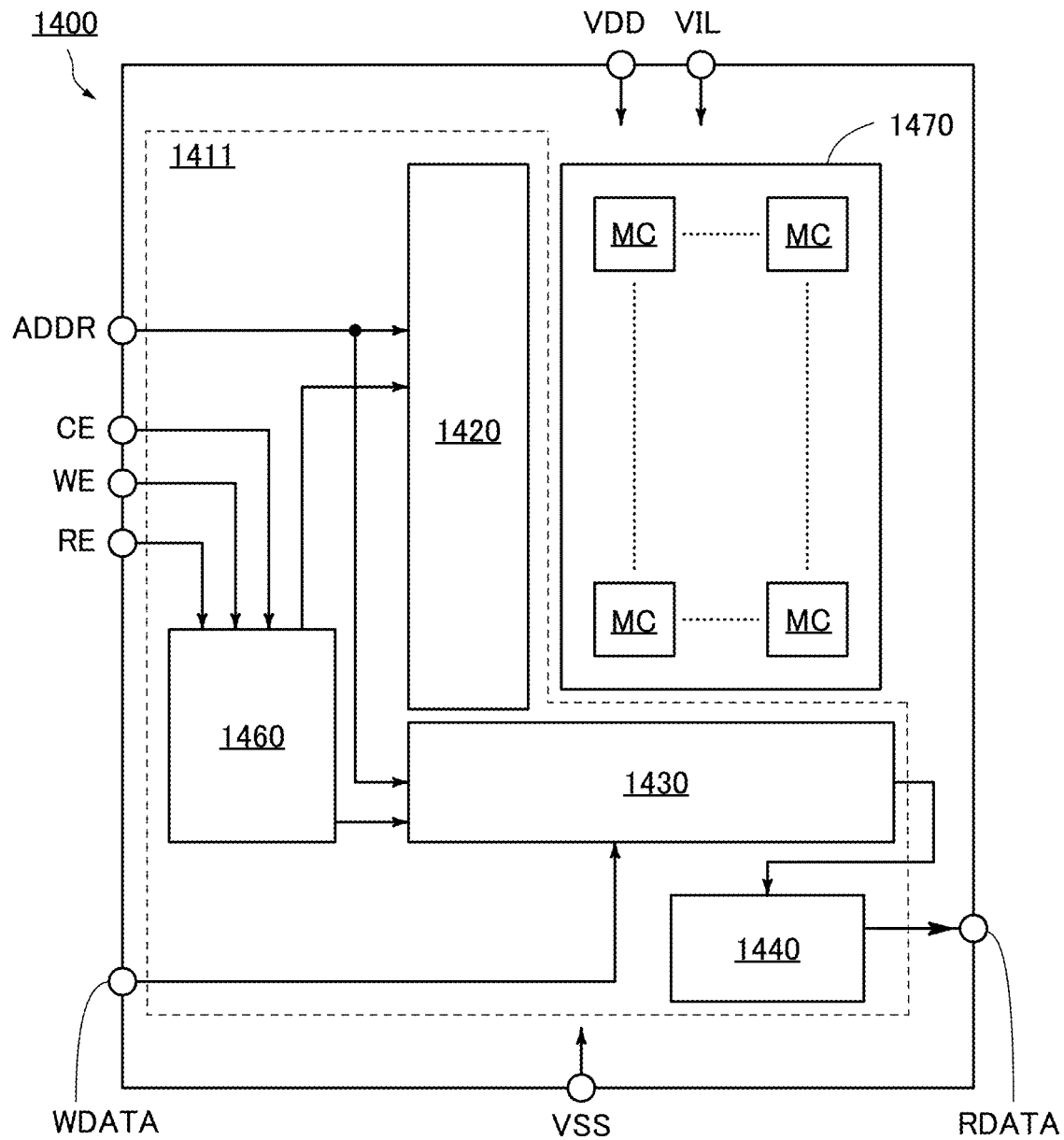
FIG. 25A is a block diagram illustrating a structure example of a storage device.

FIG. 25A illustrates an example of the structure of an OS memory device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 25B:
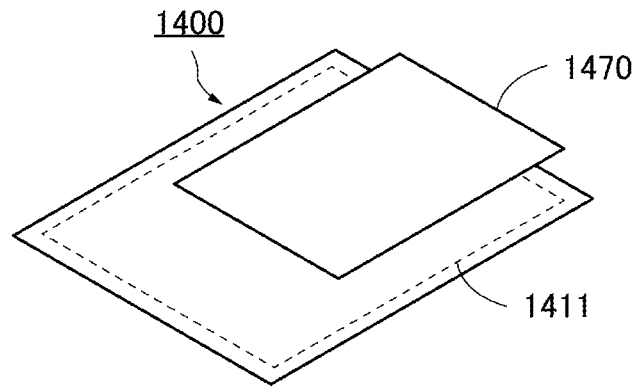
FIG. 25B is a perspective view illustrating a structure example of a storage device.

Note that FIG. 25A shows an example in which the peripheral circuit 1411 and the memory cell array 1470 are formed on the same plane; however, this embodiment is not limited thereto. For example, as shown in FIG. 25B, the memory cell array 1470 may be provided over the peripheral circuit 1411 to partly overlap with the peripheral circuit 1411. For example, the sense amplifier may be provided below the memory cell array 1470 so that they overlap with each other.

FIG. 26A to FIG. 26H show structure examples of a memory cell MC which can be used to the memory cell MC.

[DOSRAM]

Figure 26A:
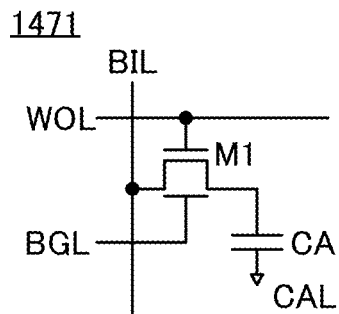
FIG. 26A to FIG. 26H are circuit diagrams showing configuration examples of storage devices.
Figure 26B:
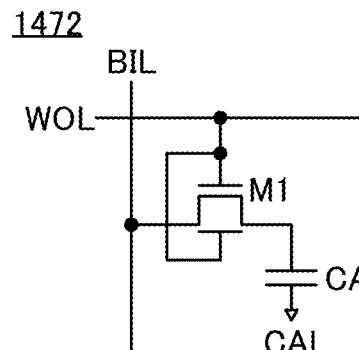
Figure 26C:
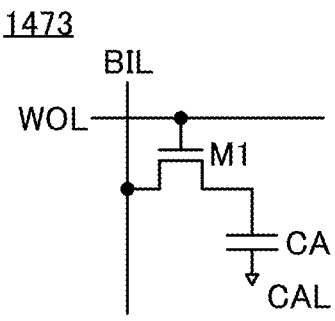
Figure 26D:
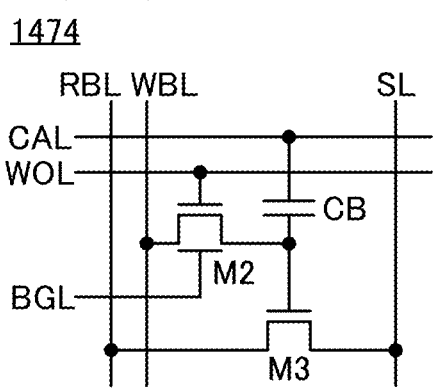
Figure 26E:
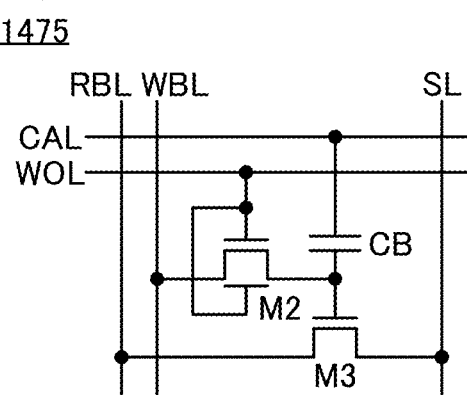
Figure 26F:
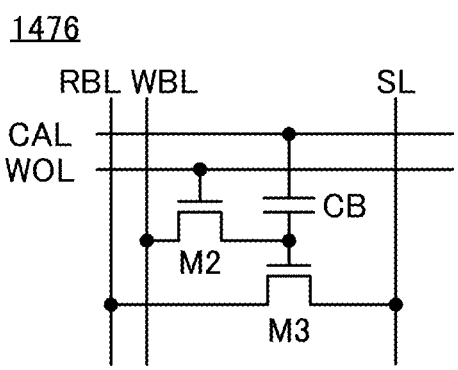
Figure 26G:
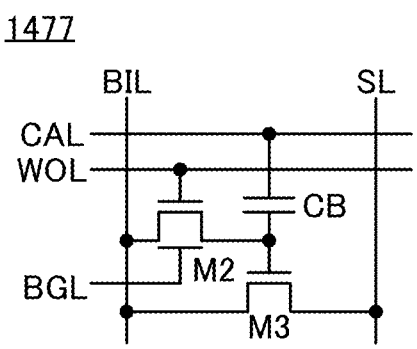

FIG. 26A to FIG. 26C each illustrate a circuit structure example of a memory cell of a DRAM. In this specification and the like, a DRAM using a memory cell including one OS transistor and one capacitor is referred to as DOSRAM (registered trademark) (Dynamic Oxide Semiconductor Random Access Memory) in some cases. A memory cell 1471 shown in FIG. 26A includes a transistor M1 and a capacitor CA. Note that the transistor M1 includes a gate (also referred to as a top gate in some cases) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and the circuit structure can be changed. For example, like a memory cell 1472 in FIG. 26B, a structure may be used in which the back gate of the transistor M1 is connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 shown in FIG. 26C.

In the case where the semiconductor device described in the above embodiments is used in the memory cell 1471 and the like, the transistor 200 can be used as the transistor M1. When an OS transistor is used as the transistor M1, the leakage current of the transistor M1 can be extremely low. That is, with use of the transistor M1, written data can be retained for a long time, and thus the frequency of the refresh operation for the memory cell can be decreased. Alternatively, the refresh operation of the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 26D to 26G each show a circuit structure example of a gain-cell memory cell including two transistors and one capacitor. A memory cell 1474 shown in FIG. 26D includes a transistor M2, a transistor M3, and a capacitor CB. Note that the transistor M2 includes a top gate and a back gate. In this specification and the like, a storage device including a gain-cell memory cell using an OS transistor as the transistor M2 is referred to as NOSRAM (registered trademark) (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

The memory cell MC is not limited to the memory cell 1474, and the circuit structure can be changed as appropriate. For example, like a memory cell 1475 in FIG. 26E, a structure may be used in which the back gate of the transistor M2 is connected not to the wiring BGL but to the wiring WOL in the memory cell MC. Alternatively, for example, like a memory cell 1476 in FIG. 26F, the memory cell MC may be a memory cell including a single-gate transistor, that is, the transistor M2 that does not include a back gate. Alternatively, for example, like a memory cell 1477 shown in FIG. 26G, the memory cell MC may have a structure where the wiring WBL and the wiring RBL are combined into one wiring BIL.

In the case where the semiconductor device described in the above embodiments is used in the memory cell 1474 and the like, the transistor 200 can be used as the transistor M2. When an OS transistor is used as the transistor M2, the leakage current of the transistor M2 can be extremely low. That is, with use of the transistor M2, written data can be retained for a long time, and thus the frequency of the refresh operation for the memory cell can be decreased. Alternatively, the refresh operation of the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter also referred to as a S1 transistor in some cases). The conductivity type of the S1 transistor may be of either an n-channel type or a p-channel type. The S1 transistor has higher field-effect mobility than the OS transistor in some cases. Therefore, a S1 transistor may be used as the transistor M3 functioning as a reading transistor. Furthermore, the transistor M2 can be provided to be stacked over the transistor M3 when a S1 transistor is used as the transistor M3; therefore, the area occupied by the memory cell can be reduced, leading to high integration of the storage device.

The transistor M3 may be an OS transistor. When an OS transistor is used as each of the transistor M2 and the transistor M3, the circuit of the memory cell array 1470 can be formed using only n-channel transistors.

Figure 26H:
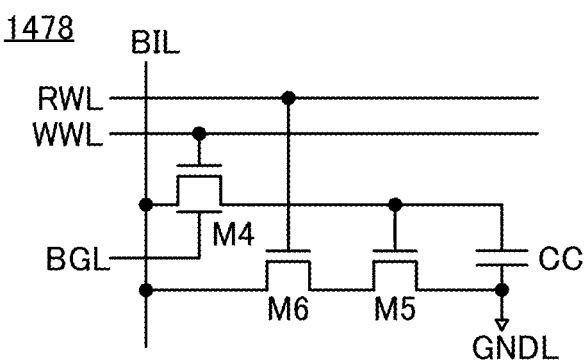

In addition, FIG. 26H shows an example of a gain-cell memory cell including three transistors and one capacitor. A memory cell 1478 shown in FIG. 26H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 does not necessarily include the back gate.

Note that each of the transistor M5 and the transistor M6 may be an n-channel S1 transistor or a p-channel S1 transistor. Alternatively, the transistor M4 to the transistor M6 may be OS transistors, in which case the circuit of the memory cell array 1470 can be formed using only n-channel transistors.

In the case where the semiconductor device described in the above embodiments is used in the memory cell 1478, the transistor 200 can be used as the transistor M4. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments.

Embodiment $_{11}$

In this embodiment, a storage device, a chip, and an electronic device in which a semiconductor device of the present invention is mounted will be described.

<Storage Device>

The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives).

<Chip>

A plurality of circuits (systems) are mounted on a chip. A technique for integrating a plurality of circuits (systems) into one chip is referred to as system on chip (SoC) in some cases.

A chip includes a CPU, a GPU, one or more of analog arithmetic units, one or more of memory controllers, one or more of interfaces, one or more of network circuits, and the like.

The chip is provided with a bump and is connected to a first surface of a printed circuit board (PCB). In addition, a plurality of bumps are provided on a rear side of the first surface of the PCB, and the PCB is connected to a motherboard.

Storage devices such as a DRAM and a flash memory may be provided over a motherboard. For example, the DOSRAM described in the above embodiment can be used as the DRAM. In addition, for example, the NOSRAM described in the above embodiment can be used as the flash memory.

The CPU preferably includes a plurality of CPU cores. In addition, the GPU preferably includes a plurality of GPU cores. Furthermore, the CPU and the GPU may each include a memory for temporarily storing data. Alternatively, a common memory for the CPU and the GPU may be provided in the chip. The NOSRAM or the DOSRAM described above can be used as the memory. Moreover, the GPU is suitable for parallel computation of a number of data and thus can be used for image processing or product-sum operation. When an image processing circuit or a product-sum operation circuit using an oxide semiconductor of the present invention is provided in the GPU, image processing and product-sum operation can be performed with low power consumption.

The analog arithmetic unit includes one or both of an A/D (analog/digital) converter circuit and a D/A (digital/analog) converter circuit. Furthermore, the product-sum operation circuit may be provided in the analog arithmetic unit.

The memory controller includes a circuit functioning as a controller of the DRAM and a circuit functioning as an interface of the flash memory.

The interface includes an interface circuit for an external connection device such as a display device, a speaker, a microphone, a camera, or a controller.

The network circuit includes a circuit for a network such as a LAN (Local Area Network). The network circuit may include a circuit for network security.

A motherboard provided with a PCB on which a chip including a GPU is mounted, DRAMs, and a flash memory can be referred to as a GPU module.

The GPU module includes a chip formed using the SoC technology, and thus can have a small size. Furthermore, the GPU module is excellent in image processing, and thus is suitably used in a portable electronic device such as a smartphone, a tablet terminal, a laptop PC, or a portable (mobile) game console. Furthermore, the product-sum operation circuit using the GPU can perform a method such as a deep neural network (DNN), a convolutional neural network (CNN), a recurrent neural network (RNN), an autoencoder, a deep Boltzmann machine (DBM), or a deep belief network (DBN); hence, the chip can be used as an AI chip or the GPU module can be used as an AI system module.

<Electronic Device>

The above-described GPU or chip can be mounted on a variety of electronic devices. Examples of electronic devices include a digital camera, a digital video camera, a digital photo frame, an e-book reader, a mobile phone (a smartphone), a portable game machine, a portable information terminal, an audio reproducing device, a moving vehicle, and a household appliance in addition to electronic devices provided with a relatively large screen, such as a television device, a monitor for a desktop or notebook information terminal or the like, digital signage, a large game machine like a pachinko machine, and a large computer. Examples of moving vehicles include an automobile, a train, a monorail train, a ship, and a flying object (a helicopter, an unmanned aircraft (a drone), an airplane, and a rocket). Examples of household appliances include an electric refrigerator-freezer, a vacuum cleaner, a microwave oven, an electric oven, a rice cooker, a water heater, an IH cooker, a water server, a heating-cooling combination appliance including an air conditioner, a washing machine, a drying machine, and an audio visual appliance. In addition, when the above-described GPU or chip is provided in an electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments.

REFERENCE NUMERALS

:10: metal oxide, 11: region, 11_1: region, 11_2: region, 11_3: region, 11_$n$: region, 12: region, 12_1: region, 12_2: region, 12_3: region, 12_$p$: region, 13: region, 13_1: region, 13_2: region, 13_3: region, 13_4: region, 13_5: region, 13_$q$: region, 20: direct spot, 21: spot, 22: spot, 31: region, 32: region, 200: transistor, 205: conductor, 205$a$: conductor, 205$b$: conductor, 211: insulator, 212: insulator, 214: insulator, 216: insulator, 222: insulator, 224: insulator, 230: oxide, 230$a$: oxide, 230$b$: oxide, 230$c$: oxide, 240$a$: conductor, 240$b$: conductor, 241$a$: insulator, 241$b$: insulator, 242$a$: conductor, 242$b$: conductor, 243$a$: oxide, 243$b$: oxide, 246$a$: conductor, 246$b$: conductor, 250: insulator, 260: conductor, 260$a$: conductor, 260$b$: conductor, 272: insulator, 273: insulator, 280: insulator, 282: insulator, 283: insulator, 284: insulator, 286: insulator, 300: transistor, 300A: transistor, 302: substrate, 304: conductive layer, 306: insulating layer, 308: semiconductor layer, 312$a$: conductive layer, 312$b$: conductive layer, 313$a$: conductive layer, 313$b$: conductive layer, 314: insulating layer, 316: insulating layer, 320: conductive layer, 342: opening, 350: transistor, 350A: transistor, 350B: transistor, 350C: transistor, 352: substrate, 353: insulating layer, 353$a$: insulating layer, 353$b$: insulating layer, 356: conductive layer, 358: semiconductor layer, 358$n$: low-resistance region, 360: insulating layer, 362: conductive layer, 364: metal oxide layer, 366: insulating layer, 368: insulating layer, 370$a$: conductive layer, 370$b$: conductive layer, 391$a$: opening, 391$b$: opening, 392: opening, 400: pixel circuit, 400EL: pixel circuit, 400LC: pixel circuit, 401: circuit, 401EL: circuit, 401LC: circuit, 501: pixel circuit, 502: pixel portion, 504: driver circuit portion, 504$a$: gate driver, 504$b$: source driver, 506: protection circuit, 507: terminal portion, 550: transistor, 552: transistor, 554: transistor, 560: capacitor, 562: capacitor, 570: liquid crystal element, 572: light-emitting element, 700: display device, 700$a$: display device, 701: substrate, 702: display portion, 703$a$: connection terminal, 703$b$: connection terminal, 704: wiring, 705: substrate, 706: FPC, 707: IC, 710: liquid crystal element, 711: conductive layer, 712: liquid crystal, 713: conductive layer, 720: support, 721: transistor, 722: transistor, 723: wiring, 725: alignment film, 726: alignment film, 727: spacer, 730: insulating layer, 732: sealing layer, 734: insulating layer, 736: coloring layer, 738: light-blocking layer, 739: conductive layer, 740: substrate, 741: protection layer, 741$a$: insulating layer, 741$b$: insulating layer, 741$c$: insulating layer, 742: bonding layer, 743: resin layer, 744: insulating layer, 746: insulating layer, 747: bonding layer, 748: bonding layer, 749: protection layer, 750: transistor, 752: transistor, 755: polarizing plate, 756: polarizing plate, 757: light source, 761$a$: bent portion, 761$b$: bent portion, 762: substrate, 763: circuit portion, 764: circuit portion, 765: notch, 770: insulating layer, 772: conductive layer, 780: connection layer, 782: light-emitting element, 786: EL layer, 788: conductive layer, 790: capacitor, 1400: storage device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 6000: display module, 6001: upper cover, 6002: lower cover, 6005: FPC, 6006: display device, 6009: frame, 6010: printed circuit board, 6011: battery, 6015: light-emitting portion, 6016: light-receiving portion, 6017a: light guide portion, 6017b: light guide portion, 6018: light, 6500: electronic device, 6501: housing, 6502: display portion, 6503: power supply button, 6504: button, 6505: speaker, 6506: microphone, 6507: camera, 6508: light source, 6509: light source, 6510: protective member, 6511: display panel, 6512: optical member, 6513: touch sensor panel, 6515: FPC, 6516: IC, 6517: printed circuit board, 6518: battery, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: piller, 7500: display portion, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9100: television device, 9101: portable information terminal, 9102: portable information terminal, 9200: portable information terminal, 9201: portable information terminal

The invention claimed is:

1. A metal oxide comprising a microcrystalline region and an amorphous region,
    wherein a less ordered region is included between the microcrystalline region and the amorphous region,
    wherein the microcrystalline region is dispersed in the metal oxide, and
    wherein at least a part of the microcrystalline region is covered with the less ordered region and is apart from the amorphous region.

2. The metal oxide according to claim 1,
    wherein a crystallinity of the less ordered region is lower than a crystallinity of the microcrystalline region and higher than a crystallinity of the amorphous region.

3. The metal oxide according to claim 1,
    wherein energy of the less ordered region is higher than energy of the microcrystalline region and lower than energy of the amorphous region.

4. The metal oxide according to claim 1,
    wherein the metal oxide comprises indium, an element M (M is any one or more of gallium, aluminum, yttrium, and tin), and zinc.

5. A transistor comprising the metal oxide according to claim 1, in a channel formation region.

6. A metal oxide comprising a first region and a second region,
    wherein a third region is included between the first region and the second region,
    wherein at least a part of the first region is covered with the third region,
    wherein a crystallinity of the third region is lower than a crystallinity of the first region,
    wherein a crystallinity of the second region is lower than the crystallinity of the third region, and
    wherein the first region is dispersed in the metal oxide.

7. The metal oxide according to claim 6,
    wherein a size of the first region is greater than or equal to 1 nm and less than or equal to 3 nm.

8. The metal oxide according to claim 7,
    wherein the size of the first region is measured from an image observed with a transmission electron microscope.

9. The metal oxide according to claim 6,
    wherein by nanobeam electron diffraction, a plurality of spots are observed in a region with a distance from a direct spot in a radius vector direction ranging from 2.9 $nm^{-1}$ to 4.2 $nm^{-1}$.

10. The metal oxide according to claim 9,
    wherein as the nanobeam electron diffraction, electron diffraction is performed with a probe diameter of greater than or equal to 1 nm and less than or equal to 30 nm.

11. The metal oxide according to claim 6,
    wherein by nanobeam electron diffraction, a plurality of spots are observed in a fourth region,
    wherein one or more spots are observed in a fifth region, and
    wherein the proportion of a distance from the direct spot to the fifth region to a distance from the direct spot to the fourth region is greater than or equal to 1.5 and less than or equal to 1.8.

12. The metal oxide according to claim 6,
    wherein the metal oxide comprises indium, an element M (M is any one or more of gallium, aluminum, yttrium, and tin), and zinc.

13. A transistor comprising the metal oxide according to claim 6 in a channel formation region.

14. A metal oxide comprising a first region and a second region,
    wherein a third region is included between the first region and the second region,
    wherein at least a part of the first region is covered with the third region,
    wherein the third region is energetically more unstable than the first region,
    wherein the second region is energetically more unstable than the third region, and
    wherein the first region is dispersed in the metal oxide.

15. The metal oxide according to claim 14,
    wherein a size of the first region is greater than or equal to 1 nm and less than or equal to 3 nm.

16. The metal oxide according to claim 15,
    wherein the size of the first region is measured from an image observed with a transmission electron microscope.

17. The metal oxide according to claim 14,
    wherein by nanobeam electron diffraction, a plurality of spots are observed in a region with a distance from a direct spot in a radius vector direction ranging from 2.9 $nm^{-1}$ to 4.2 $nm^{-1}$.

18. The metal oxide according to claim 17,
    wherein as the nanobeam electron diffraction, electron diffraction is performed with a probe diameter of greater than or equal to 1 nm and less than or equal to 30 nm.

19. The metal oxide according to claim 14,
wherein by nanobeam electron diffraction, a plurality of spots are observed in a fourth region,
wherein one or more spots are observed in a fifth region, and
wherein the proportion of a distance from the direct spot to the fifth region to a distance from the direct spot to the fourth region is greater than or equal to 1.5 and less than or equal to 1.8.

20. The metal oxide according to claim 14,
wherein the metal oxide comprises indium, an element M (M is any one or more of gallium, aluminum, yttrium, and tin), and zinc.

21. A transistor comprising the metal oxide according to claim 14 in a channel formation region.

* * * * *